(12) United States Patent  
Shionoiri et al.

(10) Patent No.: US 7,710,270 B2  
(45) Date of Patent: May 4, 2010

(54) SEMICONDUCTOR DEVICE

(75) Inventors: Yutaka Shionoiri, Isehara (JP); Jun Koyama, Sagamihara (JP); Yoshiyuki Kurokawa, Sagamihara (JP); Shunpei Yamazaki, Setagaya (JP); Takayuki Ikeda, Atsugi (JP); Takeshi Osada, Isehara (JP); Tomoaki Atsumi, Isehara (JP); Masato Ishii, Isehara (JP)

(73) Assignee: Semiconductor Energy Laboratory Co., Ltd, Atsugi-shi, Kanagawa-ken ( * ) Notice: Subject to any disclaimer, the term of this patent is extended or adjusted under 35 U.S.C. 154(b) by 354 days.

(21) Appl. No.: 11/717,686

(22) Filed: Mar. 14, 2007

(65) Prior Publication Data

US 2007/0229281 A1    Oct. 4, 2007

(30) Foreign Application Priority Data

Mar. 15, 2006    (JP)    ............................. 2006-070387

(51) Int. Cl.  
   *G08B 13/14*    (2006.01)
(52) U.S. Cl. .................................. 340/572.1; 340/10.1
(58) Field of Classification Search ............. 340/572.1, 340/572.2, 572.4, 10.1; 235/451, 487  
   See application file for complete search history.

(56) References Cited

U.S. PATENT DOCUMENTS

| | | | |
|---|---|---|---|
| 6,223,990 B1 | 5/2001 | Kamei | |
| 6,509,217 B1 | 1/2003 | Reddy | |
| 6,737,302 B2 | 5/2004 | Arao | |
| 7,191,953 B2 * | 3/2007 | Wu et al. ..................... | 235/492 |
| 7,333,786 B2 * | 2/2008 | Kikuchi et al. ............. | 340/10.1 |
| 7,336,270 B2 * | 2/2008 | Sato ........................... | 345/204 |
| 2002/0049714 A1 | 4/2002 | Yamazaki et al. | |
| 2004/0128246 A1 | 7/2004 | Takayama et al. | |

(Continued)

FOREIGN PATENT DOCUMENTS

JP     09-001968    1/1997

(Continued)

OTHER PUBLICATIONS

International Search Report (Application No. PCT/JP2007/055014) dated Jun. 19, 2007.

(Continued)

*Primary Examiner*—John A Tweel, Jr.  
(74) *Attorney, Agent, or Firm*—Eric J. Robinson; Robinson Intellectual Property Law Office, P.C.

(57) ABSTRACT

An object is to provide a semiconductor device including an RFID which can transmit/receive individual information without a change of a battery accompanied by deterioration over time of the battery as a drive power source, and to which driving power can be supplied to keep a favorable transmission/reception state of the individual information even when an external electromagnetic wave is not sufficient. The semiconductor device includes a signal processing circuit, a first antenna circuit and a second antenna circuit operationally connected to the signal processing circuit, and a battery operationally connected to the signal processing circuit, in which the first antenna circuit transmits/receives a signal for transmitting data stored in the signal processing circuit; the second antenna circuit receives a signal for charging the battery; and a signal received by the first antenna circuit and a signal received by the second antenna circuit have different wavelengths.

24 Claims, 41 Drawing Sheets

U.S. PATENT DOCUMENTS

| | | |
|---|---|---|
| 2004/0145454 A1 | 7/2004 | Powell et al. |
| 2005/0215119 A1 | 9/2005 | Kaneko |
| 2005/0254183 A1 | 11/2005 | Ishida et al. |
| 2006/0009251 A1 | 1/2006 | Noda et al. |

FOREIGN PATENT DOCUMENTS

| | | |
|---|---|---|
| JP | 10-307898 | 11/1998 |
| JP | 2003-006592 | 1/2003 |
| JP | 2003-070187 | 3/2003 |
| JP | 2003-299255 | 10/2003 |
| JP | 2004-343410 | 12/2004 |
| JP | 2005-316724 | 11/2005 |
| JP | 2005-352434 | 12/2005 |
| JP | 2005-354888 | 12/2005 |
| JP | 2006-0240873 | 1/2006 |
| JP | 2006-503376 | 1/2006 |
| WO | WO 97/00493 | 1/1997 |

OTHER PUBLICATIONS

Written Opinion (Application No. PCT/JP2007/055014) dated Jun. 19, 2007.

* cited by examiner

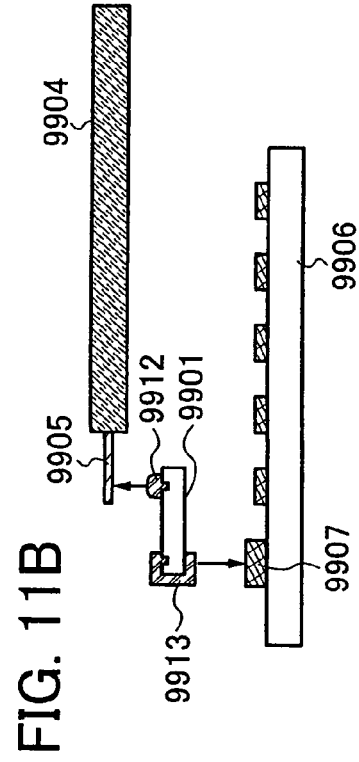
FIG. 11A
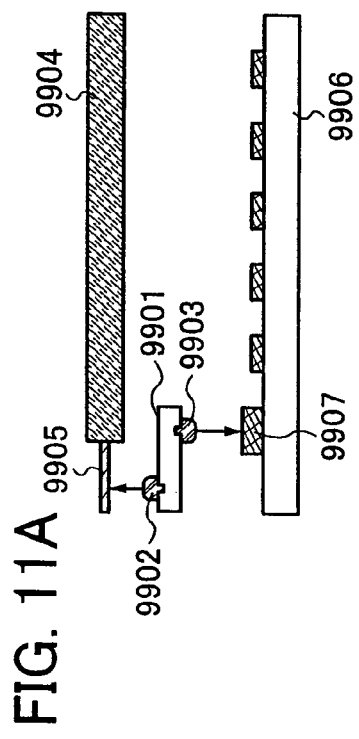
FIG. 11C
FIG. 11E
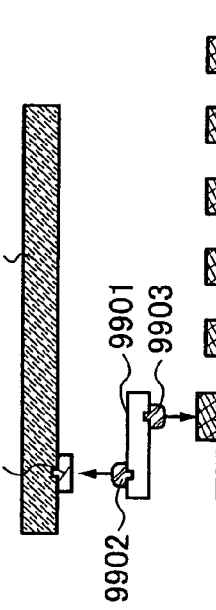
FIG. 11B
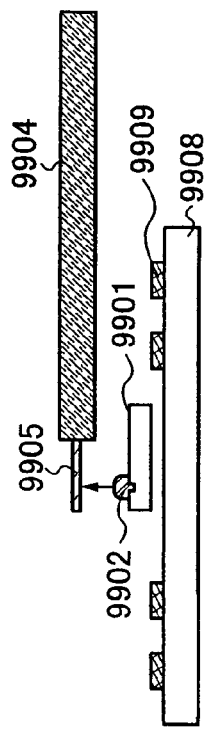
FIG. 11D
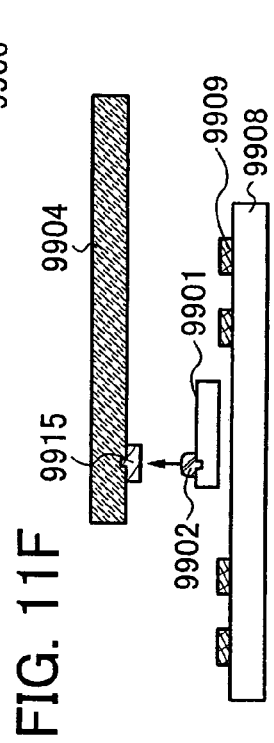
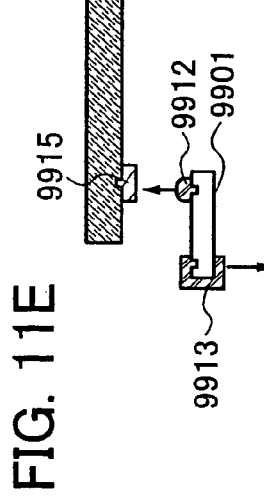
FIG. 11F

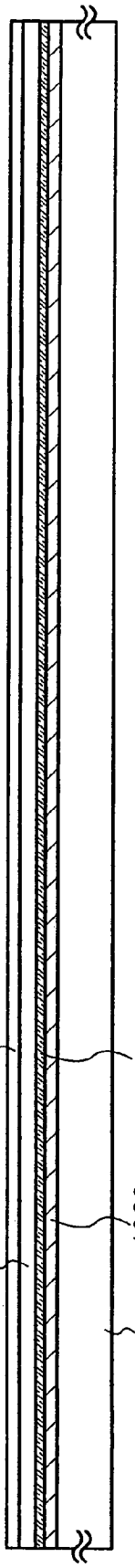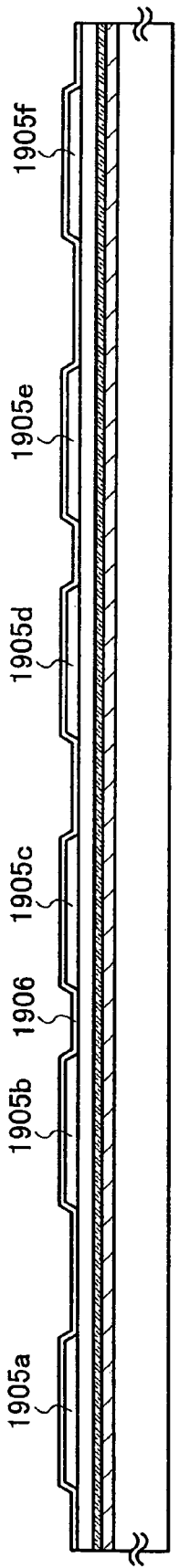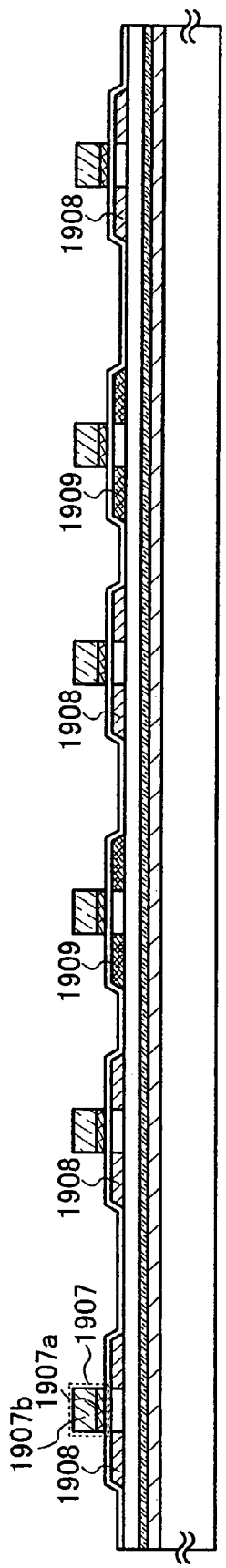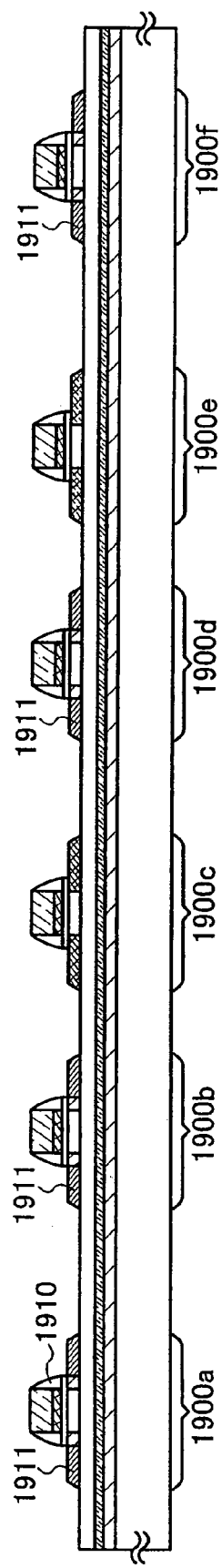

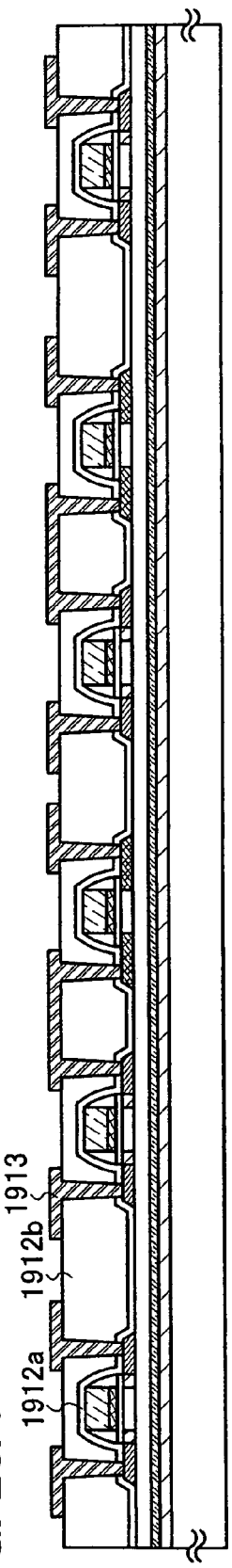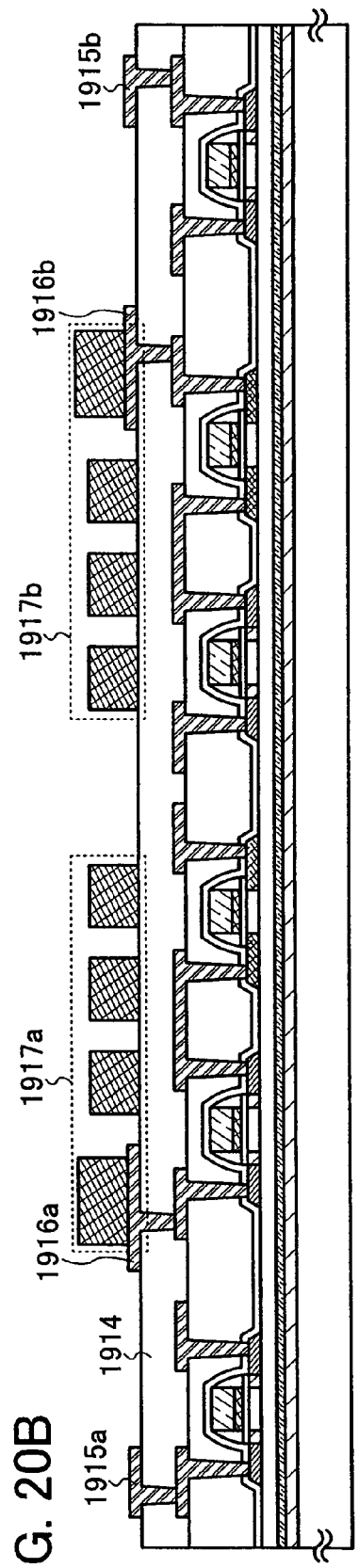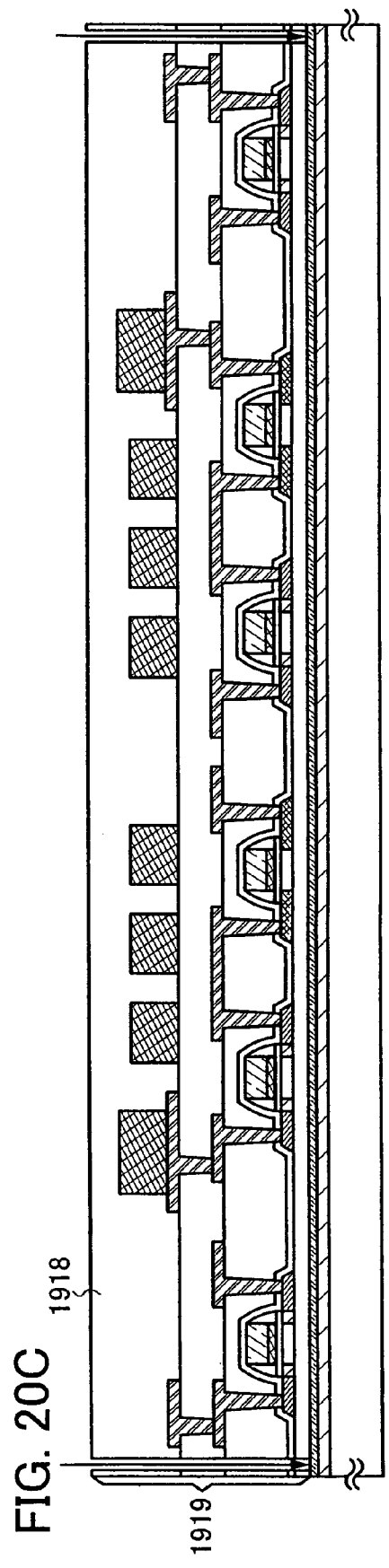

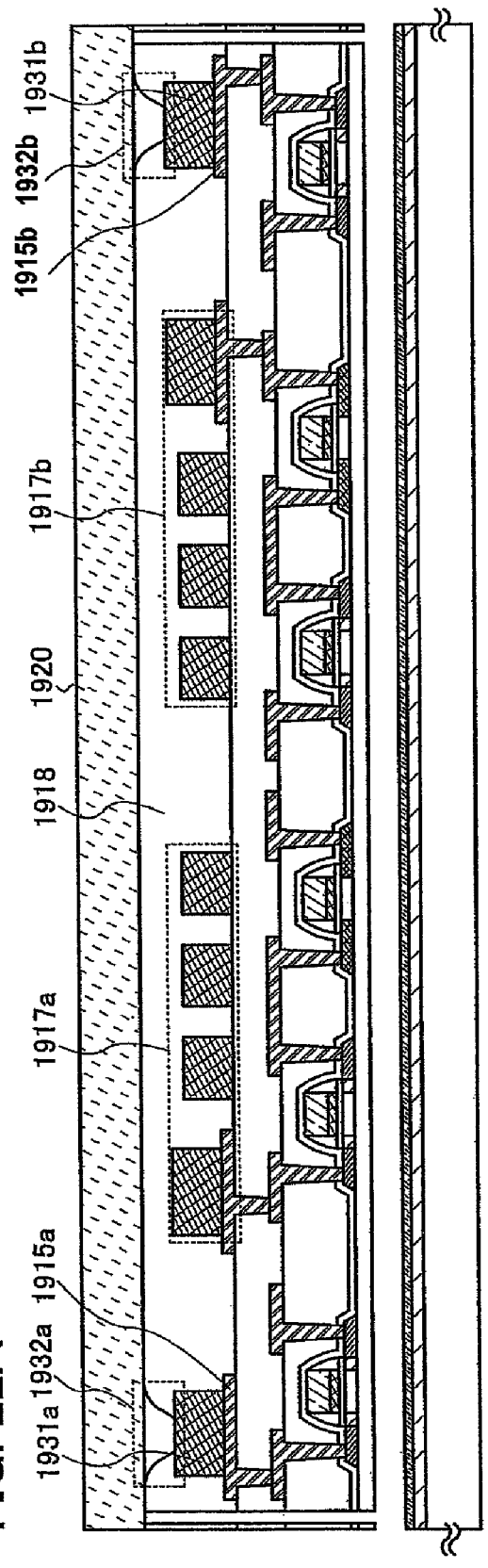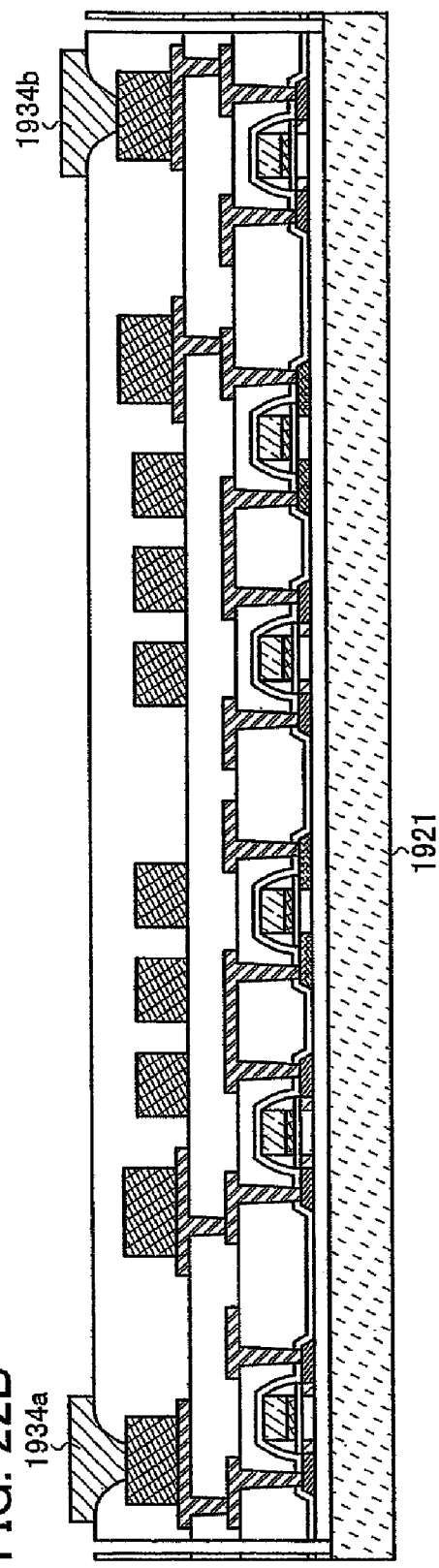

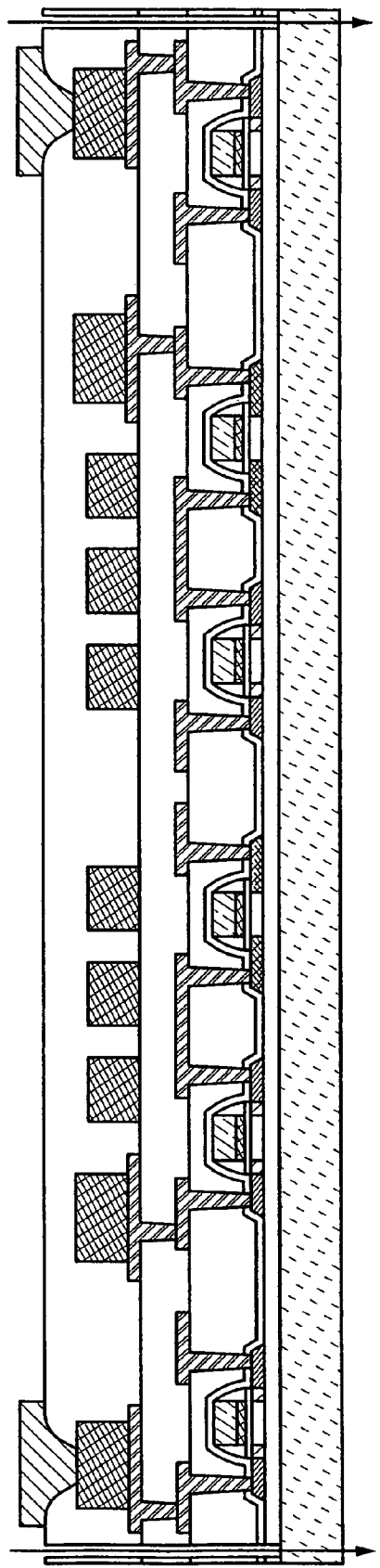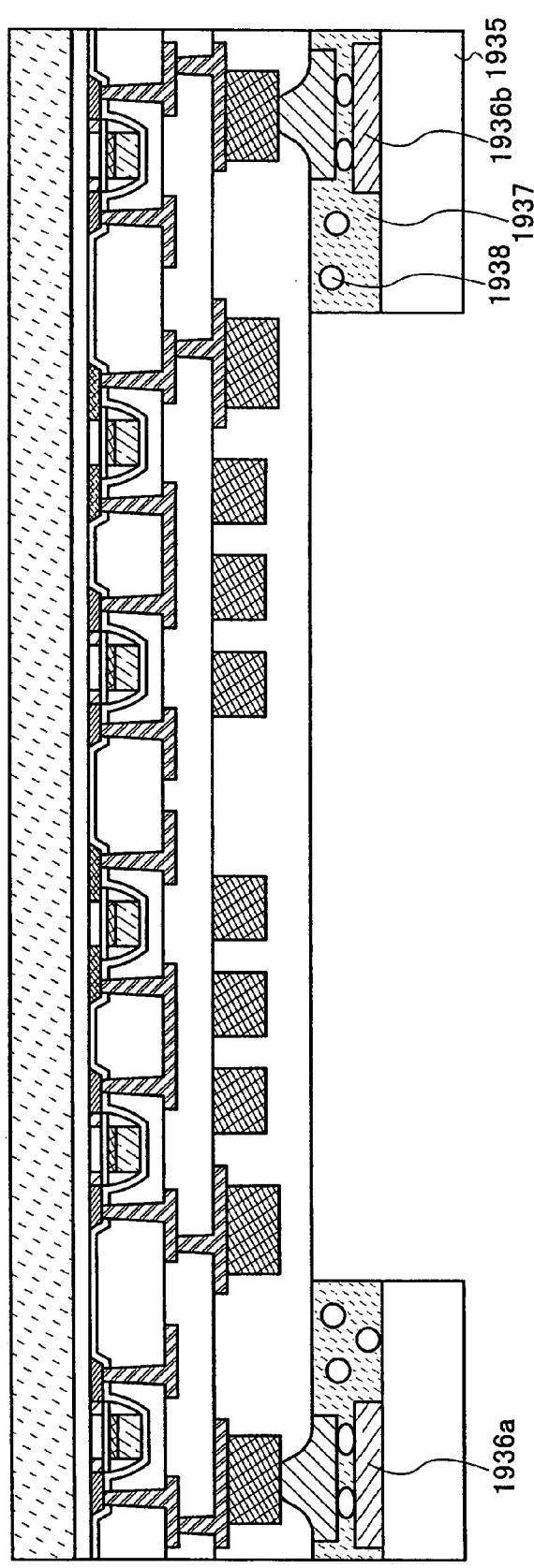
FIG. 23A
FIG. 23B

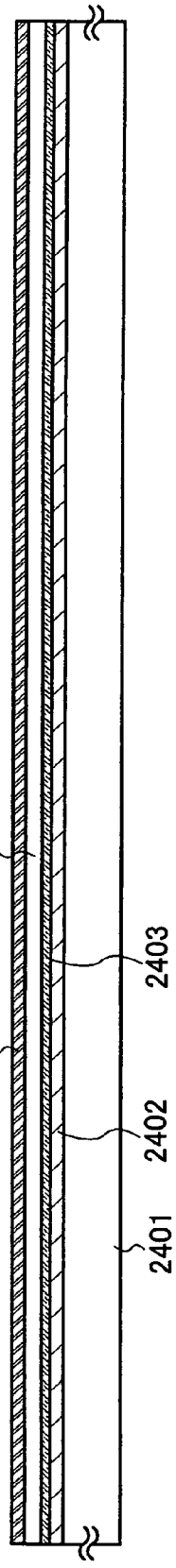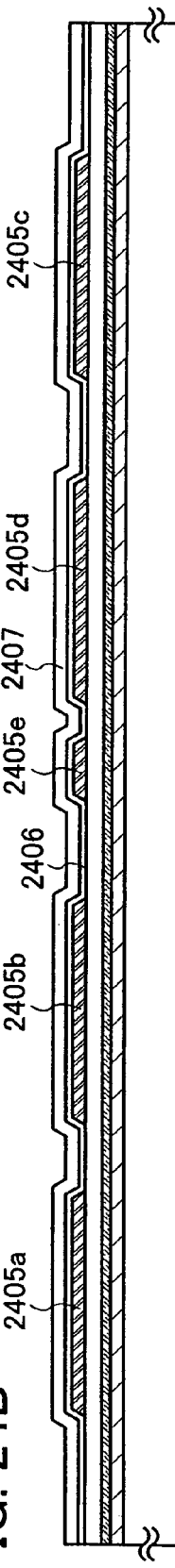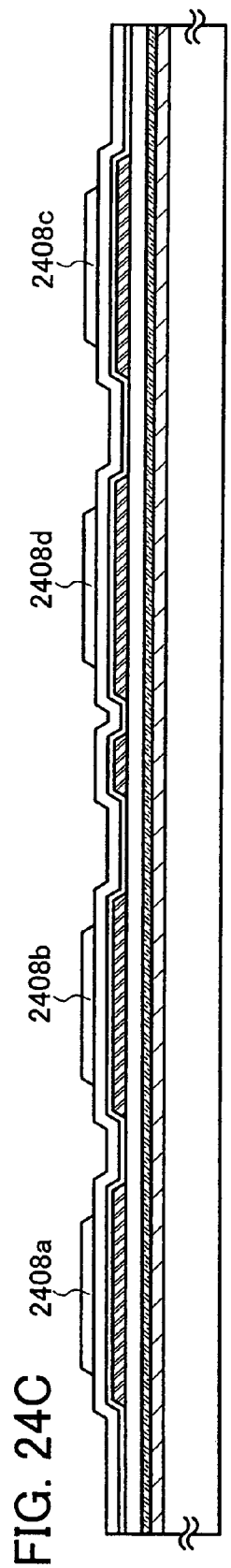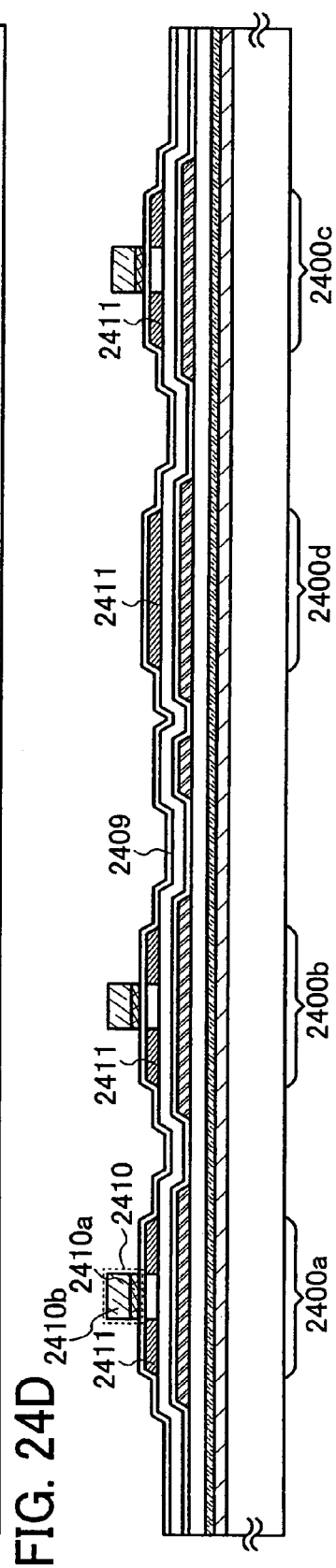

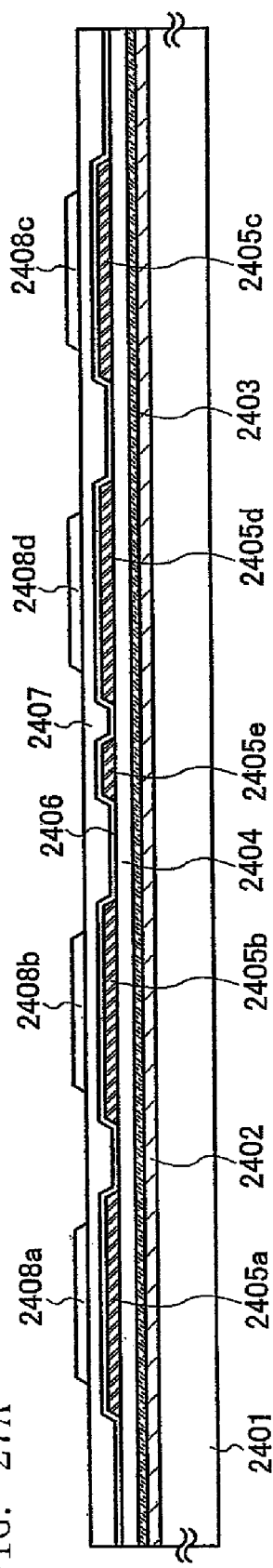
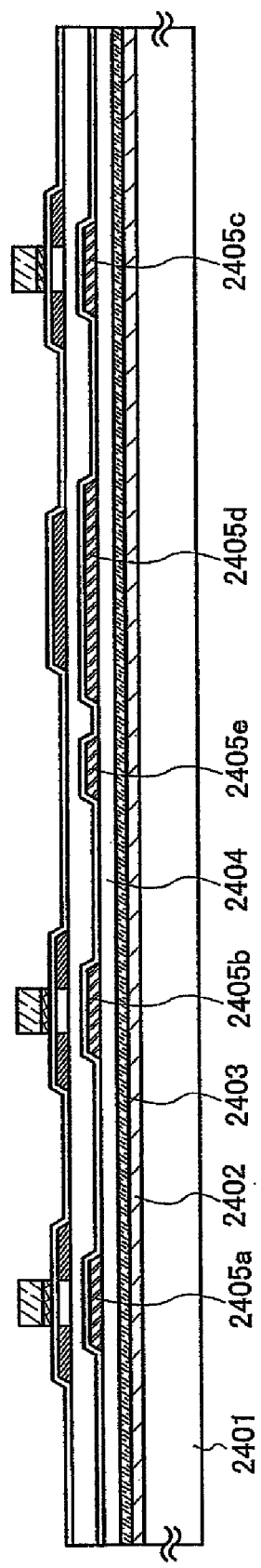
FIG. 27A
FIG. 27B

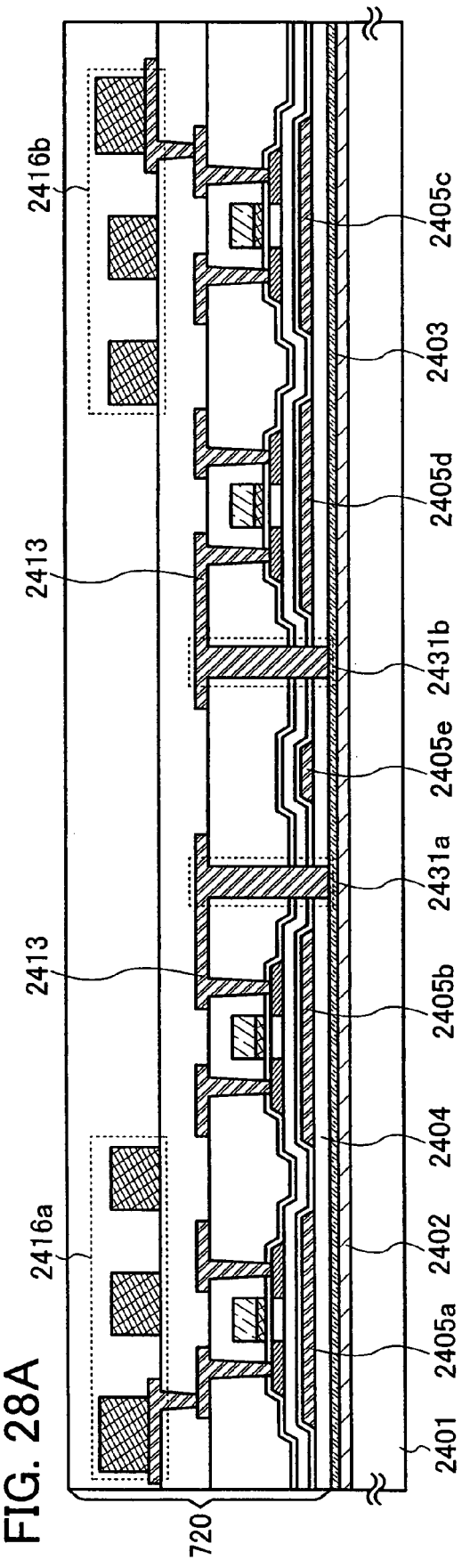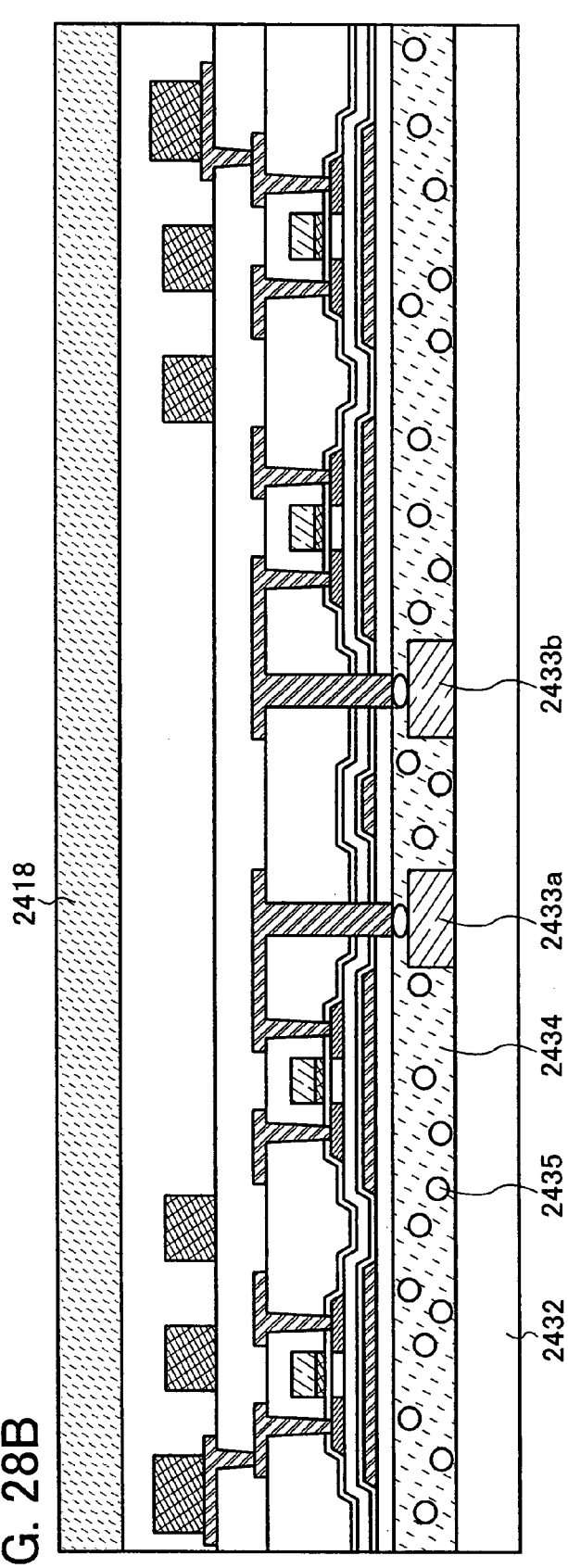

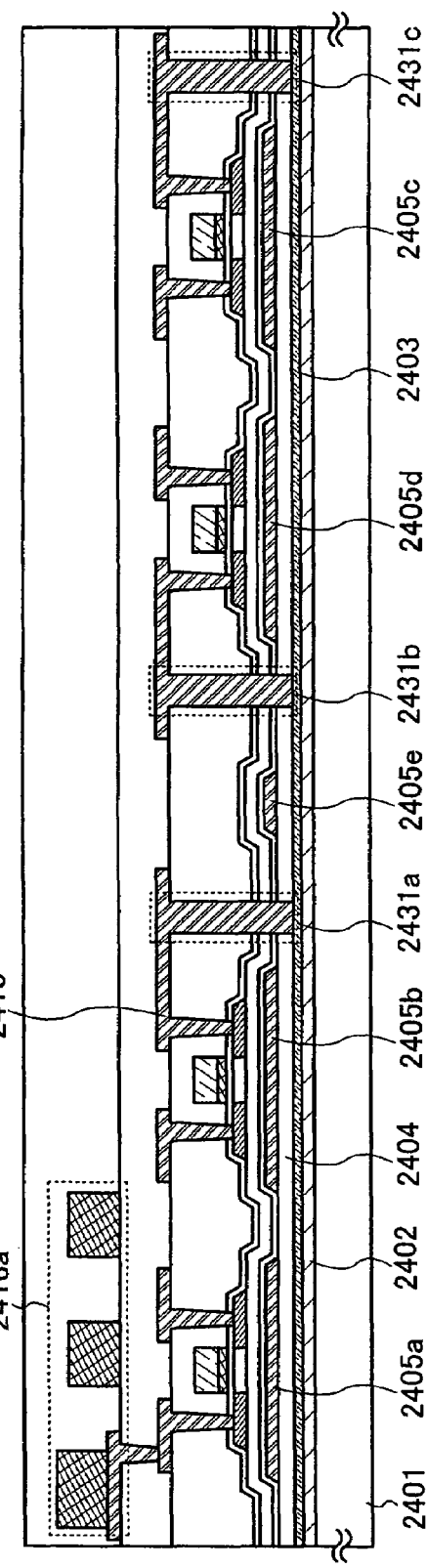
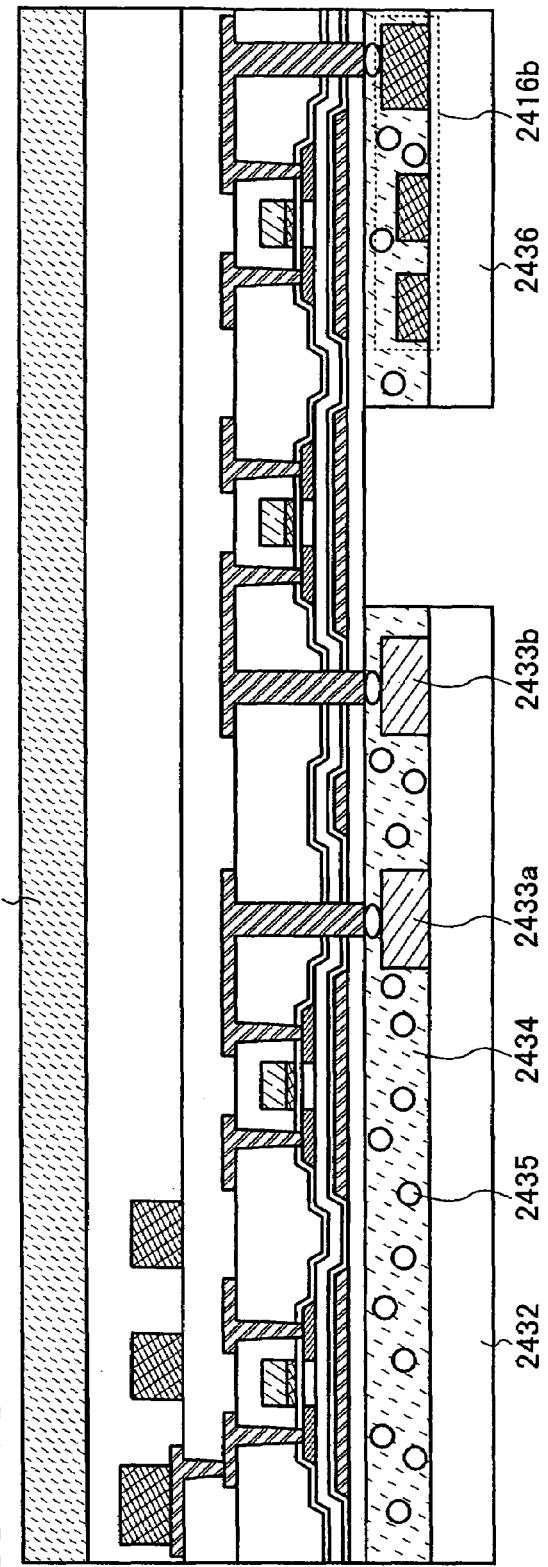

SEMICONDUCTOR DEVICE

TECHNICAL FIELD

The present invention relates to a semiconductor device. In particular, the present invention relates to a semiconductor device that transmits/receives data and receives power through a radio wave.

BACKGROUND ART

In recent years, an individual identification technology using wireless communication has attracted attention. In particular, as a semiconductor device which communicates data by wireless communication, an individual identification technology using an RFID (Radio Frequency Identification) tag has attracted attention. The RFID tag is also called an IC (Integrated Circuit) tag, an IC chip, an RF tag, a wireless tag, or an electronic tag. The individual identification technology using an RFID has started to help production, management, or the like of an individual object, and is anticipated to be applied to personal authentication.

RFIDs can be categorized into two types: an active RFID capable of transmitting an electromagnetic wave containing information of the RFID, and a passive RFID which drives utilizing power of an electromagnetic wave externally received, depending on whether it incorporates a power source or it is externally supplied with power (as for an active RFID, see Patent Document 1, and as for a passive RFID, see Patent Document 2). Among them, an active RFID is provided with a battery as a power source which supplies power for driving the RFID. Meanwhile, a passive RFID generates power for driving the RFID with the use of an external electromagnetic wave (carrier wave), and thus it is not provided with a battery.

Description is made of a specific structure of an active RFID with reference to a block diagram in FIG. 31. In an active RFID 3100 shown in FIG. 31, a communication signal received by an antenna circuit 3101 is inputted to a demodulation circuit 3105 and an amplifier 3106 in a signal processing circuit 3102. A communication signal is usually transmitted through a process such as ASK modulation or PSK modulation of a carrier of 13.56 MHz, 915 MHz, or the like. FIG. 31 shows an example of a case where 13.56 MHz is used for a communication signal. In FIG. 31, a clock signal as a reference is required for processing a signal. Here, a carrier of 13.56 MHz is used as a clock signal. The amplifier 3106 amplifies the carrier of 13.56 MHz and supplies it as a clock signal to a logic circuit 3107. Then, the communication signal subjected to ASK modulation or PSK modulation is demodulated in the demodulation circuit 3105. The modulated signal is transmitted to the logic circuit 3107 to be analyzed. The signal analyzed in the logic circuit 3107 is transmitted to a memory control circuit 3108 by which a memory circuit 3109 is controlled. Data stored in the memory circuit 3109 is transmitted to a logic circuit 3110. After being encoded in the logic circuit 3110, the signal is amplified in an amplifier 3111. By the signal, the modulation circuit 3112 modulates the carrier. Power for driving the RFID shown in FIG. 31 is supplied through a power source circuit 3104 by a battery 3103 provided outside the signal processing circuit. Then, the power source circuit 3104 supplies power to the amplifier 3106, the demodulation circuit 3105, the logic circuit 3107, the memory control circuit 3108, the memory circuit 3109, the logic circuit 3110, the amplifier 3111, the modulation circuit 3112, and the like. Thus, an active RFID operates.

Description is made of a specific structure of a passive RFID with reference to a block diagram in FIG. 32. In a passive RFID 3200 shown in FIG. 32, a communication signal received by an antenna circuit 3201 is inputted to a demodulation circuit 3205 and an amplifier 3206 in a signal processing circuit 3202. A communication signal is usually transmitted through a process such as ASK modulation or PSK modulation by a carrier of 13.56 MHz, 915 MHz, or the like. FIG. 32 shows an example of a case where 13.56 MHz is used for a communication signal. In FIG. 32, a clock signal as a reference is required for processing a signal. Here, a carrier of 13.56 MHz is used as a clock signal. The amplifier 3206 amplifies the carrier of 13.56 MHz and supplies it as a clock signal to a logic circuit 3207. Then, the communication signal subjected to ASK modulation or PSK modulation is demodulated in the demodulation circuit 3205. The modulated signal is transmitted to the logic circuit 3207 to be analyzed. The signal analyzed in the logic circuit 3207 is transmitted to a memory control circuit 3208 by which a memory circuit 3209 is controlled. Data stored in the memory circuit 3209 is transmitted to a logic circuit 3210. After being encoded in the logic circuit 3210, the signal is amplified in an amplifier 3211. By the signal, the modulation circuit 3212 modulates the carrier. Meanwhile, a communication signal inputted into a rectifier circuit 3203 is rectified, which is inputted to a power source circuit 3204. The power source circuit 3204 supplies power to the amplifier 3206, the demodulation circuit 3205, the logic circuit 3207, the memory control circuit 3208, the memory circuit 3209, the logic circuit 3210, the amplifier 3211, the modulation circuit 3212, and the like. Thus, a passive RFID operates.

[Patent Document 1] Japanese Published Patent Application No. 2005-316724
[Patent Document 2] Japanese Translation of PCT International Application No. 2006-503376

DISCLOSURE OF INVENTION

However, there has been a problem in that a semiconductor device including an active RFID provided with a driving battery, which is shown in FIG. 31, consumes power over time in accordance with transmission/reception of individual information, and setting of intensity of a radio wave necessary for the transmission/reception, and finally, it becomes impossible to generate power necessary for the transmission/reception of individual information. Therefore, there has been a problem in that it is required that remaining capacity of a driving battery be checked and the driving battery be changed in order to continue to use a semiconductor device including an active RFID which is provided with the driving battery.

Further, as shown in FIG. 32, a semiconductor device, which has a passive RFID that generates driving power by utilizing an external electromagnetic wave (carrier wave), has a problem in that it is difficult to secure power for transmitting/receiving a long-distance signal and for transmitting an electromagnetic wave necessary for the transmission/reception and to realize a good transmission/reception state. Therefore, there has been a problem in that a semiconductor device, which has a passive RFID that generates driving power by utilizing an external electromagnetic wave (carrier wave), can be used only when an external electromagnetic wave is sufficiently supplied (for example, when the semiconductor device is provided near an antenna of a reader/writer which is a power source supplying means).

The present invention provides a semiconductor device including an RFID which can transmit/receive individual information without a change of a battery accompanied by deterioration over time of the battery which is a drive power source, and to which driving power can be supplied to keep a favorable transmission/reception state of the individual information even when an external electromagnetic wave is not sufficient.

In order to solve the aforementioned problems, in the present invention, a battery (also referred to as a secondary battery) is provided as a power source which supplies power for driving an RFID. Further, in the present invention, another antenna for charging the battery wirelessly as a means which supplies power to the battery is provided in addition to an antenna which externally transmits/receives individual data. Hereinafter, a specific structure of the present invention is described.

One mode of the present invention is a semiconductor device including a signal processing circuit, a first antenna circuit and a second antenna circuit which are operationally connected to the signal processing circuit, and a battery which is operationally connected to the signal processing circuit, in which the first antenna circuit transmits/receives a signal for transmitting data stored in the signal processing circuit; the second antenna circuit receives a signal for charging the battery; and a signal received by the first antenna circuit and a signal received by the second antenna circuit have different wavelengths.

The aforementioned mode of the present invention is the semiconductor device in which the first antenna circuit communicates a signal for transmitting data stored in the signal processing circuit through a reader/writer; and the second antenna circuit receives a signal for charging the battery from an external radio signal. Note that as an external radio signal, an electromagnetic wave can be received as long as they are in the air: for example, a radio wave of switching offices of mobile phones (an 800 to 900 MHz band, a 1.5 GHz band, a 1.9 to 2.1 GHz band, and the like); a radio wave generated from mobile phones; a radio wave of a radio wave clock (40 kHz and the like); and a noise of a home AC power source (60 Hz and the like).

One mode of the present invention is a semiconductor device including a signal processing circuit, a first antenna circuit and a second antenna circuit which are operationally connected to the signal processing circuit, a battery which is operationally connected to the signal processing circuit, and a booster antenna, in which the first antenna circuit transmits/receives a signal for transmitting data stored in the signal processing circuit to/from a reader/writer through the booster antenna; the second antenna circuit receives a signal for charging the battery from an external radio signal; and a signal received by the first antenna circuit and a signal received by the second antenna circuit have different wavelengths.

One mode of the present invention is a semiconductor device including a signal processing circuit, a first antenna circuit which is operationally connected to the signal processing circuit, a plurality of second antenna circuits, a battery which is operationally connected to the signal processing circuit, and a booster antenna, in which the first antenna circuit transmits/receives a signal for transmitting data stored in the signal processing circuit to/from a reader/writer; the second antenna circuit receives a signal for charging the battery from an external radio signal through the booster antenna; and a signal received by the first antenna circuit and a signal received by the second antenna circuit have different wavelengths.

One mode of the present invention is a semiconductor device including a first signal processing circuit, a second signal processing circuit, a first antenna circuit which is operationally connected to the first signal processing circuit, a second antenna circuit which is operationally connected to the second signal processing circuit, and a battery which is operationally connected to the first signal processing circuit and the second signal processing circuit, in which the first antenna circuit transmits/receives a signal for transmitting data stored in the first signal processing circuit; the second antenna circuit receives a signal for charging the battery; and a signal received by the first antenna circuit and a signal received by the second antenna circuit have different wavelengths.

The aforementioned mode of the present invention is the semiconductor device in which the first antenna circuit communicates a signal for transmitting data stored in the first signal processing circuit through a reader/writer; and the second antenna circuit receives a signal for charging the battery from an external radio signal. Note that as an external radio signal, an electromagnetic wave can be received as long as they are in the air: for example, a radio wave of switching offices of mobile phones (800 to 900 MHz band, 1.5 GHz band, 1.9 to 2.1 GHz band, and the like); a radio wave generated from mobile phones; a radio wave of a radio wave clock (40 kHz and the like); and a noise of a home AC power source (60 Hz and the like).

One mode of the present invention is a semiconductor device including a first signal processing circuit, a second signal processing circuit, a first antenna circuit which is operationally connected to the first signal processing circuit, a second antenna circuit which is operationally connected to the second signal processing circuit, a battery which is operationally connected to the first signal processing circuit and the second signal processing circuit, and a booster antenna, in which the first antenna circuit transmits/receives a signal for transmitting data stored in the first signal processing circuit to/from a reader/writer through the booster antenna; a second antenna circuit receives a signal for charging the battery from an external radio signal; and a signal received by the first antenna circuit and a signal received by the second antenna circuit have different wavelengths.

One mode of the present invention is a semiconductor device including a first signal processing circuit, a second signal processing circuit, a first antenna circuit which is operationally connected to the first signal processing circuit, a plurality of second antenna circuits which are operationally connected to the second signal processing circuit, a battery which is operationally connected to the first signal processing circuit and the second signal processing circuit, and a booster antenna, in which the first antenna circuit transmits/receives a signal for transmitting data stored in the first signal processing circuit to/from a reader/writer; a second antenna circuit receives a signal for charging the battery from an external radio signal through the booster antenna; and a signal received by the first antenna circuit and a signal received by the second antenna circuit have different wavelengths.

A battery of the present invention may supply power to a power source circuit included in the first signal processing circuit.

Further, the first antenna circuit and any one of the plurality of second antenna circuits of the present invention may receive a signal by an electromagnetic induction method.

As a battery of the present invention, a lithium battery, a nickel hydride battery, a nickel cadmium battery, an organic radical battery, or a capacitor may be used.

In the present invention, "being connected" means "being electrically connected" and "being directly connected". Therefore, in the structure disclosed in the present invention, another element which enables an electrical connection (for example, a switch, a transistor, a capacitor, an inductor, a resistor, a diode, or the like) may be provided in addition to the predetermined connection. Alternatively, a direct connection may be made without interposing another element. It is to be noted that when elements are connected without interposing another element which enables an electrical connection and connected not electrically but directly, it is referred to as "being directly connected". It is to be noted that "being electrically connected" means also "being directly connected".

It is to be noted that transistors of various modes can be applied to a transistor of the present invention. Therefore, kinds of transistors applicable to the present invention are not limited. Accordingly, the following transistors are applicable to the present invention: a thin film transistor (TFT) using a non-single crystalline semiconductor film typified by amorphous silicon and polycrystalline silicon; a transistor which is formed using a semiconductor substrate or an SOI substrate; a MOS transistor; a junction transistor; a bipolar transistor; a transistor using a compound semiconductor such as ZnO or a-InGaZnO; a transistor using an organic semiconductor or a carbon nanotube; and other transistors. It is to be noted that a non-single crystalline semiconductor film may contain hydrogen or halogen. A substrate over which a transistor is provided is not limited to a particular type and various kinds of substrates can be used. Therefore, a transistor can be provided over, for example, a single crystalline substrate, an SOI substrate, a glass substrate, a quartz substrate, a plastic substrate, a paper substrate, a cellophane substrate, a stone substrate, or the like. Further, a transistor formed over a certain substrate may be transferred to another substrate.

It is to be noted that a transistor applied to a semiconductor device of the present invention may have, for example, a multi-gate structure where the number of gates is two or more. With a multi-gate structure, an off current can be reduced and reliability can be improved by improving the pressure resistance of a transistor, and flat characteristics can be obtained since a drain-source current does not change so much even when a drain-source voltage changes in the operation in a saturation region. Further, gate electrodes may be provided over and under a channel. Accordingly, a channel region increases, thereby a current value is increased or an S value can be improved since a depletion layer is easily formed. Further, a gate electrode may be provided over or under the channel. Either a forward staggered structure or an inversely staggered structure may be employed. A channel region may be divided into a plurality of regions, or connected in parallel or in series. Further, a source electrode or a drain electrode may overlap a channel (or a part of it), thereby preventing a charge from being accumulated in a part of the channel and unstable operation. Further, an LDD region may be provided. By providing an LDD region, an off current can be reduced and reliability can be improved by improving the pressure resistance of a transistor, and flat characteristics can be obtained since a drain-source current does not change so much even when a drain-source voltage changes in the operation in a saturation region.

It is to be noted that various types of transistors can be used as a transistor applied to a semiconductor device of the present invention and formed over various substrates as described above. Therefore, all of the circuits may be formed over a glass substrate, a plastic substrate, a single crystalline substrate, an SOI substrate, or any substrate. When all the circuits are formed over a substrate, cost can be reduced by reducing the number of components and reliability can be improved by reducing the number of connections with the components. Alternatively, a part of circuits may be formed over a certain substrate and another part of the circuits may be formed over another substrate. That is, not all of the circuits are required to be formed over the same substrate. For example, a part of circuits may be formed over a glass substrate using a transistor and another part of the circuits may be formed over a single crystalline substrate into an IC chip which may be provided over the glass substrate by COG (Chip On Glass). Alternatively, the IC chip may be connected to a glass substrate using TAB (Tape Auto Bonding) or a printed substrate. In this manner, when a part of circuits are formed over the same substrate, cost can be reduced by reducing the number of components and reliability can be improved by reducing the number of connections with the components. Further, a portion with a high driving voltage or a high driving frequency which consumes more power is not formed over the same substrate, thereby an increase in power consumption can be prevented.

It is to be noted that a semiconductor device of this specification corresponds to a general device which can function by utilizing semiconductor characteristics.

A semiconductor device of the present invention has a battery; therefore, it can be prevented that power for transmitting/receiving individual information gets low in accordance with deterioration over time of a battery. In addition, a semiconductor device of the present invention has an antenna for supplying power to a battery wirelessly. Therefore, the semiconductor device can charge the battery by utilizing power of an external electromagnetic wave as a power source for driving the semiconductor device without being directly connected to a charger. Thus, it becomes possible to continue to use the semiconductor device without a check of remaining capacity of a battery or a change of the battery, which is necessary in the case of an active RFID. In addition, power for driving the semiconductor device is always held in the battery, whereby power enough for operation of the semiconductor device can be obtained and communication distance with the reader/writer can be extended.

BRIEF DESCRIPTION OF DRAWINGS

FIGS. 11A to 11F are views each showing a structure example of a semiconductor device of the present invention.

FIGS. 19A to 19D are views each showing a structure example of a manufacturing method of a semiconductor device of the present invention.

FIGS. 20A to 20C are views each showing a structure example of a manufacturing method of a semiconductor device of the present invention.

FIGS. 22A and 22B are views each showing a structure example of a manufacturing method of a semiconductor device of the present invention.

FIGS. 23A and 23B are views each showing a structure example of a manufacturing method of a semiconductor device of the present invention.

FIGS. 24A to 24D are views each showing a structure example of a manufacturing method of a semiconductor device of the present invention.

FIG. 27 is a view showing a structure example of a manufacturing method of a semiconductor device of the present invention.

FIGS. 28A and 28B are views each showing a structure example of a manufacturing method of a semiconductor device of the present invention.

FIGS. 29A and 29B are views each showing a structure example of a manufacturing method of a semiconductor device of the present invention.

BEST MODE FOR CARRYING OUT THE PRESENT INVENTION

Figure 1:
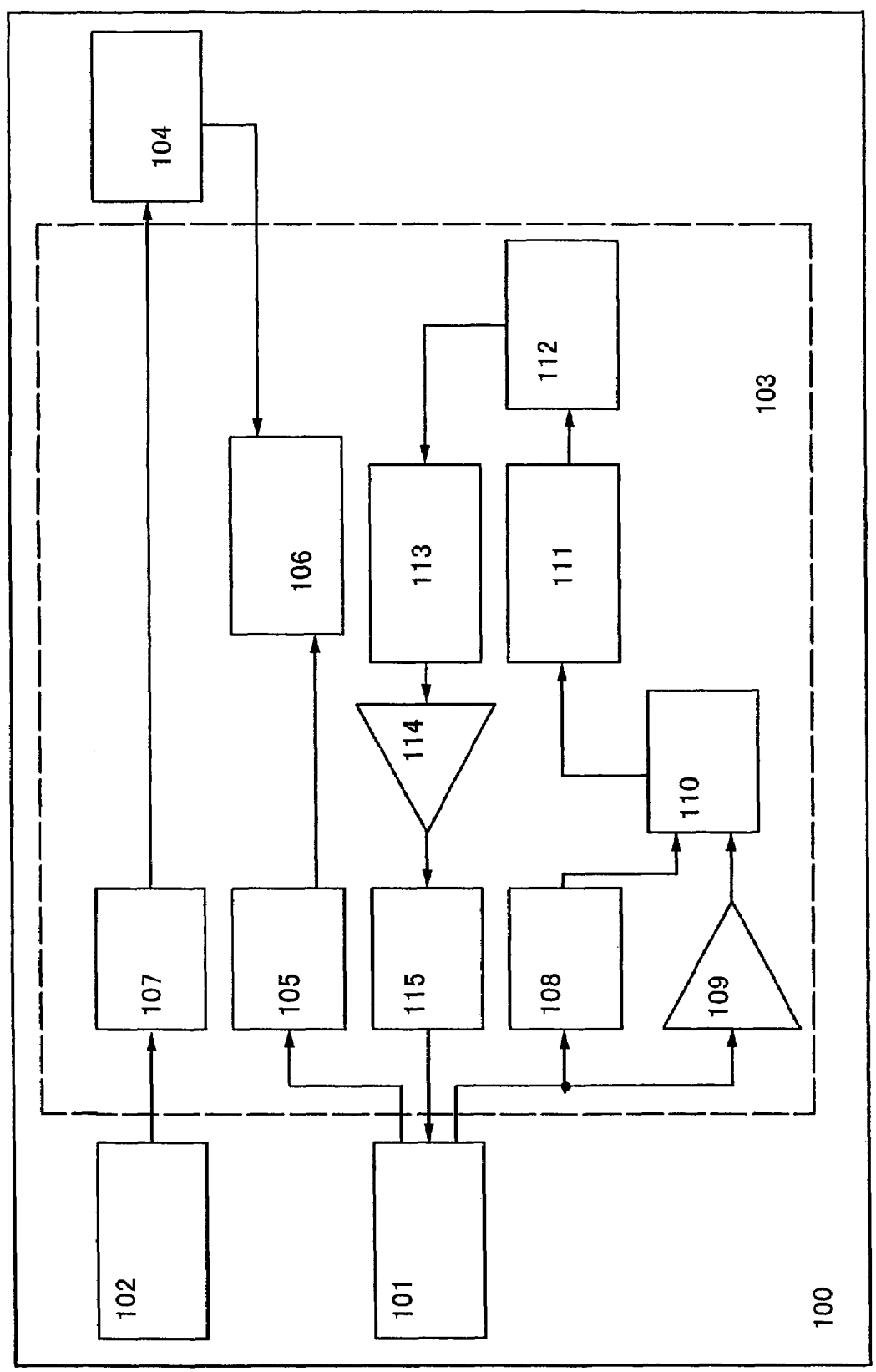
FIG. 1 is a diagram showing a structure example of a semiconductor device of the present invention.

Although the present invention will be fully described by way of embodiment modes and an embodiment with reference to the accompanying drawings, it is to be understood that various changes and modifications will be apparent to those skilled in the art. Therefore, unless such changes and modifications depart from the spirit and the scope of the present invention, they should be construed as being included therein. Note that common portions are denoted by the same reference numerals in all diagrams in a structure of the present invention, which is described below.

Embodiment Mode 1

A structure example of a semiconductor device of the present invention is described with reference to block diagrams shown in FIGS. 1 and 2. Note that in this embodiment mode, description is made of a case where a semiconductor device is used as an RFID tag (hereinafter, also simply referred to as "RFID").

A semiconductor device shown in FIG. 1 (hereinafter referred to as an "RFID 100") includes a first antenna circuit 101, a second antenna circuit 102, a signal processing circuit 103, and a battery 104. The signal processing circuit 103 includes a first rectifier circuit 105, a power source circuit 106, a second rectifier circuit 107, a demodulation circuit 108, an amplifier 109, a logic circuit 110, a memory control circuit 111, a memory circuit 112, a logic circuit 113, an amplifier 114, and a modulation circuit 115.

Figure 2:
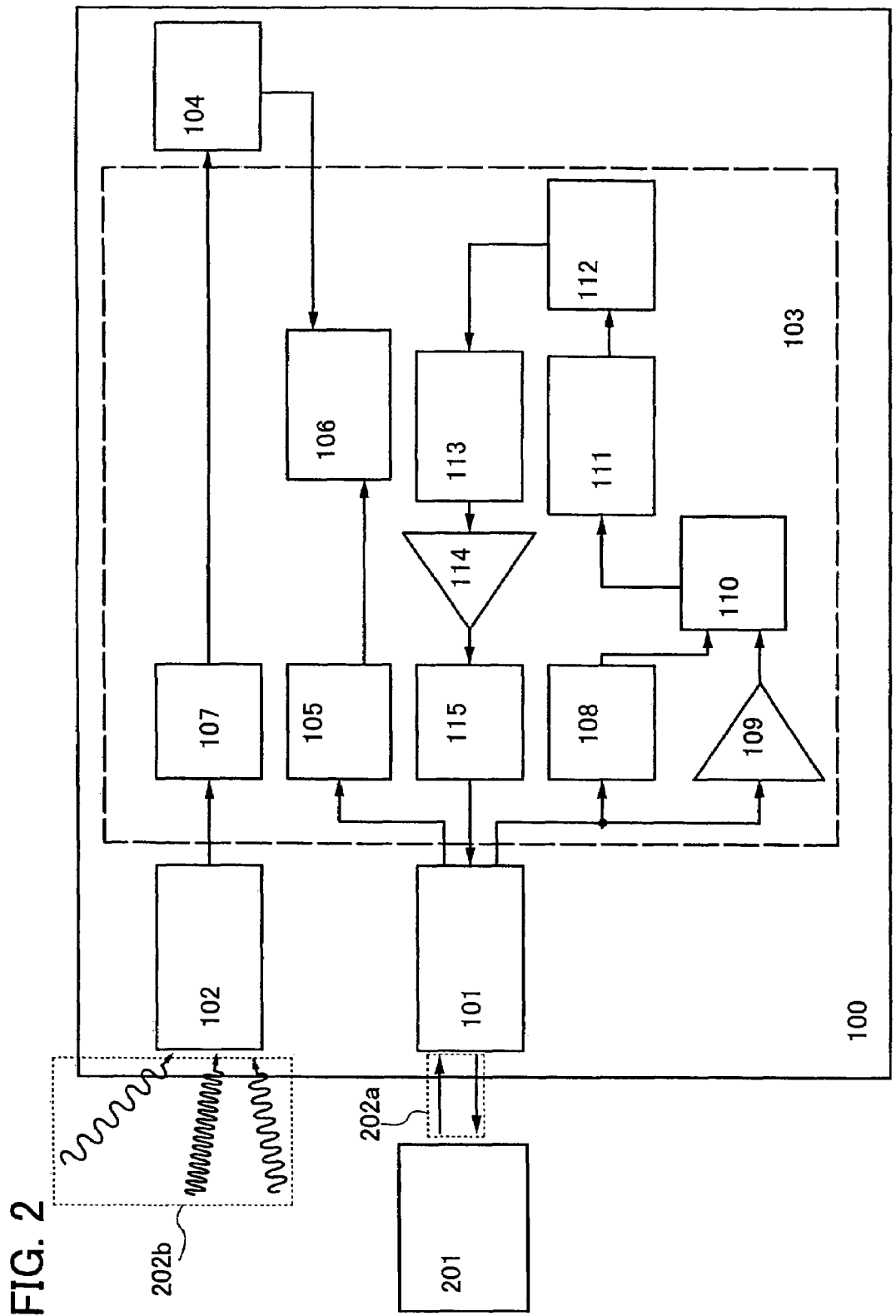
FIG. 2 is a diagram showing a structure example of a semiconductor device of the present invention.

FIG. 2 shows a case where the first antenna circuit 101 receives a radio wave 202a generated from a reader/writer 201 (or transmits a radio wave to the reader/writer 201), and the second antenna circuit 102 receives an external radio wave 202b. In FIG. 2, the radio wave 202a received by the first antenna circuit 101 is inputted to the power source circuit 106 through the first rectifier circuit 105, and at the same time, data contained in the radio wave 202a is extracted by the demodulation circuit 108 or the like. Further, the radio wave 202b received by the second antenna circuit 102 is inputted to the battery 104 through the second rectifier circuit 107.

In a case of the RFID 100 described in this embodiment mode, the external radio wave 202b received by the second antenna circuit 102 is inputted to the battery 104, whereby the battery 104 is charged. Power charged in the battery 104 is supplied to circuits provided in the signal processing circuit 103 through the power source circuit 106. In other words, the battery 104 is charged wirelessly. Further, the radio wave 202a, which is received by the first antenna circuit 101 and is inputted through the first rectifier circuit 105, is supplied as power for driving the RFID 100 to the circuits of the signal processing circuit 103 through the power source circuit 106.

It is to be noted that the RFID 100 described in this embodiment mode uses the external radio waves 202b (hereinafter also referred to as a "radio signal") as a radio wave received by the second antenna circuit 102 in order to charge the battery 104. For a radio signal, a radio wave of switching offices of mobile phones (800 to 900 MHz band, 1.5 GHz band, 1.9 to 2.1 GHz band, and the like); a radio wave generated from mobile phones; a radio wave of a radio wave clock (40 kHz and the like), a noise of a home AC power source (60 Hz and the like), a radio wave randomly generated from another reader/writer (reader/writer which does not directly communicate with the RFID 100), or the like can be used. Further, a plurality of antenna circuits including different lengths and different antennas are provided as the second antenna circuits 102, whereby a plurality of radio signals including different wavelengths can be used when charging the battery 104.

Since the battery is charged wirelessly by receiving the aforementioned radio signal, an additional charger or the like for charging the battery is not required; therefore, a change of a battery is not necessary. Accordingly, the RFID can be provided at lower cost. The antenna of the second antenna circuit 102 is set to have such a length and shape that it can receive these radio signals easily. In a case of receiving a plurality of radio signals including different wavelengths, a plurality of antenna circuits which include antennas including different lengths and different shapes are preferably provided.

Figure 4A:
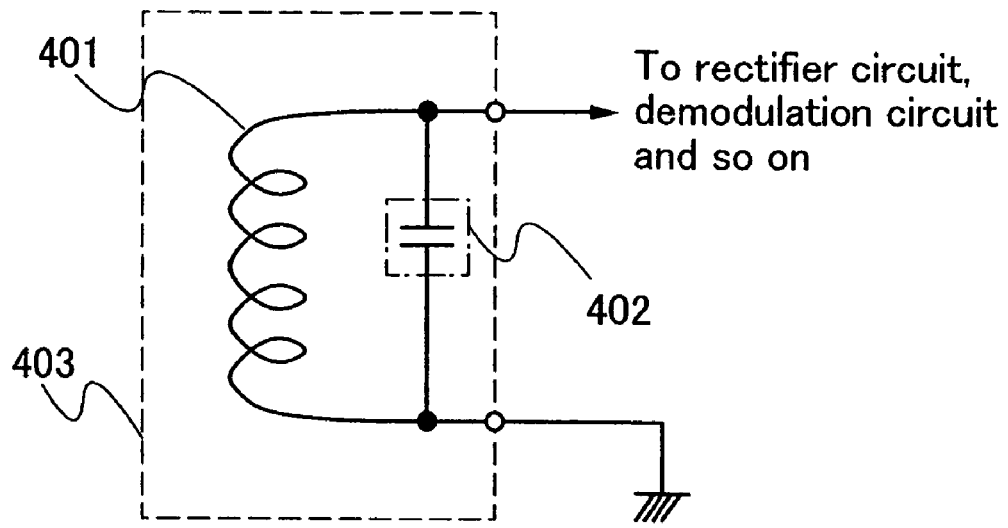
FIGS. 4A and 4B are diagrams each showing a structure example of a semiconductor device of the present invention.
Figure 4B:
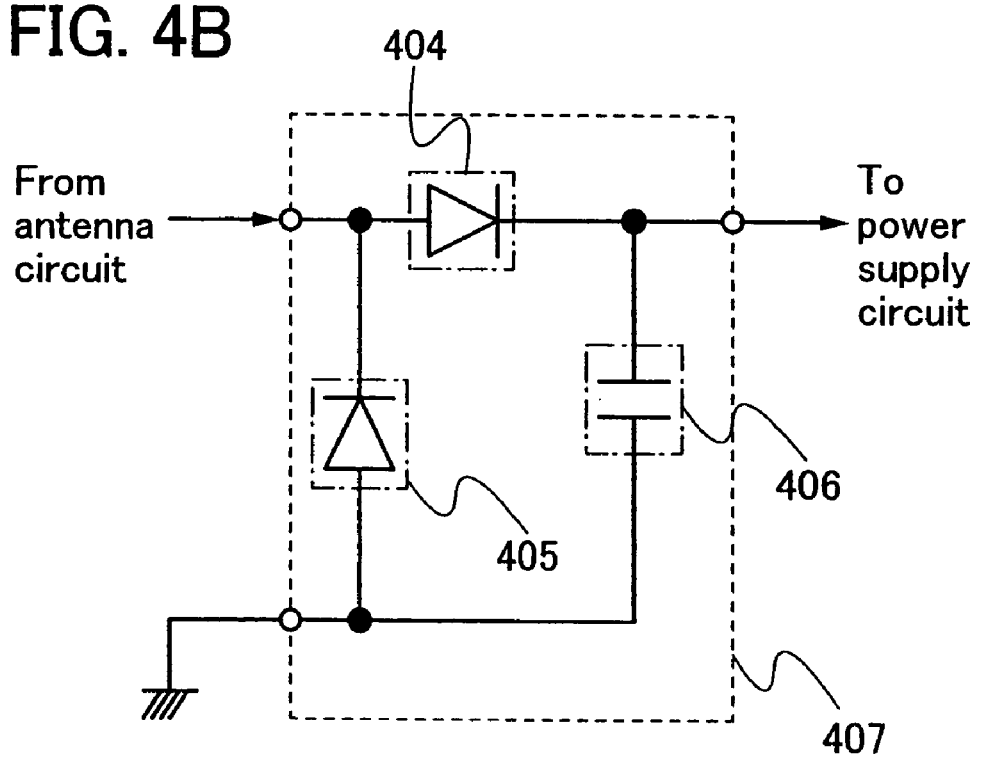

Note that the first antenna circuit 101 and the second antenna circuit 102 each can be formed of, for example, an antenna 401 and a resonant capacitor 402 as shown in FIG. 4A, and a combination of the antenna 401 and the resonant capacitor 402 is called an antenna circuit 403 in some cases. The first rectifier circuit 105 and the second rectifier circuit 107 only need to convert an AC signal induced by an electromagnetic wave received by the first antenna circuit 101 and the second antenna circuit 102 into a DC signal. For example, as shown in FIG. 4B, a rectifier circuit 407 may be formed of a diode 404, a diode 405, and a smoothing capacitor 406.

A shape of the antenna of the first antenna circuit 101 is not specifically limited: an electromagnetic coupling method, an electromagnetic induction method, a microwave method, or the like can be used as a signal transmission method applied to the first antenna circuit 101 of the RFID 100. The transmission method may be appropriately selected in consideration of a use, and an antenna including an optimal length and shape may be provided depending on the transmission method.

In the case of employing, for example, an electromagnetic coupling method or an electromagnetic induction method (for example, a 13.56 MHz band) as the transmission method, electromagnetic induction caused by a change in magnetic field density is used. Therefore, a conductive film serving as an antenna is formed to have an annular shape (for example, a loop antenna) or a spiral shape (for example, a spiral antenna).

In the case of employing, for example, a microwave method (for example, a UHF band (860 to 960 MHz band) or a 2.45 GHz band) as the transmission method, the shape such as a length of the conductive film serving as the antenna may be appropriately set in consideration of a wavelength of an electromagnetic wave used for signal transmission. For example, the conductive film serving as the antenna can be formed in a linear shape (for example, a dipole antenna), a flat shape (for example, a patch antenna), or the like. The shape of the conductive film serving as the antenna is not limited to a linear shape, and the conductive film serving as the antenna may be provided in a curved-line shape, a meandering shape, or a combination thereof, in consideration of a wavelength of an electromagnetic wave.

Figure 3A:
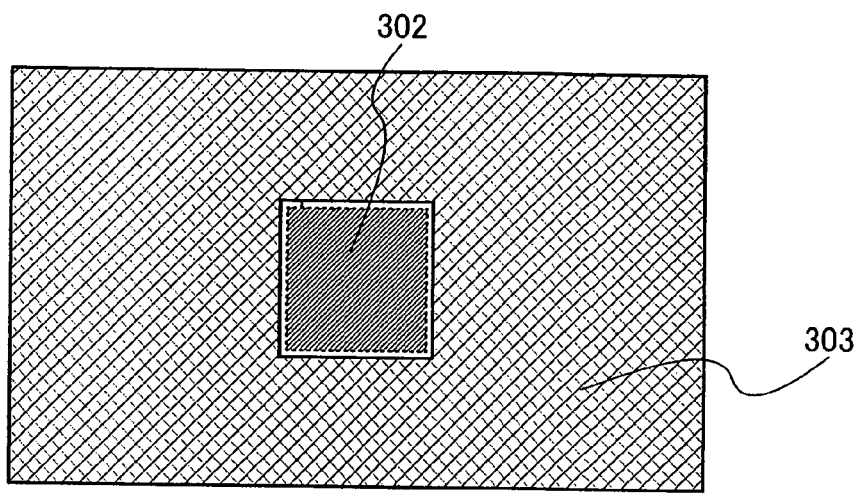
FIGS. 3A to 3E are views each showing a shape of an antenna included in a semiconductor device of the present invention.
Figure 3B:
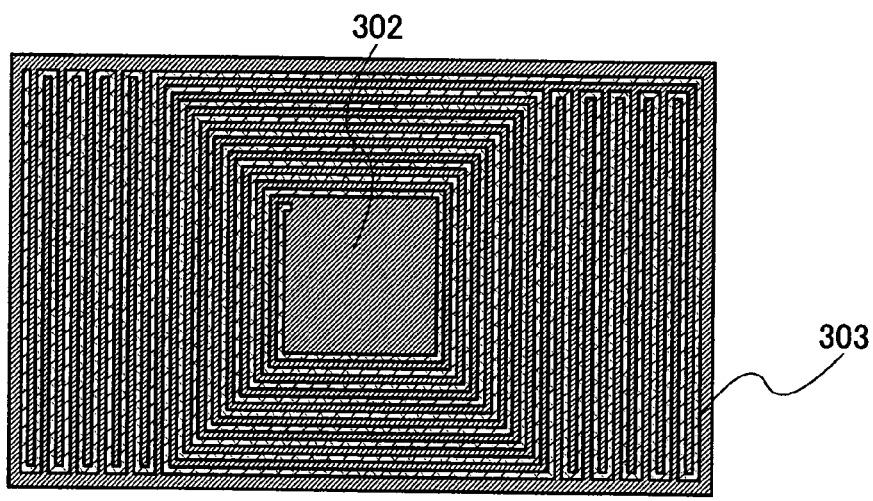
Figure 3C:
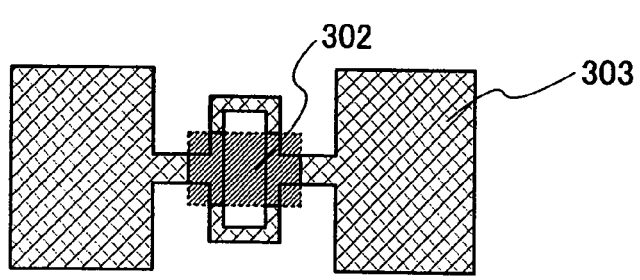
Figure 3D:
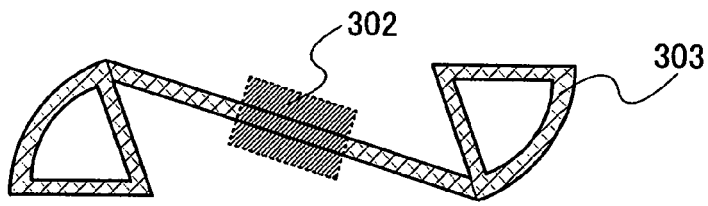
Figure 3E:
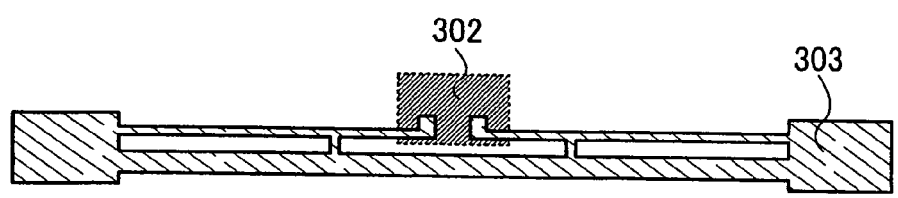

FIGS. 3A to 3E show examples of shapes of the antenna provided for the first antenna circuit 101 or the second antenna circuit 102 in the case of employing the microwave method. For example, as shown in FIG. 3A, an antenna 303 may be provided so as to expand outside a chip 302 provided with the signal processing circuit. As shown in FIG. 3B, the antenna 303 that is thin may be provided over the chip 302 provided with a signal processing circuit. As shown in FIG. 3C, the antenna 303 may have a shape for receiving a high-frequency electromagnetic wave with respect to the chip 302 provided with the signal processing circuit. As shown in FIG. 3D, the antenna 303 may have a shape with which it is 180° omnidirectional (capable of receiving signals in any direction) with respect to the chip 302 provided with the signal processing circuit. As shown in FIG. 3E, the antenna 303 may have a shape which is extended to be long as a stick with respect to the chip 302 provided with the signal processing circuit. When the microwave method is employed for the first antenna circuit 101 and the second antenna circuit 102, antennas including these shapes can be used in combination.

Further, in FIGS. 3A to 3E, there is no specific limitation with regard to a connection of the chip 302 provided with a signal processing circuit and the antenna. For example, the antenna 303 and the chip 302 may be connected by wire bonding connection or bump connection. Alternatively, the chip may be attached to the antenna 303 with a part of the chip being an electrode. In this method, an ACF (Anisotropically Conductive Film) can be used to attach the chip 302 to the antenna 303. An appropriate length required for an antenna varies depending on frequency for receiving signals. Therefore, the length is a submultiple of a wavelength. For example, in the case where a frequency is 2.45 GHz, the length of antenna may be approximately 60 mm (½ wavelength) and approximately 30 mm (¼ wavelength).

Note that the power source circuit 106 in FIGS. 1 and 2 supplies power for driving the RFID 100 to each circuit. Specifically, it controls power, which is obtained by being received by the first antenna circuit 101 and rectified in the first rectifier circuit 105, to have a certain value, and supplies power necessary for operation of each circuit of the signal processing circuit 103. In addition, it controls power charged in the battery 104 to have a certain value, and supplies power necessary for operation of each circuit of the signal processing circuit 103. Even when sufficient power is not obtained through the first antenna circuit 101 of the RFID 100, power necessary for operation of each circuit of the signal processing circuit 103 is supplied by power charged in the battery 104.

An example of a power source circuit in FIGS. 1 and 2 is described with reference to FIG. 6. The power source circuit includes a reference voltage circuit and a buffer amplifier. The reference voltage circuit includes a resistor 1001, and diode-connected transistors 1002 and 1003, and generates a reference voltage corresponding to two Vgs of a transistor. The buffer amplifier includes a differential circuit formed of transistors 1005 and 1006, a current mirror circuit formed of transistors 1007 and 1008, and a common source amplifier formed of a current supply resistor 1004, a transistor 1009, and a resistor 1010.

Figure 6:
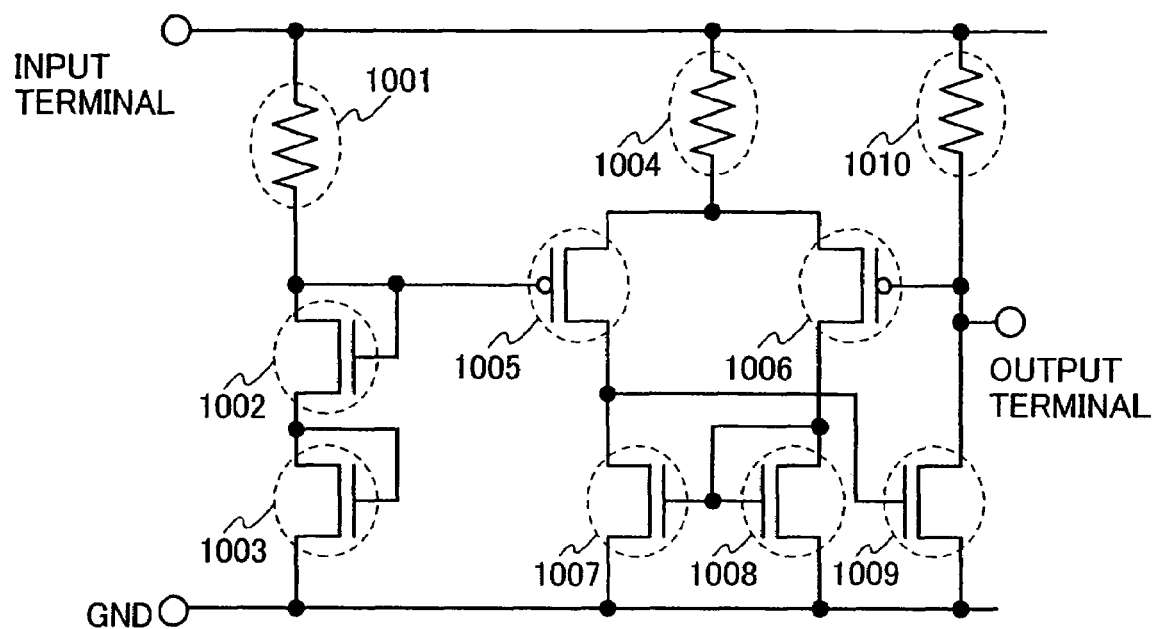
FIG. 6 is a diagram showing a structure example of a semiconductor device of the present invention.

In the power source circuit shown in FIG. 6, when the amount of current flowing from an output terminal is large, the amount of current flowing to the transistor 1009 is reduced; when the amount of current flowing from the output terminal is small, the amount of current flowing to the transistor 1009 is increased; and a current flowing to the resistor 1010 is almost constant. A potential of the output terminal has approximately the same value as that of the reference voltage circuit. Although the power source circuit including the reference voltage circuit and the buffer amplifier is shown here, a power source circuit used in the present invention is not limited to that of FIG. 6, and it may be a circuit including another form.

It is to be noted in this specification that a battery refers to a battery which can restore continuous operating time by being charged. In other words, a battery refers to a battery that has operation time, which is reduced in accordance with consumption of power, and can extend operation time by being charged with power reduced by consumption. Specifically, following secondary batteries can be used as the battery: a lithium ion battery, a lithium secondary battery, a nickel hydride battery, a nickel cadmium battery, an organic radical battery, a lead-acid battery, an air secondary battery, a nickel zinc battery, a silver zinc battery, and the like. The battery is not limited to them, and a high-capacity capacitor may be used. In particular, a lithium ion battery and a lithium secondary battery have high charge and discharge capacity; therefore, it is used as a battery provided for a semiconductor device of this embodiment mode, and thus miniaturization of the semiconductor device can be achieved.

Next, description is made of operation in writing data to the RFID 100 shown in FIGS. 1 and 2 by the reader/writer 201. A signal received by the first antenna circuit 101 is half-wave rectified and then smoothed by the first rectifier circuit 105. A voltage which has been half-wave rectified and smoothed by the first rectifier circuit 105 is inputted to the power source circuit 106. The power source circuit supplies a stabilized voltage to the amplifier 109, the logic circuit 110, the memory control circuit 111, the memory circuit 112, the logic circuit 113, the amplifier 114, and the modulation circuit 115.

The signal received by the first antenna circuit 101 is inputted to the logic circuit 110 as a clock signal through the amplifier 109. In addition, the signal inputted from the first antenna circuit 101 is demodulated in the demodulation circuit 108, and then inputted as data to the logic circuit 110.

In the logic circuit 110, the inputted data is decoded. The reader/writer 201 encodes data by a transform mirror code, an NRZ-L code, or the like to transmit, and then the logic circuit 110 decodes the data. When the decoded data is transmitted to the memory control circuit 111, the data is written to the memory circuit 112. The memory circuit 112 is required to be a nonvolatile memory circuit which can hold data even when a power source is shut off, thus, a mask ROM or the like is used.

In order to read data stored in the memory circuit 112, which is in the RFID 100 shown in FIGS. 1 and 2, the reader/writer 201 operates as described below. The signal received by the first antenna circuit 101 is half-wave rectified and then smoothed by the first rectifier circuit 105. A voltage which has been half-wave rectified and smoothed by the first rectifier circuit 105 is inputted to the power source circuit 106. The power source circuit supplies a stabilized voltage to the amplifier 109, the logic circuit 110, the memory control circuit 111, the memory circuit 112, the logic circuit 113, the amplifier 114, and the modulation circuit 115.

An AC signal received by the first antenna circuit 101 is inputted to the logic circuit 110, and logic operation is conducted. Then, the signal from the logic circuit 110 is used to control the memory control circuit 111, and the data stored in the memory circuit 112 is called up. After the data called from the memory circuit 112 is processed in the logic circuit 113 and then amplified in the amplifier 114, the modulation circuit 115 is operated. Data is processed in accordance with a method prescribed by IS014443, IS015693, IS018000, or the like. A method prescribed by another standard may be used as long as consistency with a reader/writer can be ensured.

When the modulation circuit 115 operates, impedance of the first antenna circuit 101 varies. Accordingly, a signal of the reader/writer 201, which is reflected in the first antenna circuit 101, is changed. The change is read by the reader/writer, which makes it possible to know data stored in the memory circuit 112 of the RFID 100. Such a modulation method is called a load modulation method.

It is to be noted that transistors of various modes can be applied to a transistor provided for the signal processing circuit 103. Therefore, kinds of transistors applicable to the present invention are not limited. Accordingly, the following transistors are applicable to the present invention: a thin film transistor (TFT) using a non-single crystalline semiconductor film typified by amorphous silicon and polycrystalline silicon; a transistor which is formed using a semiconductor substrate or an SOI substrate; a MOS transistor; a junction transistor; a bipolar transistor; a transistor using a compound semiconductor such as ZnO or a-InGaZnO; a transistor using an organic semiconductor or a carbon nanotube; and other transistors. It is to be noted that a non-single crystalline semiconductor film may contain hydrogen or halogen. A substrate over which a signal processing circuit 103 is provided is not limited to a particular type and various kinds of substrates can be used. Therefore, the signal processing circuit 103 can be provided over, for example, a single crystalline substrate, an SOI substrate, a glass substrate, a quartz substrate, a plastic substrate, a paper substrate, a cellophane substrate, a stone substrate, or the like. Further, the signal processing circuit 103 formed over a certain substrate may be transferred to another substrate.

Next, description is made of operation in charging power to the RFID 100 shown in FIGS. 1 and 2 from an external radio signal. An external radio signal received by the second antenna circuit 102 is half-wave rectified and then smoothed by the second rectifier circuit 107. A voltage which has been half-wave rectified and smoothed by the second rectifier circuit 107 is temporarily held in the battery 104. Power held in the battery 104 is used as power to be supplied to the power source circuit 106. Note that a structure in which when a signal supplied from the first antenna circuit can be received but power for transmitting the signal to the reader/writer is insufficient, a circuit for determining whether power is supplied from the battery may be employed.

Hereinafter, a structure example of an RFID of this embodiment mode is described. It is to be noted here that description is made of a case where an antenna provided in the first antenna circuit 101 has a coil shape, and a plurality of antenna circuits which include antennas including different lengths and different shapes are provided as the second antenna circuit 102.

The RFID 100 of this embodiment mode is divided into a first antenna circuit, a second antenna circuit, a signal processing circuit, and a battery by function and size, and they are stacked or arranged in parallel over a substrate. Further, the signal processing circuit can be divided into a circuit accompanying the first antenna circuit and a circuit accompanying the second antenna circuit. In following description, the circuit accompanying the first antenna circuit and the circuit accompanying the second antenna circuit are referred to as a first signal processing circuit and a second signal processing circuit, respectively. Note that the first signal processing circuit includes at least the first logic circuit 105, the power source circuit 106, the demodulation circuit 108, the amplifier 109, the logic circuit 110, the memory control circuit 111, the memory circuit 112, the logic circuit 113, the amplifier 114, and the modulation circuit 115 of the signal processing circuit 103 in FIG. 1. On the other hand, the second signal processing circuit includes at least the second rectifier circuit 107 of the signal processing circuit 103 in FIG. 1.

Figure 7:
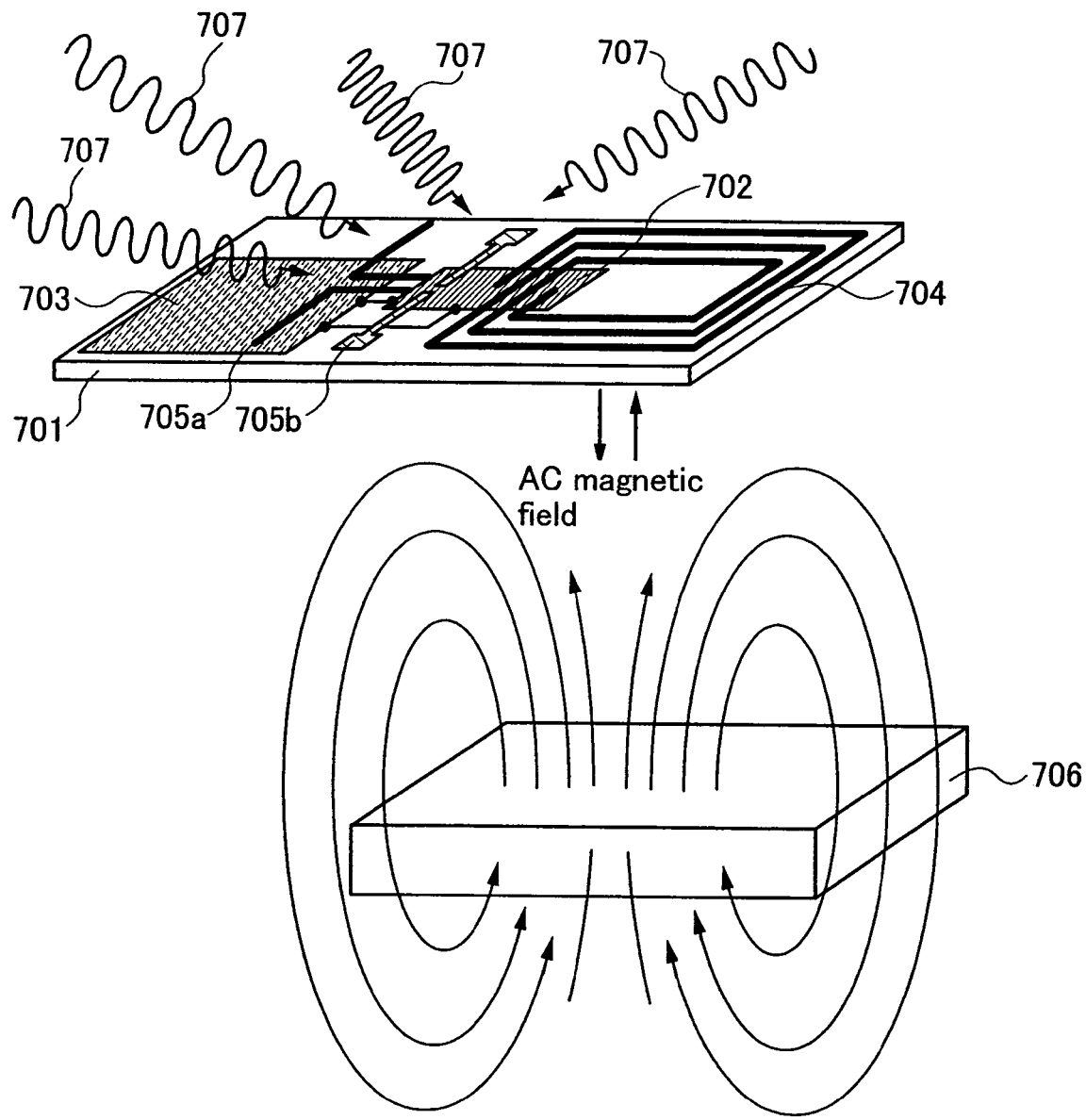
FIG. 7 is a view showing a structure example of a semiconductor device of the present invention.

An RFID shown in FIG. 7 includes a first antenna circuit 704, a plurality of second antenna circuits 705a and 705b, a chip 702 including a first signal processing circuit and a second signal processing circuit, and a battery 703. Note that the first antenna circuit 704 is operationally connected to the first signal processing circuit, and the second antenna circuits 705*a* and 705*b* are operationally connected to the second signal processing circuit.

A radio wave received by the first antenna circuit 704 is inputted to a power source circuit through a first rectifier circuit in the first signal processing circuit formed in the chip 702 to generate power at the same time as a signal included in a radio wave is extracted by a demodulation circuit or the like. The battery 703 is operationally connected to the second signal processing circuit formed in the chip 702, and a radio wave received by the plurality of second antenna circuits 705*a* and 705*b* is inputted to the battery 703 through a rectifier circuit in the second signal processing circuit.

Here, an example is shown, in which a radio wave transmitted from a reader/writer 706 is received by the first antenna circuit 704, and an external radio signal 707 is received by the second antenna circuits 705*a* and 705*b*. In other words, the RFID transmits/receives data to/from the reader/writer 706 through the first antenna circuit 704, and charges the battery 703 through the second antenna circuits 705*a* and 705*b*.

Further, the battery 703 is also electrically operationally connected to the first signal processing circuit provided in the chip 702, and power is appropriately supplied from the battery 703 to a power source circuit in the first signal processing circuit. There is no limitation on the connection of the battery 703 and the first signal processing circuit or the second signal processing circuit. For example, the battery 703 can be operationally connected to the first signal processing circuit or the second signal processing circuit by wire bonding connection or bump connection. Alternatively, the first signal processing circuit or the second signal processing circuit may be attached to a connecting terminal with the battery 703 with a part of the first signal processing circuit or the second signal processing circuit functioning as an electrode, in this case, by using an anisotropically conductive film or the like.

Figure 5:
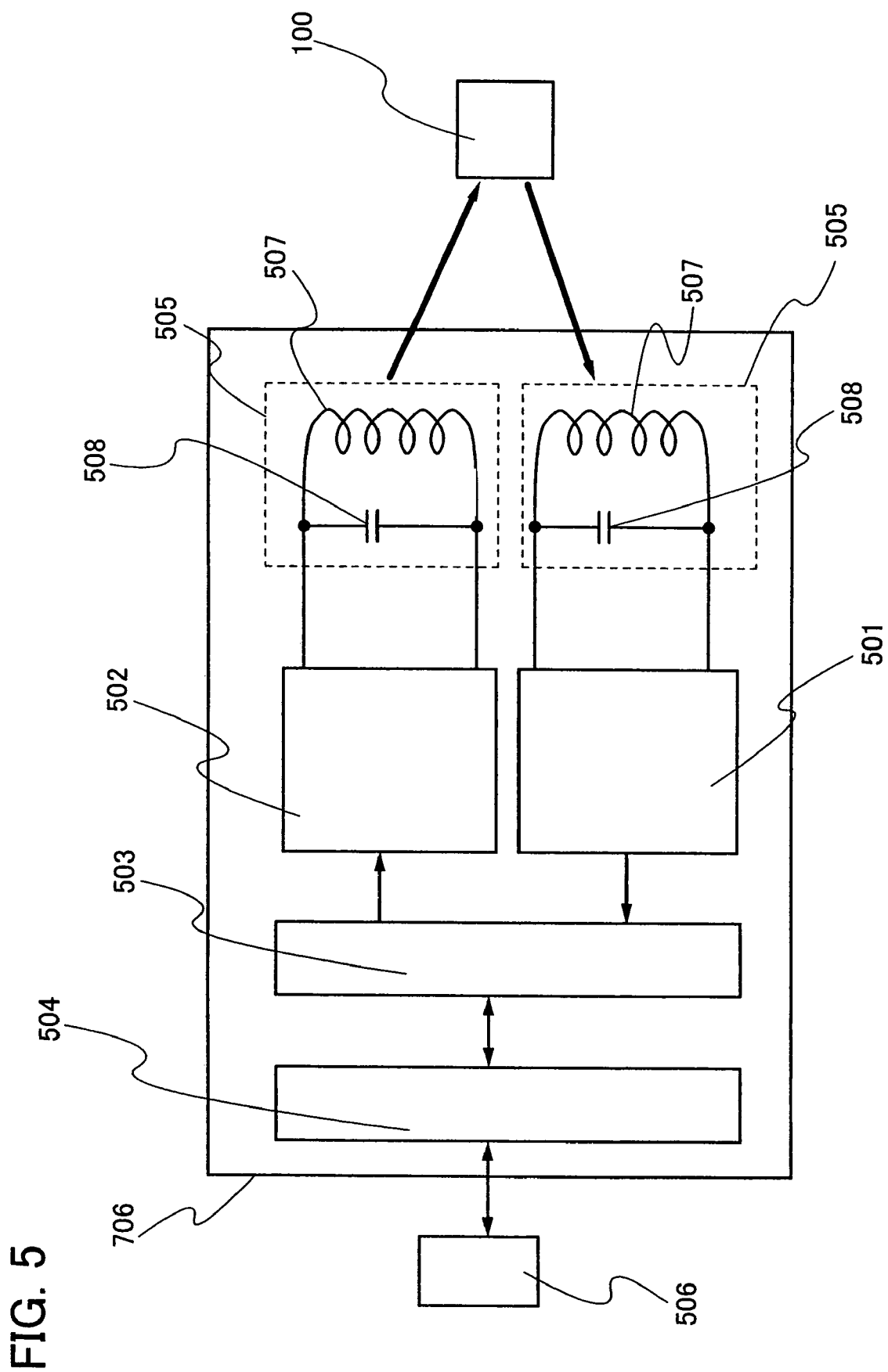
FIG. 5 is a view showing a structure example of a semiconductor device of the present invention.

Description is made of an example of the reader/writer 706 in FIG. 7 with reference to FIG. 5. The reader/writer 706 in FIG. 5 includes a receiving portion 501, a transmitting portion 502, a control portion 503, an interface portion 504, and an antenna circuit 505. The control portion 503 controls the transmitting portion 502 with respect to a data process order and a data process result by a control of a higher-level device 506 through the interface portion 504. The transmitting portion 502 modulates a data process order to be transmitted to the RFID 100, and then outputs it as an electromagnetic wave from the antenna circuit 505. The receiving portion 501 demodulates a signal received by the antenna circuit 505, and then outputs it as a data process result to the control portion 503.

In this embodiment mode, the antenna circuit 505 of the reader/writer 706 shown in FIG. 5 is connected to the receiving portion 501 and the transmitting portion 502, and has an antenna 507 and a resonant capacitor 508 that form an LC parallel resonance circuit. The antenna circuit 505 receives as an electronic signal an electromotive force induced to the antenna circuit 505 by a signal outputted from the RFID 100. Further, the antenna circuit 505 is supplied with an induction current to transmit a signal to the RFID 100.

The lengths and shapes of the second antenna circuits 705*a* and 705*b* used for charging the battery 703 are not limited to those shown in FIG. 7. Here, an example is shown, in which linear antennas including different lengths (dipole antennas) are provided as antennas of the second antenna circuits 705*a* and 705*b*. Alternatively, for example, a combination of a dipole antenna and a coiled antenna or a combination of a dipole antenna and a patch antenna may be used. Thus, a plurality of antennas including different lengths and shapes are provided as antennas used for charging the battery 703, whereby radio signals of various wavelengths can be received. Accordingly, charging efficiency can be improved. In particular, when a combination of antennas including different shapes such as a patch antenna and a dipole antenna is provided (for example, a folded-dipole antenna is provided around a patch antenna), it becomes possible to utilize a limited space effectively. It is needless to say that although an example is shown, in which the RFID described in this embodiment mode is provided with the plurality of second antenna circuits 705*a* and 705*b*, the present invention is not limited to this. Instead, a structure in which one antenna circuit is provided or a structure in which three or more antenna circuits are provided may be employed.

Further, the first antenna circuit 704 used for transmitting/receiving a signal to/from the reader/writer 706 is not limited to have a structure shown in FIG. 7. As described above, antennas including various lengths and shapes can be used depending on a transmission method to be applied.

For example, as for the frequency of a signal transmitted/received between the first antenna circuit 704 and the reader/writer 706, 125 KHz, 13.56 MHz, 915 MHz, 2.45 GHz, and the like are given, and each of which is prescribed by the ISO standard. Needless to say, the frequency of a signal transmitted/received between the first antenna circuit 704 and the reader/writer 706 is not limited to them, and any of the following may be employed: a submillimeter wave of 300 GHz to 3 THz; a millimeter wave of 30 GHz to 300 GHz; a microwave of 3 GHz to 30 GHz; an ultrashort wave of 300 MHz to 3 GHz; a very short wave of 30 MHz to 300 MHz; a short wave of 3 MHz to 30 MHz; a medium wave of 300 KHz to 3 MHz; a long wave of 30 KHz to 300 KHz; and a very long wave of 3 KHz to 30 KHz. Further, a signal transmitted/received between the first antenna circuit 704 and the reader/writer 706 is a signal obtained by modulating a carrier wave. A carrier wave may be modulated by either analog modulation or digital modulation, and any of amplitude modulation, phase modulation, frequency modulation, and spread spectrum modulation may be employed. Desirably, amplitude modulation or frequency modulation is employed.

Note that although an example is shown in FIG. 7, in which the first antenna circuit 704, the plurality of second antenna circuits 705*a* and 705*b*, the chip 702 including the first signal processing circuit and the second signal processing circuit, and the battery 703 are provided over a substrate 701, the RFID described in this embodiment mode is not limited to have the structure shown in FIG. 7.

Figure 8:
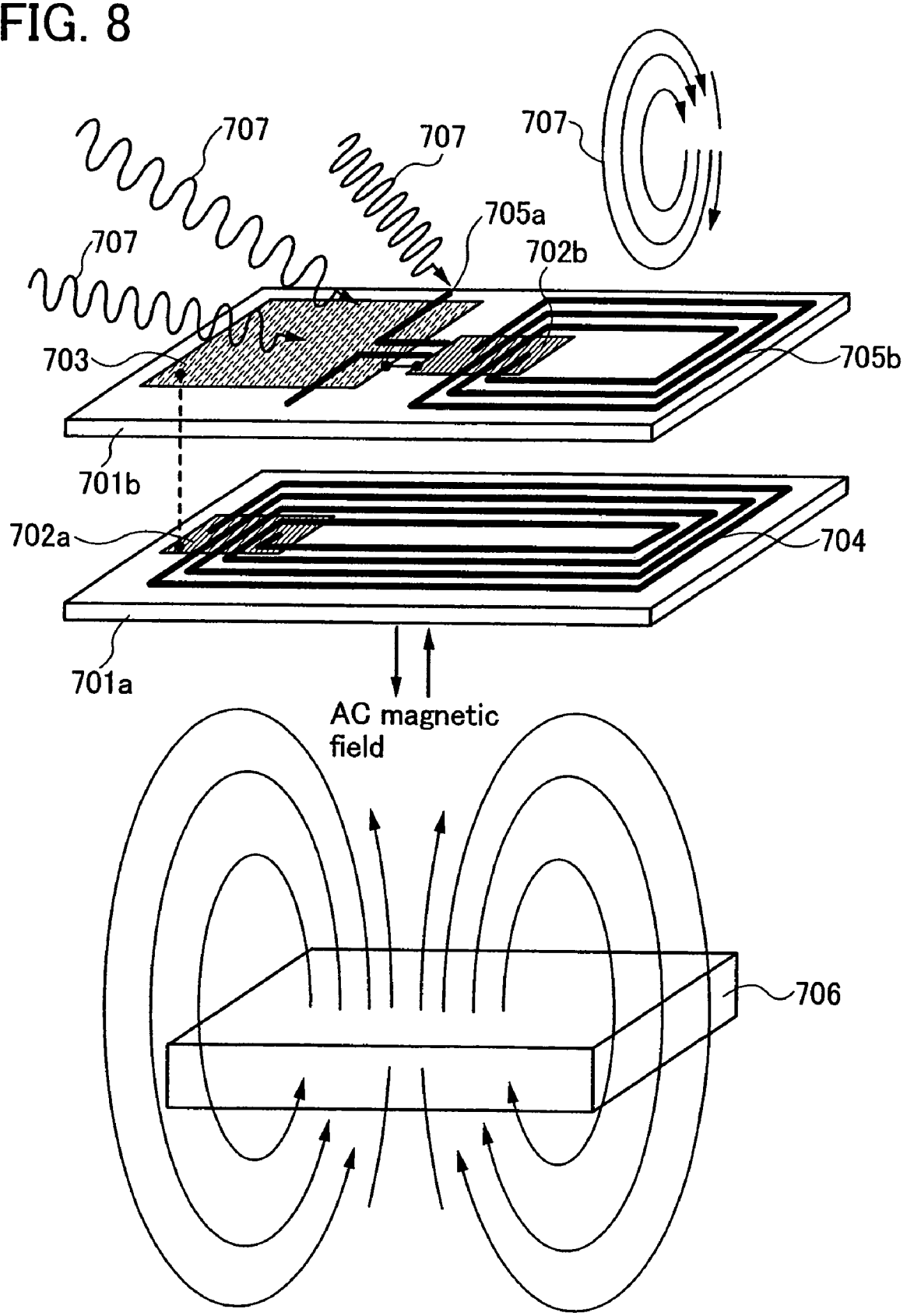
FIG. 8 is a view showing a structure example of a semiconductor device of the present invention.

For example, as shown in FIG. 8, a structure may be employed, in which a substrate 701*a* provided with a chip 702*a* and the first antenna circuit 704 and a substrate 701*b* provided with a chip 702*b*, the plurality of second antenna circuits 705*a* and 705*b*, and the battery 703 are overlapped with each other. The chip 702*a* is provided with the first signal processing circuit, and the chip 702*b* is provided with the second signal processing circuit.

In FIG. 8, a radio wave received by the first antenna circuit 704 is inputted to a power source circuit through a first rectifier circuit in the first signal processing circuit provided in the chip 702*a* to generate power at the same time as a signal included in a radio wave is extracted by a demodulation circuit or the like. A radio wave received by the second antenna circuits 705*a* and 705*b* is inputted to the battery 703 through a second rectifier circuit in the second signal processing circuit provided in the chip 702*b*.

The first antenna circuit 704 is operationally connected to the first signal processing circuit provided in the chip 702a. The second antenna circuits 705a and 705b are operationally connected to the second signal processing circuit provided in the chip 702b. The battery 703 is provided so as to be electrically operationally connected to the first signal processing circuit provided in the chip 702a and the second signal processing circuit provided in the chip 702b.

There is no limitation on the connection of the battery 703 and the first signal processing circuit or the second signal processing circuit. For example, the battery 703 can be operationally connected to the first signal processing circuit or the second signal processing circuit by wire bonding connection or bump connection. Alternatively, the first signal processing circuit or the second signal processing circuit may be attached to a connecting terminal with the battery 703 with a part of the first signal processing circuit or the second signal processing circuit functioning as an electrode, in this case, by using an anisotropically conductive film or the like.

Thus, after a chip and an antenna that are used for transmitting/receiving a signal to/from a reader/writer and a chip and an antenna that are used for charging a battery are separately formed over different substrates, the substrates are attached to each other, whereby the antenna and the battery can be formed to have a larger shape.

The battery 703 in FIGS. 7 and 8 can be provided at the same time as the first signal processing circuit or the second signal processing circuit. For example, a lithium ion secondary battery that is thinned to have a thickness of approximately 10 μm to 100 μm may be formed at the same time as the first signal processing circuit or the second signal processing circuit. Alternatively, a thin film capacitor is formed at the same time as the first signal processing circuit or the second signal processing circuit, which may be the battery 703. In FIGS. 7 and 8, the battery 703 is provided so as to be overlapped with the second antenna circuit 705a. Alternatively, the battery 703 may be provided so as to be overlapped with the first antenna circuit 704 (FIG. 9A), or so as not to be overlapped with any of the first antenna circuit 704 and the second antenna circuits 705a and 705b.

Figure 9A:
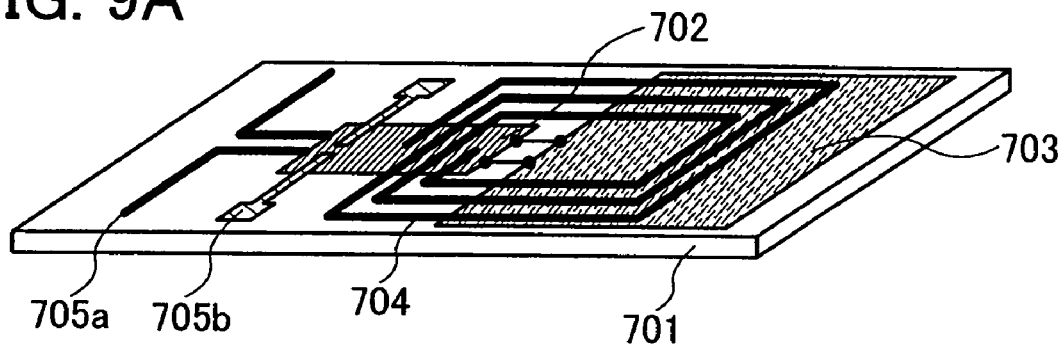
FIGS. 9A to 9C are views each showing a structure example of a semiconductor device of the present invention.
Figure 9B:
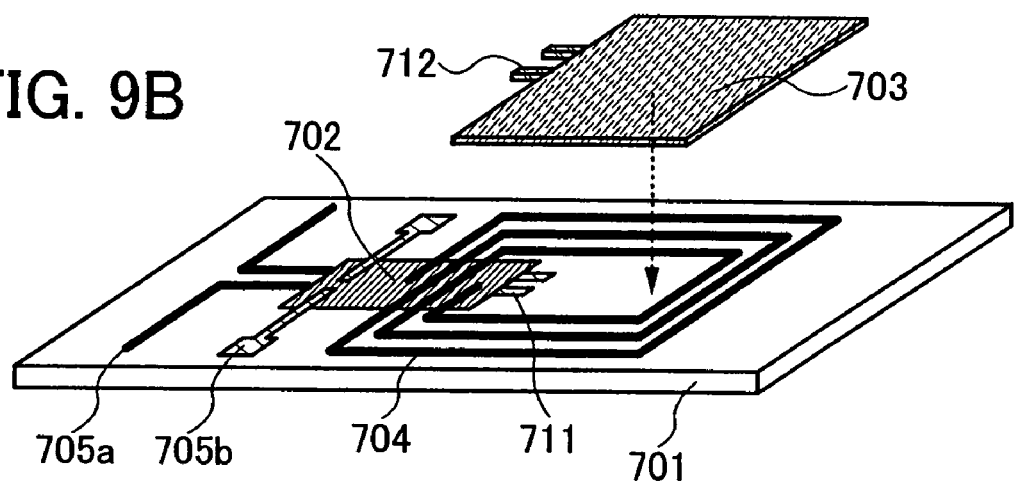
Figure 9C:
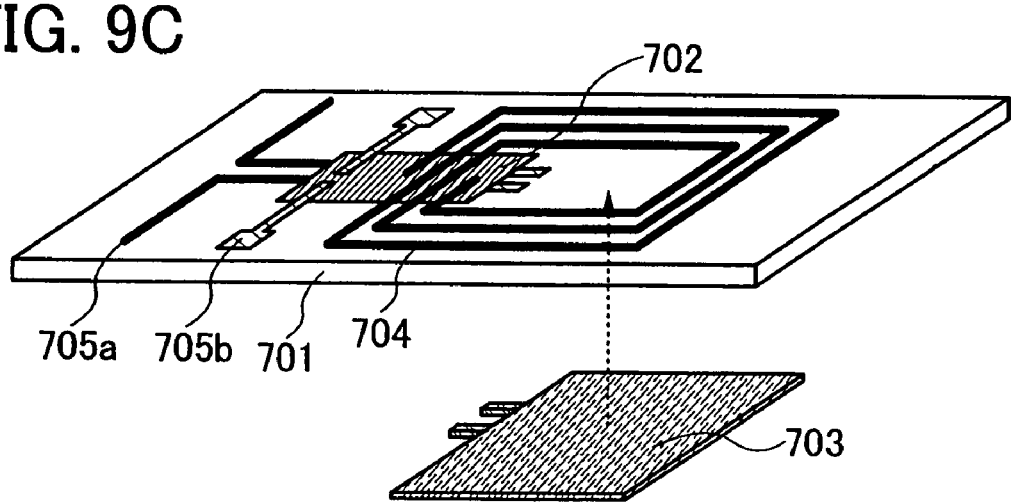

Alternatively, the battery 703 and the first signal processing circuit or the second signal processing circuit may be attached to be connected to each other. For example, as shown in FIGS. 9A and 9B, the battery 703 is attached to the chip 702 in which the first signal processing circuit and the second signal processing circuit are formed. In this case, the battery 703 can be attached to a front side (a side over which the chip 702 is formed) or a back side of a substrate so that the first signal processing circuit and the second signal processing circuit that are included in the chip 702 are electrically connected to the battery 703. For example, a connecting terminal 711 such as a bump electrically connected to the chip 702 is provided so as to be electrically connected to a connecting terminal 712 of the battery. An anisotropically conductive film or the like can be used for attachment.

Figure 10A:
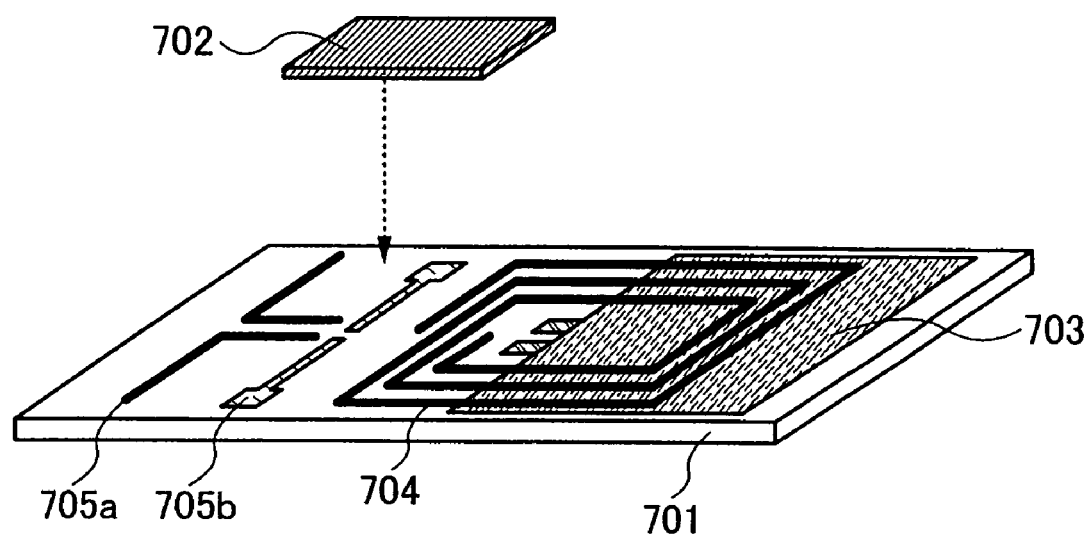
FIGS. 10A and 10B are views each showing a structure example of a semiconductor device of the present invention.
Figure 10B:
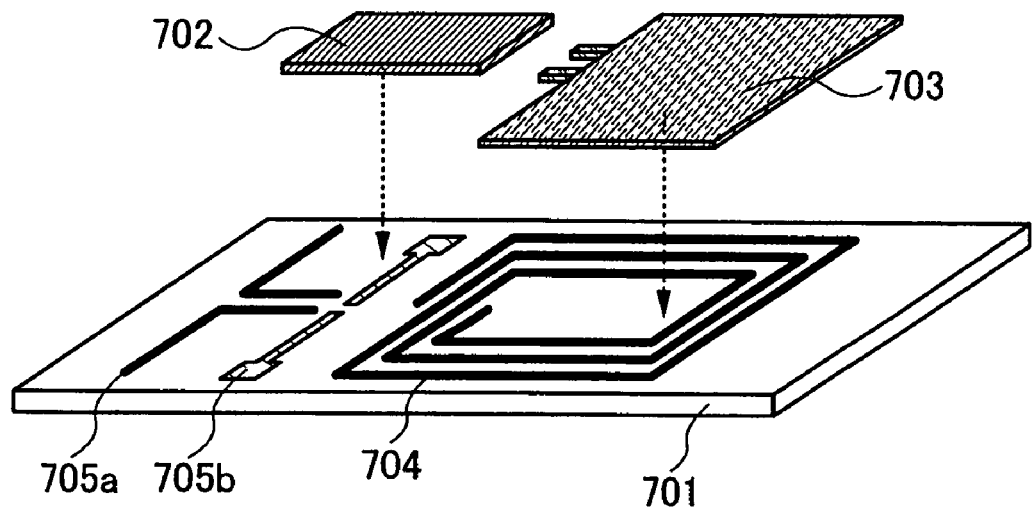

The chip 702 including the first signal processing circuit and the second signal processing circuit may be attached to the substrate over which the first antenna circuit 704, the second antenna circuits 705a and 705b, and the battery 703 are provided (FIG. 10A). Alternatively, the battery 703 and the chip 702 including the first signal processing circuit and the second signal processing circuit may be attached to the substrate over which the first antenna circuit 704, and the second antenna circuits 705a and 705b are provided (FIG. 10B). In this case, attachment is conducted so that the battery 703 is electrically operationally connected to the first signal processing circuit and the second signal processing circuit that are included in the chip 702; the first signal processing circuit is electrically connected to the first antenna circuit 704; and the second signal processing circuit is electrically connected to the second antenna circuits 705a and 705b. As described above, attachment is conducted by providing a connecting terminal such as a bump electrically connected to the chip 702, the battery 703, the first antenna circuit 704, or the second antenna circuits 705a and 705b so as to be electrically connected.

After a chip, an antenna, and a battery are separately provided in this manner, they can be combined; therefore, productivity can be improved.

As described above, a semiconductor device including an RFID of the present invention has a battery; therefore, it can be prevented that power for transmitting/receiving individual information gets low in accordance with deterioration over time of a battery. In addition, a semiconductor device of the present invention has an antenna which receives a signal for supplying power to a battery. Therefore, the semiconductor device can charge the battery by utilizing an external electromagnetic wave as a power source for driving the semiconductor device without being directly connected to a charger. Thus, it becomes possible to continue to use the semiconductor device without a check of remaining capacity of a battery or a change of the battery, which is necessary in the case of an active RFID. In addition, power for driving the RFID is always held in the battery, whereby power enough for operation of the RFID can be obtained and communication distance with the reader/writer can be extended.

Note that this embodiment mode can be implemented in combination with any of the other embodiment modes in this specification.

Embodiment Mode 2

In this embodiment mode, description is made of a structure in which a booster antenna circuit (hereinafter referred to as a booster antenna) is provided in the semiconductor device including the RFID described in Embodiment Mode 1, with reference to drawings. Note that in drawings used in this embodiment mode, common portions to those in Embodiment Mode 1 are denoted by the same reference numerals in some cases.

A booster antenna described in this embodiment mode has a larger size than an antenna for receiving a signal from a reader/writer and outputting data to a signal processing circuit (hereinafter referred to as a first chip antenna or a first antenna circuit) and an antenna for receiving a radio signal to charge a battery (hereinafter referred to as a second chip antenna or a second antenna circuit) in a semiconductor device. A booster antenna can transmit/receive a signal to/from a reader/writer or receive a radio signal efficiently by being resonated in a frequency band in which the booster antenna is used, and being magnetic-field coupled with the first chip antenna or the second chip antenna. In addition, the booster antenna has an advantage in that it is not required to be directly connected to the chip antenna and the signal processing circuit since it is coupled with the first chip antenna or the second chip antenna through a magnetic field.

Figure 12:
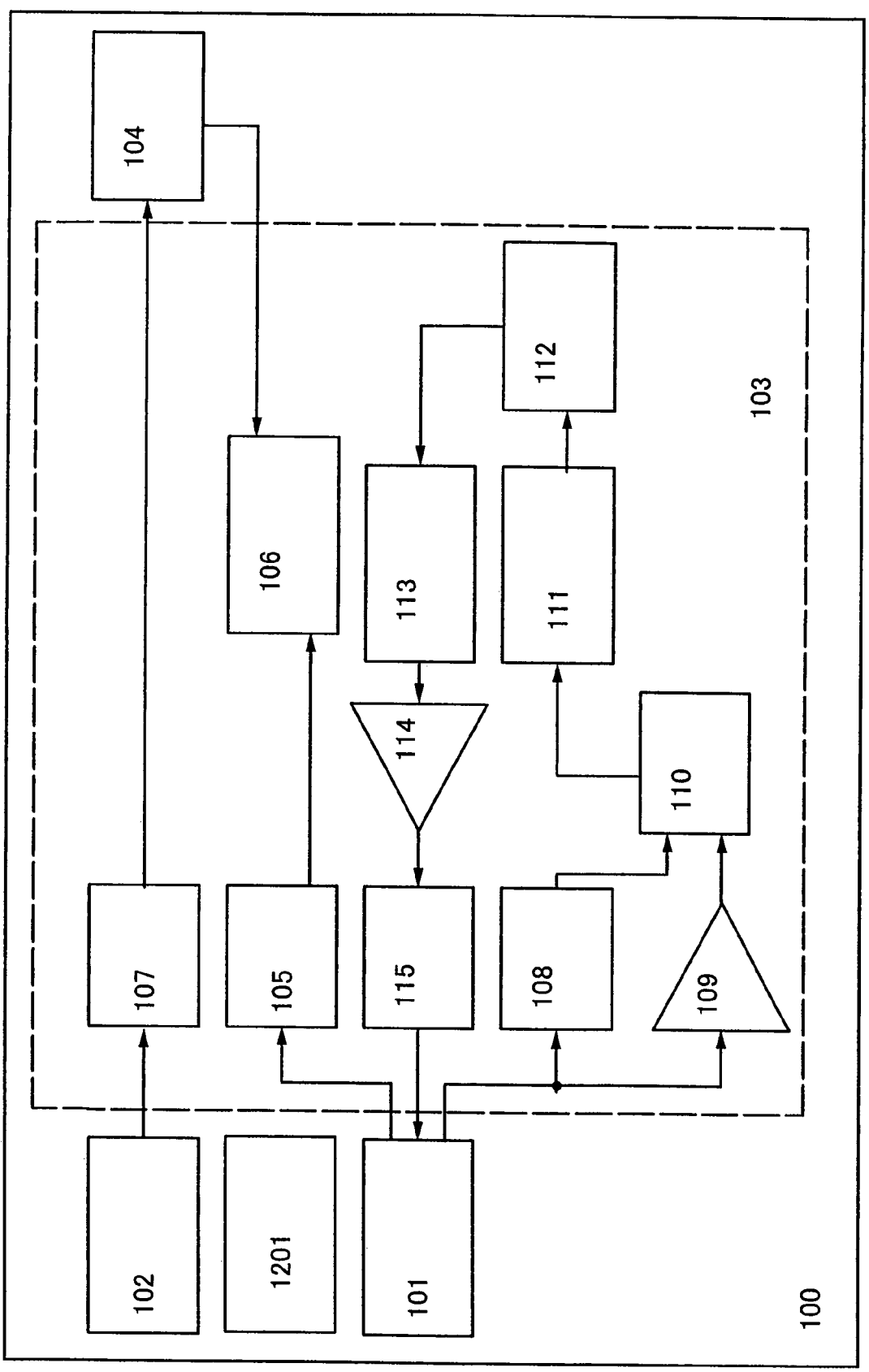
FIG. 12 is a diagram showing a structure example of a semiconductor device of the present invention.
Figure 13:
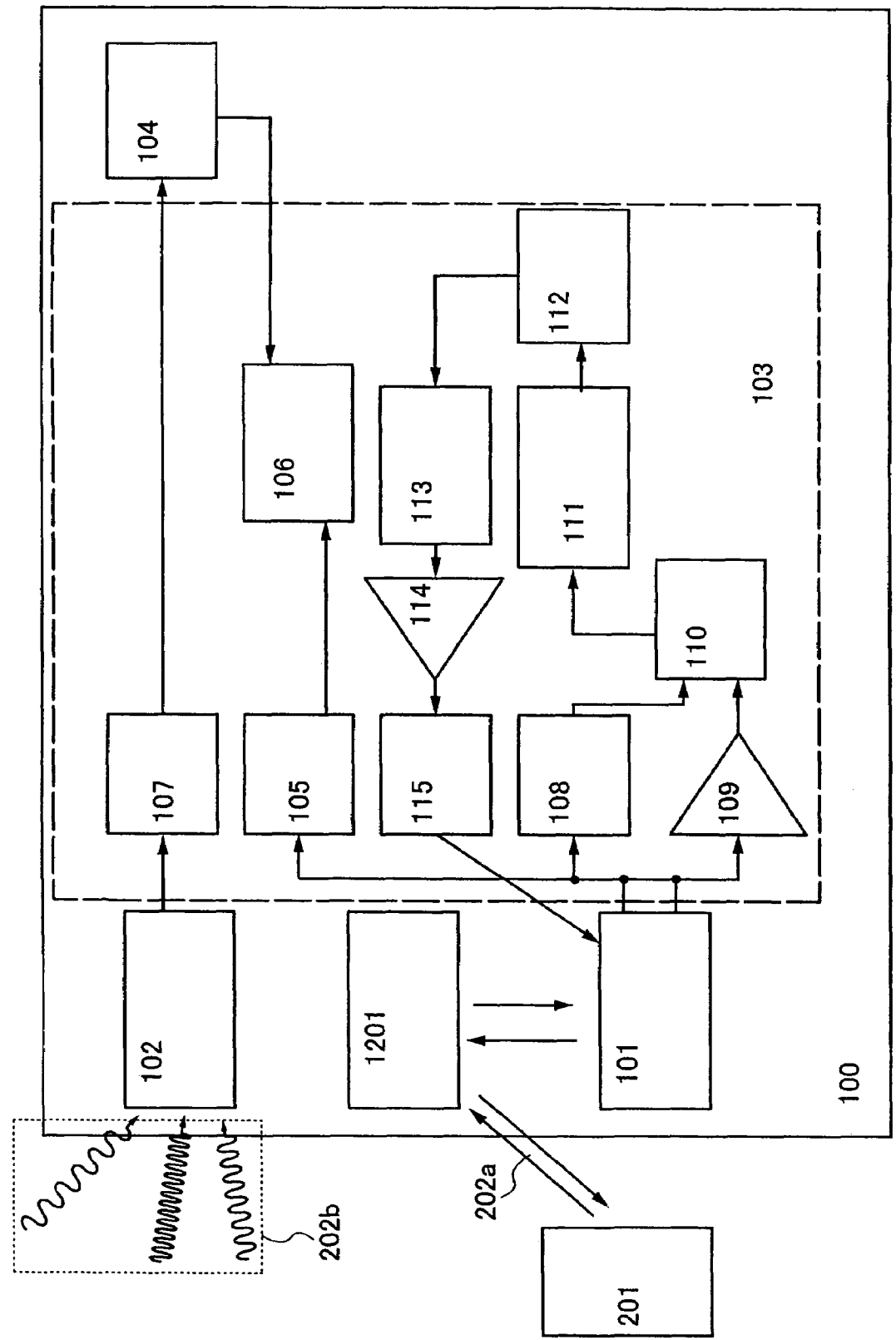
FIG. 13 is a diagram showing a structure example of a semiconductor device of the present invention.

Description is made of a semiconductor device used for an RFID in this embodiment mode with reference to block diagrams shown in FIGS. 12 and 13.

The RFID 100 shown in FIG. 12 includes the first antenna circuit 101, the second antenna circuit 102, a booster antenna 1201, the signal processing circuit 103, and the battery 104. The signal processing circuit 103 includes the first rectifier circuit 105, the power source circuit 106, the second rectifier circuit 107, the demodulation circuit 108, the amplifier 109, the logic circuit 110, the memory control circuit 111, the memory circuit 112, the logic circuit 113, the amplifier 114, and the modulation circuit 115.

FIG. 13 shows a case where the first antenna circuit 101 transmits/receives a signal to/from the reader/writer 201 through the booster antenna 1201, and the second antenna circuit 102 receives an external radio signal. In FIG. 13, the booster antenna 1201 receives a signal from the reader/writer 201, and the signal transmitted from the reader/writer 201 is inputted to the power source circuit 106 through the first rectifier circuit 105, and to the demodulation circuit 108 and the amplifier 109 due to magnetic field coupling with the first antenna circuit 101. Further, in FIG. 13, a signal received by the second antenna circuit 102 is inputted to the battery 104 through the second rectifier circuit 107, and power is appropriately supplied from the battery 104 to the power source circuit 106. With a structure shown in FIG. 13, communication distance of transmission/reception between the reader/writer 201 and the RFID 100 can be extended; therefore, data can be further reliably transmitted/received.

The booster antenna 1201 can be magnetic-field coupled with another antenna instead of the first antenna circuit 101 by varying frequency bands in which the booster antenna 1201 is tuned.

Figure 14:
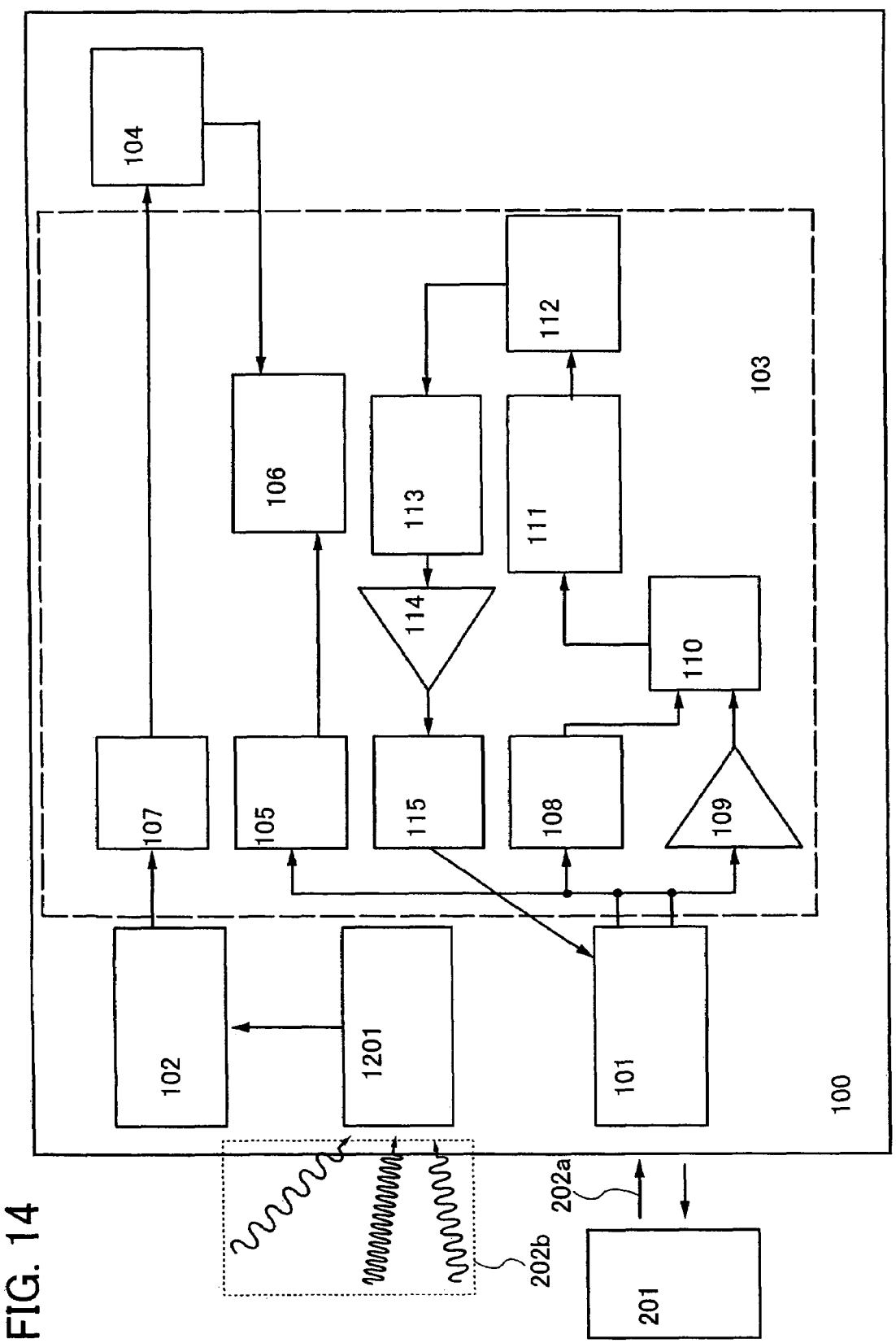
FIG. 14 is a diagram showing a structure example of a semiconductor device of the present invention.

For example, FIG. 14 shows a case where the second antenna circuit 102 receives an external radio signal through the booster antenna 1201, and the first antenna circuit 102 transmits/receives information to/from the reader/writer 201. In FIG. 14, the booster antenna 1201 receives an external radio signal 202b, and a radio signal 202a is charged as power to the battery 104 through the second rectifier circuit 107 due to magnetic field coupling with the second antenna circuit 102. Then, power is supplied from the battery 104 to the power source circuit 106. A signal received by the first antenna circuit 101 is inputted to the power source circuit 106 through the first rectifier circuit 105, and to the demodulation circuit 108 and the amplifier 109. With a structure shown in FIG. 14, the RFID 100 can receive the radio signal 202 easily; therefore, the battery 104 can be further reliably charged.

Further, by providing a plurality of booster antennas 1201, the booster antenna 1201 can be magnetic-field coupled to the first antenna circuit 101 and the second antenna circuit 102.

Figure 15:
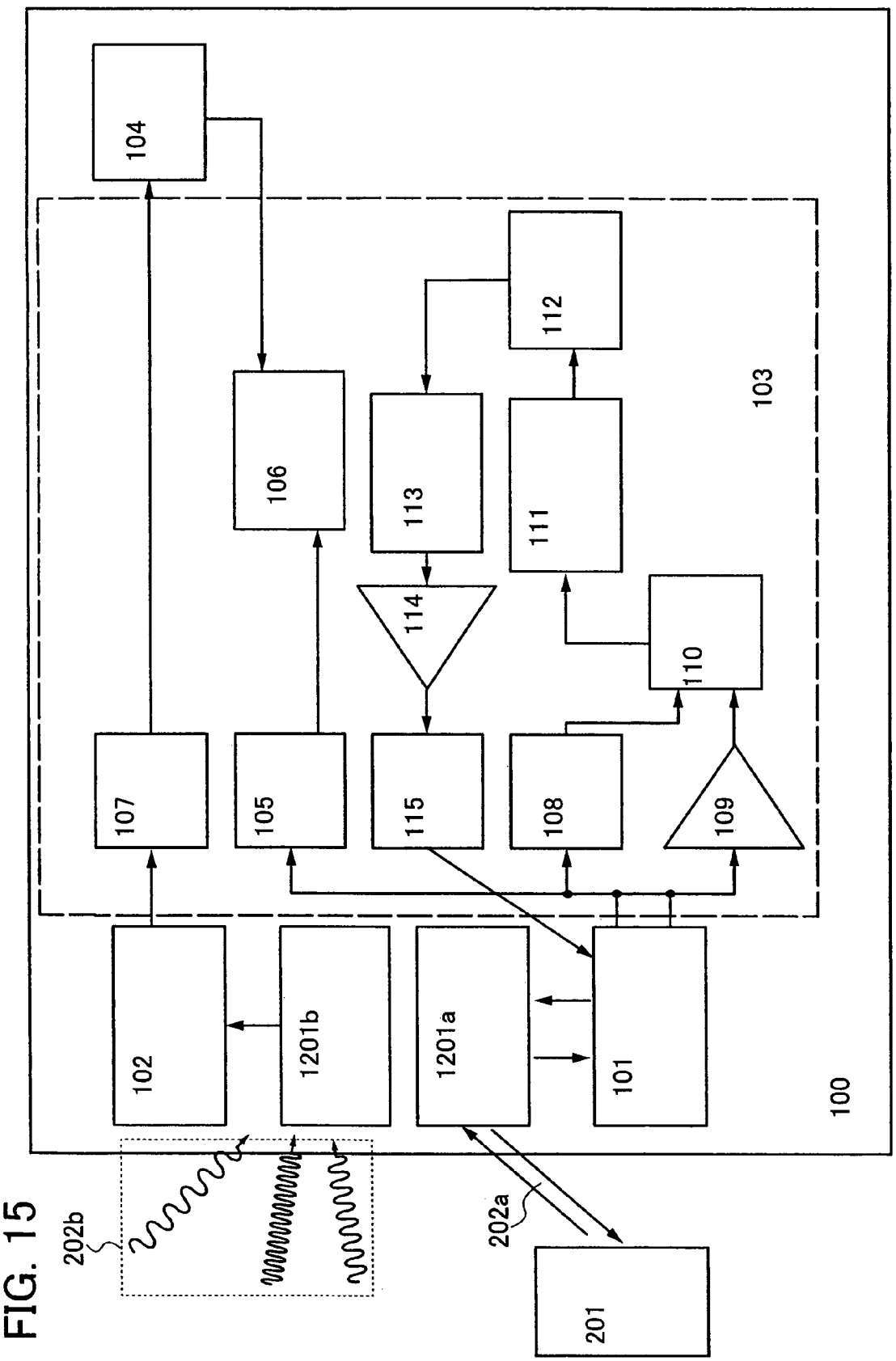
FIG. 15 is a diagram showing a structure example of a semiconductor device of the present invention.

For example, FIG. 15 shows a case where the first antenna circuit 101 transmits/receives a signal to/from the reader/writer 201 through a booster antenna 1201a, and the second antenna circuit 102 receives an external radio signal through the booster antenna 1201b. The booster antenna 1201a receives a signal from the reader/writer 201, and the signal transmitted from the reader/writer 201 is inputted to the power source circuit 106 through the first rectifier circuit 105, and to the demodulation circuit 108 and the amplifier 109 due to magnetic field coupling with the first antenna circuit 101. Further, the booster antenna 1201b receives the external radio signal 202b, and the radio signal 202a is charged as power to the battery 104 through the second rectifier circuit 107 due to magnetic field coupling with the second antenna circuit 102.

The first rectifier circuit 105 and the second rectifier circuit 107 in FIGS. 12 to 15 have similar structures described in Embodiment Mode 1. As shown in FIG. 4B, the rectifier circuit 407 may be formed of the diode 404, the diode 405, and the smoothing capacitor 406.

Shapes of antennas of the first antenna circuit 101, the second antenna circuit 102, and the booster antenna are not particularly limited. For example, an antenna including a shape of FIGS. 3A to 3E described in Embodiment Mode 1 can be employed. It is to be noted that an antenna including a larger shape than that of an antenna circuit to be magnetic-field coupled is preferably employed as the booster antenna due to its function. As shown in FIG. 4A described in Embodiment Mode 1, each of the first antenna circuit 101, the second antenna circuit 102, and the booster antenna is formed of the antenna 401 and the resonant capacitor 402. A combination of the antenna 401 and the resonant capacitor 402 corresponds to the antenna circuit 403.

The first antenna circuit 101 and the second antenna circuit 102 may be stacked over a substrate same as the signal processing circuit 103 over one substrate, or may be provided as external antennas.

Figure 16:
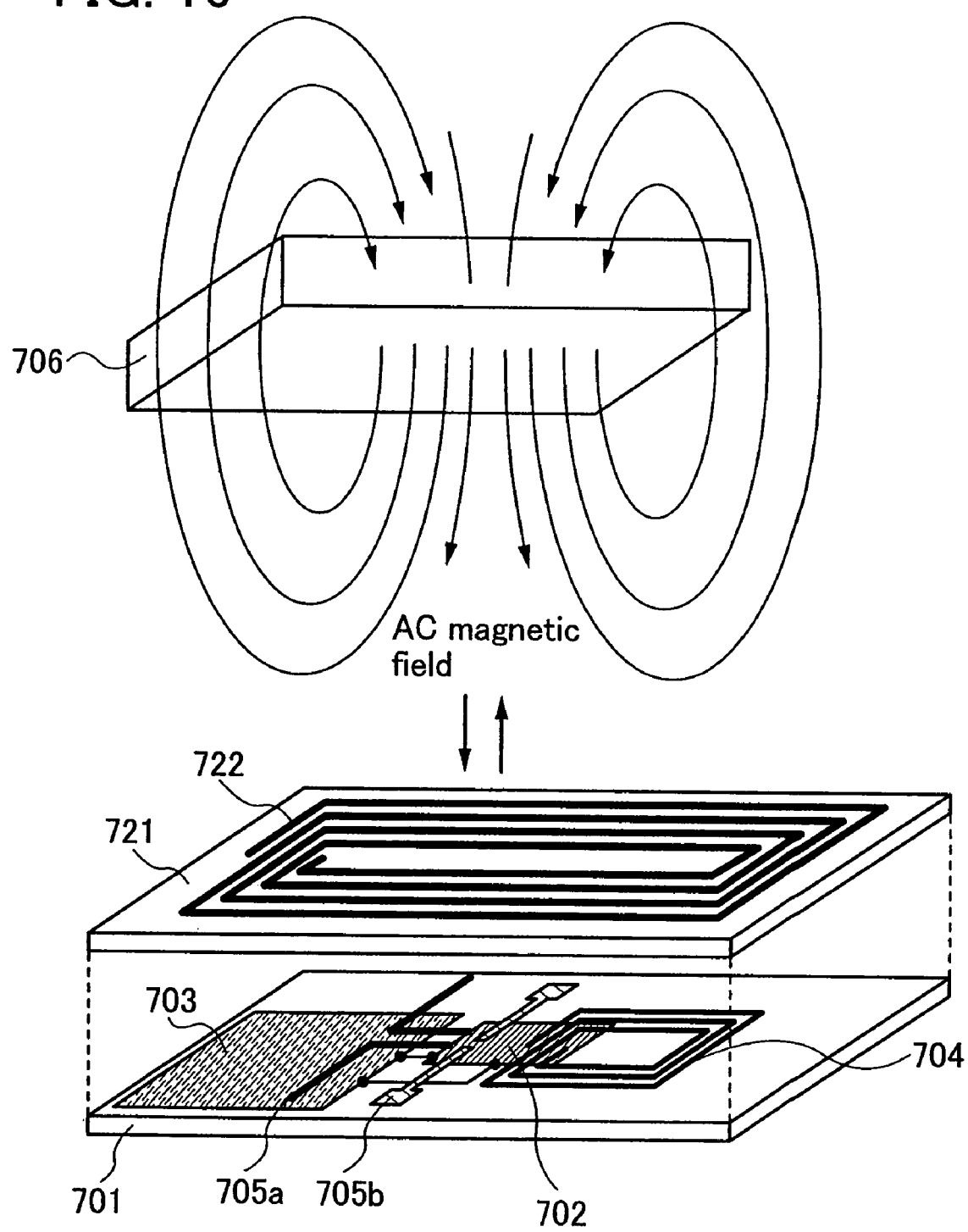
FIG. 16 is a view showing a structure example of a semiconductor device of the present invention.

For example, FIG. 16 shows position of the first antenna circuit, the second antenna circuit, and the booster antenna, and a shape of the antenna in the semiconductor device including an RFID of a structure in FIG. 13. In FIG. 16, the first antenna circuit 704 including a coil shape and the plurality of second antenna circuits 705a and 705b are provided over the substrate 701, a booster antenna 722 is provided over a substrate 721, and the substrate 701 is attached to the substrate 721.

In FIG. 16, when the reader/writer 706 and the booster antenna 722 are brought closer to each other, an AC magnetic field generated from the reader/writer 706 passes through the coiled booster antenna 722, and an electromotive force is generated between terminals (between one end and the other end of the antenna) of the coiled booster antenna 722 by electromagnetic induction. In the coiled booster antenna 722, an electromotive force is generated by electromagnetic induction, and an AC magnetic field is generated from the booster antenna 722 itself. Then, the AC magnetic field generated from the booster antenna 722 passes through the coiled first antenna circuit 704, and an electromotive force is generated between terminals (between one end and the other end of the antenna) of the first antenna circuit 704 by electromagnetic induction. Data is transmitted/received between the reader/writer 706 and the first antenna circuit 704 by the electromotive force.

Figure 17:
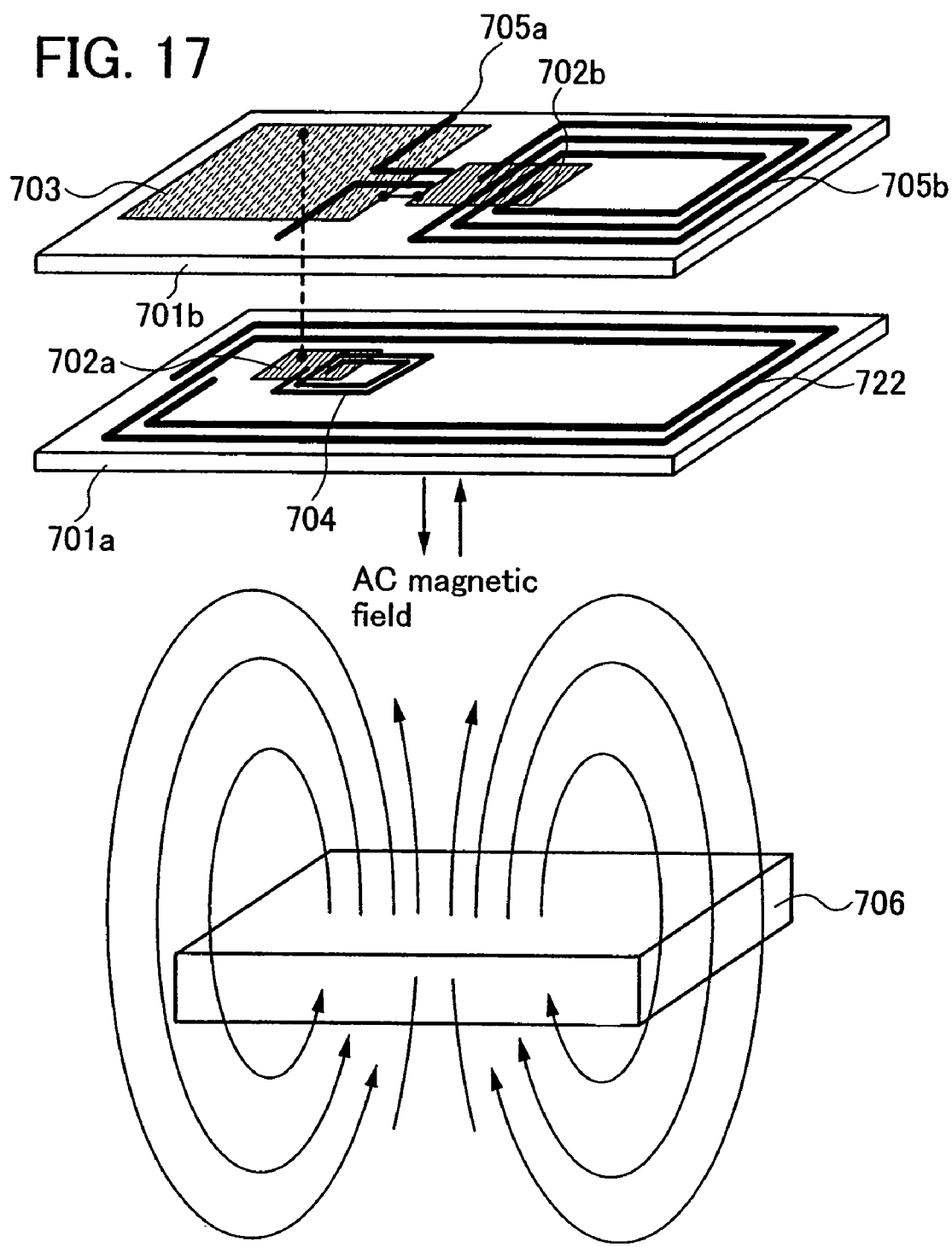
FIG. 17 is a view showing a structure example of a semiconductor device of the present invention.

FIG. 17 shows a different structure from that of FIG. 16.

FIG. 17 shows a structure in which the substrate 701a provided with the first antenna circuit 704 and the chip 702a including the first signal processing circuit; and the substrate 701b provided with the battery 703, the plurality of second antenna circuits 705a and 705b, and the chip 702b including the second signal processing circuit are overlapped with each other.

In FIG. 17, when the reader/writer 706 and a booster antenna 722 are brought closer to each other, an AC magnetic field generated from the reader/writer 706 passes through the coiled booster antenna 722, and an electromotive force is generated between terminals (between one end and the other end of the antenna) of the coiled booster antenna 722 by electromagnetic induction. In the coiled booster antenna 722, an electromotive force is generated by electromagnetic induction, and the AC magnetic field is generated from the booster antenna 722 itself. Then, the AC magnetic field generated from the booster antenna 722 passes through the coiled first antenna circuit 704, and an electromotive force is generated between terminals (between one end and the other end of the antenna) of the first antenna circuit 704 by electromagnetic induction. Data is transmitted/received between the reader/writer 706 and the first antenna circuit 704 by the electromotive force.

Figure 18:
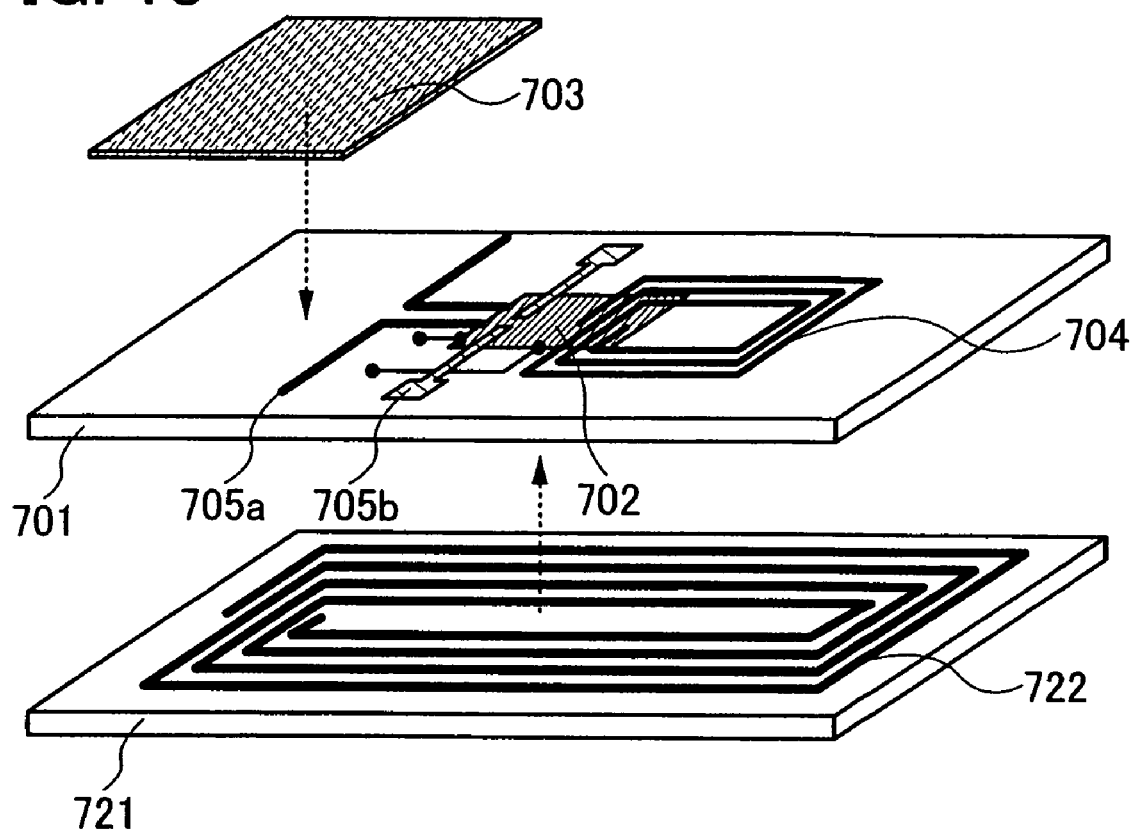
FIG. 18 is a view showing a structure example of a semiconductor device of the present invention.

The semiconductor device described in this embodiment mode may be provided by being attached with the battery 703 and the booster antenna 722. For example, as shown in FIG. 18, the substrate 701 provided with the first antenna circuit 704, the second antenna circuits 705a and 705b, and the chip 702 including the first signal processing circuit and the second signal processing circuit; and the substrate 721 provided with the battery 703 and the booster antenna 722 are attached to each other. In this case, an example is shown, in which the battery 703 is attached to a front side of the substrate 701 (a side over which the chip 702 is formed), and the substrate 721 provided with the booster antenna 722 is attached to a back side of the substrate 701.

Thus, after a chip and an antenna that are used for transmitting/receiving a signal to/from a reader/writer and a chip and an antenna that are used for charging a battery are separately formed over different substrates, the substrates are attached to each other, whereby the antenna and the battery can be formed to have a larger shape.

A layout design of the first antenna circuit, the second antenna circuit, and the booster antenna in this embodiment mode is allowed as long as the antennas are provided so that an AC magnetic field passes through each of antenna coils. As shown in FIG. 17, the first antenna circuit or the second antenna circuit is provided on the inside of the booster antenna with a large area, whereby an efficient layout can be achieved. Therefore, since a battery or the like can make up a large area, and coils of the antenna can be increased, the layout is preferable.

As described above, a semiconductor device including an RFID of the present invention has a battery; therefore, it can be prevented that power for transmitting/receiving individual information gets low in accordance with deterioration over time of a battery. In addition, a semiconductor device of the present invention has an antenna which receives a signal for supplying power to a battery. Therefore, the semiconductor device can charge the battery by utilizing power of an external electromagnetic wave as a power source for driving the semiconductor device without being directly connected to a charger. Thus, it becomes possible to continue to use the semiconductor device without a check of remaining capacity of a battery or a change of the battery, which is necessary in the case of an active RFID. In addition, power for driving the RFID is always held in the battery, whereby power enough for the RFID to communicate can be obtained and communication distance with the reader/writer can be extended.

The structure of this embodiment mode includes a booster antenna in addition to elements of the structure of Embodiment mode 1. Therefore, data can be further reliably transmitted/received between an RFID and a reader/writer, and the RFID can further reliably receive an external radio signal.

Note that this embodiment mode can be implemented in combination with any of the other embodiment modes in this specification.

Embodiment Mode 3

In this embodiment mode, description is made of an example of a manufacturing method of the semiconductor device described in the aforementioned embodiment mode with reference to drawings.

First, as shown in FIG. 19A, a peeling layer 1903 is formed over one side of the substrate 1901 with an insulating film 1902 interposed therebetween. Subsequently, an insulating film 1904 that functions as base film and a semiconductor film 1905 (for example, a film containing amorphous silicon) are stacked. Note that the insulating film 1902, the peeling layer 1903, the insulating film 1904, and the semiconductor film 1905 can be sequentially formed.

As the substrate 1901, a glass substrate, a quartz substrate, a metal substrate (such as a ceramic substrate or a stainless steel substrate), or a semiconductor substrate such as a Si substrate can be used. Alternatively, a substrate formed of polyethylene terephthalate (PET), polyethylene naphthalate (PNT), polyether sulfone (PES), acrylic, or the like can be used as a plastic substrate. Note that in this step, the peeling layer 1903 is provided all over the substrate 1901 with the insulating film 1902 interposed therebetween; however, the peeling layer 1903 may be selectively provided by a photolithography method if required after provision of the peeling layer all over the substrate 1901.

The insulating films 1902 and 1904 are each formed of an insulating material such as silicon oxide, silicon nitride, silicon oxynitride ($SiO_xN_y$, $x>y>0$), or silicon nitride oxide ($SiN_xO_y$, $x>y>0$), by a CVD method, a spattering method, or the like. For example, in a case where the insulating films 1902 and 1904 each have a two-layer structure, a silicon nitride oxide film may be formed as a first insulating film and a silicon oxynitride film may be formed as a second insulating film. Alternatively, a silicon nitride film may be formed as the first insulating film and a silicon oxide film may be formed as the second insulating film. The insulating film 1902 functions as a blocking layer for preventing an impurity element in the substrate 1901 from being mixed into the peeling layer 1903 or an element formed thereover. The insulating film 1904 functions as a blocking layer for preventing an impurity element in the substrate 1901 and the peeling layer 1903 from being mixed into an element formed over the substrate 1901 and the peeling layer 1903. By forming the insulating films 1902 and 1904 each functioning as a blocking layer in this manner, it is possible to prevent alkaline earth metal or alkali metal such as Na in the substrate 1901 and an impurity element included in the peeling layer 1903 from adversely affecting an element to be formed over the substrate 1901 and the peeling layer 1903. In a case of using quartz for the substrate 1901, the insulating films 1902 and 1904 may be omitted.

As the peeling layer 1903, a metal film, a stacked layer structure of a metal film and a metal oxide film, or the like can be used. The metal film is formed as a single layer or stacked layers of a film formed of an element selected from tungsten (W), molybdenum (Mo), titanium (Ti), tantalum (Ta), niobium (Nb), nickel (Ni), cobalt (Co), zirconium (Zr), zinc (Zn), ruthenium (Ru), rhodium (Rh), palladium (Pd), osmium (Os), and iridium (Ir), or an alloy material or a compound material including the above-described element as its main component. The metal film can be formed by a sputtering method, various CVD methods such as a plasma CVD method, or the like. As the stacked layer structure of a metal film and a metal oxide film, after the above-described metal film is formed, an oxide or oxynitride of the metal film can be formed on the metal film surface by performing plasma treatment in an oxygen atmosphere or an $N_2O$ atmosphere, or heat treatment in an oxygen atmosphere or an $N_2O$ atmosphere. For example, in a case where a tungsten film is formed by a sputtering method, a CVD method, or the like as the metal film, a metal oxide film of tungsten oxide can be formed on the tungsten film surface by performing plasma treatment on the tungsten film. In this case, an oxide of tungsten is expressed by $WO_x$, and x is 2 to 3. There are cases of x=2 ($WO_2$), x=2.5 ($W_2O_5$), x=2.75 ($W_4O_{11}$), x=3 ($WO_3$), and the like. When forming an oxide of tungsten, the value of x described above is not particularly restricted, and which oxide is to be formed may be decided based on an etching rate or the like. Alternatively, for example, a metal film (such as tungsten) is formed and then an insulating film of silicon oxide ($SiO_2$) or the like is formed over the metal film by a sputtering method, and a metal oxide may be formed over the metal film (for example, tungsten oxide over tungsten). Further, as plasma treatment, the above-described high-density plasma treatment may be performed, for example. Instead of the metal oxide film, a metal nitride or a metal oxynitride may be used. In this case, the metal film may be subjected to the plasma treatment or the heat treatment in a nitrogen atmosphere or an atmosphere of nitrogen and oxygen.

The semiconductor film 1905 is formed with a thickness of 25 to 200 nm (preferably 30 to 150 nm) by a sputtering method, an LPCVD method, a plasma CVD method, or the like.

Next, as shown in FIG. 19B, the semiconductor film 1905 is crystallized by being irradiated with laser light. Note that the amorphous semiconductor film 1905 may be crystallized by a method in which a laser irradiation method is combined with a thermal crystallization method using an RTA or an annealing furnace, or a thermal crystallization method using a metal element for promoting crystallization, or the like. After that, the obtained crystalline semiconductor film is etched so as to have a desired shape, thereby forming crystalline semiconductor films 1905a to 1905f. Then, a gate insulating film 1906 is formed so as to cover the crystalline semiconductor films 1905a to 1905f.

The insulating film 1906 is formed of an insulating material such as silicon oxide, silicon nitride, silicon oxynitride ($SiO_xN_y$, x>y>0), or silicon nitride oxide ($SiN_xO_y$, x>y>0), by a CVD method, a spattering method, or the like. For example, in a case where the gate insulating film 1906 has a two-layer structure, a silicon oxynitride film may be formed as a first insulating film and a silicon nitride oxide film may be formed as a second insulating film. Alternatively, a silicon oxide film may be formed as a first insulating film and a silicon nitride film may be formed as a second insulating film.

An example of a manufacturing step of the crystalline semiconductor films 1905a to 1905f is briefly described below. First, an amorphous semiconductor film with a thickness of 50 to 60 nm is formed by a plasma CVD method. Next, a solution containing nickel that is a metal element for promoting crystallization is retained on the amorphous semiconductor film, and dehydrogenation treatment (at 500° C., for one hour) and thermal crystallization treatment (at 550° C., for four hours) are performed on the amorphous semiconductor film, thereby forming a crystalline semiconductor film. After that, the crystalline semiconductor film is irradiated with laser light, and a photolithography method is used, so that the crystalline semiconductor films 1905a to 1905f are formed. Note that without being subjected to the thermal crystallization which uses the metal element for promoting crystallization, the amorphous semiconductor film may be crystallized only by laser light irradiation.

As a laser oscillator used for crystallization, a continuous wave laser beam (a CW laser beam) or a pulsed wave laser beam (a pulsed laser beam) can be used. As a laser beam which can be used here, a laser beam emitted from one or more of the following can be used: a gas laser such as an Ar laser, a Kr laser, or an excimer laser; a laser of which medium is single crystalline YAG $YVO_4$, forsterite ($Mg_2SiO_4$), $YAlO_3$, or $GdVO_4$, or polycrystalline (ceramic) YAG, $Y_2O_3$, $YVO_4$, $YAlO_3$, or $GdVO_4$, added with one or more of Nd, Yb, Cr, Ti, Ho, Er, Tm, and Ta as a dopant; a glass laser; a ruby laser; an alexandrite laser; a Ti:sapphire laser; a copper vapor laser; or a gold vapor laser. It is possible to obtain crystals with a large grain size when fundamental waves of such laser beams are second to fourth harmonics of the fundamental waves are used. For example, the second harmonic (532 nm) or the third harmonic (355 nm) of an Nd:$YVO_4$ laser (fundamental wave of 1064 nm) can be used. In this case, an power density of approximately 0.01 to 100 $MW/cm^2$ (preferably, 0.1 to 10 $MW/cm^2$) is required. Irradiation is conducted at a scanning rate of approximately 10 to 2000 cm/sec. It is to be noted that, a laser using, as a medium, single crystalline YAG $YVO_4$, forsterite ($Mg_2SiO_4$), $YAlO_3$, or $GdVO_4$, or polycrystalline (ceramic) YAG $Y_2O_3$, $YVO_4$, $YAlO_3$, or $GdVO_4$ added with one or more of Nd, Yb, Cr, Ti, Ho, Er, Tm, and Ta as a dopant; an Ar ion laser; or a Ti:sapphire laser can be continuously oscillated. Furthermore, pulse oscillation thereof can be performed at a repetition rate of 10 MHz or more by carrying out Q switch operation, mode locking, or the like. In a case where a laser beam is oscillated at a repetition rate of 10 MHz or more, after a semiconductor film is melted by a laser and before it is solidified, the semiconductor film is irradiated with a next pulse. Therefore, unlike a case of using a pulsed laser with a low repetition rate, a solid-liquid interface can be continuously moved in the semiconductor film, so that crystal grains which continuously grow in a scanning direction can be obtained.

Alternatively, the gate insulating film 1906 may be formed by performing the above-described high-density plasma treatment on the semiconductor films 1905a to 1905f to oxidize or nitride the surfaces. For example, the film is formed by plasma treatment introducing a mixed gas of a rare gas such as He, Ar, Kr, or Xe and oxygen, nitrogen oxide ($NO_2$), ammonia, nitrogen, hydrogen, or the like. When excitation of the plasma in this case is performed by introduction of a microwave, high-density plasma can be generated at a low electron temperature. By an oxygen radical (there is a case where an OH radical is included) or a nitrogen radical (there is a case where an NH radical is included) generated by this high-density plasma, the surface of the semiconductor film can be oxidized or nitrided.

By treatment using such high-density plasma, an insulating film with a thickness of 1 to 20 nm, typically 5 to 10 nm, is formed over the semiconductor film. Since the reaction of this case is a solid-phase reaction, interface state density between the insulating film and the semiconductor film can be extremely low. Since such high-density plasma treatment oxidizes (or nitrides) a semiconductor film (crystalline silicon, or polycrystalline silicon) directly, unevenness of a thickness of the insulating film to be formed can be extremely small, ideally. In addition, oxidation is not strengthened even in a crystal grain boundary of crystalline silicon, which makes a very preferable condition. That is, by a solid-phase oxidation of the surface of the semiconductor film by the high-density plasma treatment shown here, an insulating film with good uniformity and low interface state density can be formed without abnormal oxidation reaction in a crystal grain boundary.

As the gate insulating film 1906, an insulating film formed by the high-density plasma treatment may be used by itself, or an insulating film of silicon oxide, silicon oxynitride, silicon nitride, or the like may be formed thereover by a CVD method using plasma or thermal reaction, so as to make stacked layers. In any case, a transistor including an insulating film formed by high-density plasma, in a part of the gate insulating film or in the whole gate insulating film, can reduce variation in the characteristics.

Furthermore, a semiconductor film is irradiated with a continuous wave laser beam or a laser beam oscillated at a repetition rate of 10 MHz or more and is scanned in one direction for crystallization, so that the semiconductor films 1905a to 1905f which have a characteristic that the crystal grows in the scanning direction of the beam are obtained. When a transistor is placed so that the scanning direction is aligned with the channel length direction (the direction in which carriers flow when a channel formation region is formed) and the above-described gate insulating layer is used, a thin film transistor (TFT) with less characteristic variation and high electric-field effect mobility can be obtained.

Next, a first conductive film and a second conductive film are stacked over the gate insulating film 1906. Here, the first conductive film is formed with a thickness of 20 to 100 nm by a CVD method, a sputtering method, or the like, and the second conductive film is formed with a thickness of 100 to 400 nm. The first conductive film and the second conductive film are formed using an element selected from tantalum (Ta), tungsten (W), titanium (Ti), molybdenum (Mo), aluminum (Al), copper (Cu), chromium (Cr), niobium (Nb), and the like, or an alloy material or a compound material including the above-described element as its main component. Alternatively, they are formed using a semiconductor material typified by polycrystalline silicon doped with an impurity element such as phosphorus. As examples of a combination of the first conductive film and the second conductive film, a tantalum nitride film and a tungsten film, a tungsten nitride film and a tungsten film, a molybdenum nitride film and a molybdenum film, and the like can be given. Since tungsten and tantalum nitride have high heat resistance, heat treatment for thermal activation can be performed after the first conductive film and the second conductive film are formed. In addition, in a case of a three-layer structure instead of a two-layer structure, a stacked layer structure of a molybdenum film, an aluminum film, and a molybdenum film is preferably adopted.

Next, a resist mask is formed by a photolithography method, and etching treatment for forming a gate electrode and a gate line is performed, so that gate electrodes 1907 are formed above the semiconductor films 1905a to 1905f. Here, an example in which the gate electrode 1907 has a stacked layer structure of a first conductive film 1907a and a second conductive film 1907b is shown.

Next, as shown in FIG. 19C, with the use of the gate electrode 1907 as a mask, an impurity element imparting n-type conductivity is added to the semiconductor films 1905a to 1905f at a low concentration by an ion doping method or an ion implantation method, and then, a resist mask is selectively formed by a photolithography method and an impurity element imparting p-type conductivity is added at a high concentration. As an n-type impurity element, phosphorus (P), arsenic (As), or the like can be used. As a p-type impurity element, boron (B), aluminum (Al), gallium (Ga), or the like can be used. Here, phosphorus (P) is used for the impurity element imparting n-type conductivity, and is selectively introduced into the semiconductor films 1905a to 1905f at a concentration of $1\times10^{15}$ to $1\times10^{19}/cm^3$, so that an n-type impurity region 1908 is formed. Further, boron (B) is used for the impurity element imparting p-type conductivity, and is selectively introduced into the semiconductor films 1905c and 1905e at a concentration of $1\times10^{19}$ to $1\times10^{20}/cm^3$, so that a p-type impurity region 1909 is formed.

Next, an insulating film is formed so as to cover the gate insulating film 1906 and the gate electrodes 1907. The insulating film is formed as a single layer or stacked layers of a film including an inorganic material such as silicon, an oxide of silicon, or a nitride of silicon, or an organic material such as an organic resin, by a plasma CVD method, a sputtering method, or the like. Next, the insulating film is selectively etched by anisotropic etching which mainly etches in a vertical direction, so that insulating films 1910 (also referred to as side walls) which are in contact with side surfaces of the gate electrodes 1907 are formed. The insulating films 1910 are used as masks for doping when LDD (Lightly Doped Drain) regions are formed later.

Next, with the use of a resist mask formed by a photolithography method, the gate electrodes 1907 and the insulating films 1910 as masks, an impurity element imparting n-type conductivity is added to the semiconductor films 1905a, 1905b, 1905d, and 1905f, so that n-type impurity regions 1911 are formed. Here, phosphorus (P) is used for the impurity element imparting n-type conductivity, and is selectively introduced into the semiconductor films 1905a, 1905b, 1905d, and 1905f at a concentration of $1\times10^{15}$ to $1\times10^{19}/cm^3$, so that the n-type impurity regions 1911 with higher concentration than the n-type impurity regions 1908 are formed.

Through aforementioned steps, as shown in FIG. 19D, n-channel thin film transistors 1900a, 1900b, 1900d, and 1900f, and p-channel thin film transistors 1900c and 1900e are formed.

Note that in the n-channel thin film transistor 1900a, a channel formation region is formed in a region of a semiconductor film 1905a, which is overlapped with the gate electrode 1907; the impurity region 1911 forming a source region or a drain region is formed in a region which is not overlapped with the gate electrode 1907 and the insulating film 1910; and a lightly doped drain region (LDD region) is formed in a region which is overlapped with the insulating film 1910 and is between the channel formation region and the impurity region 1911. Similarly, in the n-channel thin film transistors 1900b, 1900d, and 1900f, a channel formation region, a lightly doped drain region, and the impurity region 1911 are formed.

In the p-channel thin film transistor 1900c, a channel formation region is formed in a region of a semiconductor film 1905c, which is overlapped with the gate electrode 1907; and the impurity region 1909 forming a source region or a drain region is formed in a region which is not overlapped with the gate electrode 1907. Similarly, in p-channel thin film transistor 1900e, a channel formation region and the impurity region 1909 are formed. Note that although each of the p-channel thin film transistors 1900c and 1900e is not provided with an LDD region, a structure may be employed, in which the p-channel thin film transistor is provided with an LDD region or the n-channel thin film transistor is not provided with an LDD region.

Next, as shown in FIG. 20A, an insulating film is formed as a single layer or stacked layers so as to cover the semiconductor films 1905a to 1905f, the gate electrodes 1907, and the like; thereby forming conductive films 1913 over the insulating film, which is electrically connected to the impurity regions 1909 and 1911 for forming source regions or drain regions of the thin film transistors 1900a to 1900f. The insulating film is formed as a single layer or stacked layers using an inorganic material such as an oxide of silicon or a nitride of silicon, an organic material such as polyimide, polyamide, benzocyclobutene, acrylic, or epoxy, a siloxane material, or the like, by a CVD method, a sputtering method, an SOG method, a droplet discharge method, a screen printing method, or the like. Here, the insulating film is formed to have a two-layer structure. A silicon nitride oxide film is formed as a first insulating film 1912a, and a silicon oxynitride film is formed as a second insulating film 1912b. The conductive films 1913 form source electrodes or drain electrodes of the semiconductor films 1905a to 1905f.

It is to be noted that before the insulating films 1912a and 1912b are formed or after one or more of thin films of the insulating films 1912a and 1912b are formed, heat treatment for recovering the crystallinity of the semiconductor film, for activating the impurity element which has been added to the semiconductor film, or for hydrogenating the semiconductor film is preferably performed. For the heat treatment, thermal annealing, a laser annealing method, an RTA method, or the like is preferably adopted.

The conductive film 1913 is formed as a single layer or stacked layers using an element selected from aluminum (Al), tungsten (W), titanium (Ti), tantalum (Ta), molybdenum (Mo), nickel (Ni), platinum (Pt), copper (Cu), gold (Au), silver (Ag), manganese (Mn), neodymium (Nd), carbon (C), and silicon (Si), or an alloy material or a compound material including the above-described element as its main component, by a CVD method, a sputtering method, or the like. An alloy material containing aluminum as its main component corresponds to a material which contains aluminum as its main component and also contains nickel, or an alloy material which contains aluminum as its main component and also contains nickel and one or both of carbon and silicon, for example. The conductive film 1913 preferably employs, for example, a stacked layer structure of a barrier film, an aluminum-silicon (Al—Si) film, and a barrier film, or a stacked layer structure of a barrier film, an aluminum-silicon (Al—Si) film, a titanium nitride (TiN) film, and a barrier film. It is to be noted that a barrier film corresponds to a thin film formed by using titanium, a nitride of titanium, molybdenum, or a nitride of molybdenum. Aluminum and aluminum silicon which have low resistance and are inexpensive are optimal materials for forming the conductive film 1913. In addition, generation of a hillock of aluminum or aluminum silicon can be prevented when upper and lower barrier layers are formed. Furthermore, when the barrier film is formed by using titanium that is a highly-reducible element, even if a thin natural oxide film is formed over the crystalline semiconductor film, the natural oxide film is reduced so that preferable contact with the crystalline semiconductor film can be obtained.

Next, an insulating film 1914 is formed so as to cover the conductive films 1913, and conductive films 1915a and 1915b are formed over the insulating film 1914 so as to be electrically connected to the conductive films 1913 which form source electrodes or drain electrodes of the semiconductor films 1905a and 1905f respectively. Further, conductive films 1916a and 1916b are formed so as to be electrically connected to the conductive films 1913 which form source electrodes or drain electrodes of the semiconductor films 1905b and 1905e respectively. Note that the conductive films 1915a, 1915b, 1916a, and 1916b may be formed using the same material at the same time. Furthermore, the conductive films 1915a, 1915b, 1916a, and 1916b can be formed using any of the materials given for the conductive films 1913.

Subsequently, as shown in FIG. 20B, conductive films 1917a and 1917b are formed so as to be electrically connected to the conductive films 1916a and 1916b functioning as antennas respectively. Here, one of the conductive films 1917a and 1917b functioning as the antennas corresponds to the antenna of the first antenna circuit described in the aforementioned embodiment mode, and the other corresponds to the antenna of the second antenna circuit. For example, when the conductive film 1917a is the antenna of the first antenna circuit and the conductive film 1917b is the antenna of the second antenna circuit, the thin film transistors 1900a to 1900c function as the first signal processing circuit described in the aforementioned embodiment mode, and the thin film transistors 1900d to 1900f function as the second signal processing circuit described in the aforementioned embodiment mode.

The insulating film 1914 can be formed by a CVD method, a sputtering method, or the like to have a single layer structure or a stacked layer structure of an insulating film containing oxygen or nitrogen, such as a silicon oxide ($SiO_x$) film, a silicon nitride ($SiN_x$) film, a silicon oxynitride ($SiO_xN_y$, x>y) film, and a silicon nitride oxide ($SiN_xO_y$, x>y) film; a film containing carbon such as DLC (Diamond Like Carbon); or a film made of an organic material such as epoxy, polyimide, polyamide, polyvinylphenol, benzocyclobutene, or acrylic, a siloxane material such as a siloxane resin. The siloxane material is a material including a Si—O—Si bond. Siloxane is composed of a skeleton formed by the bond of silicon (Si) and oxygen (O), in which an organic group containing at least hydrogen (such as an alkyl group or aromatic hydrocarbon) is contained as a substituent. Alternatively, a fluoro group may be used as the substituent. Further alternatively, a fluoro group and an organic group containing at least hydrogen may be used as the substituent.

The conductive films 1917a and 1917b are formed using a conductive material, by a CVD method, a sputtering method, a printing method such as screen printing or gravure printing, a droplet discharge method, a dispenser method, a plating method, or the like. The conductive materials are formed as a single layer or stacked layers using an element selected from aluminum (Al), titanium (Ti), silver (Ag), copper (Cu), gold (Au), platinum (Pt), nickel (Ni), palladium (Pd), tantalum (Ta), and molybdenum (Mo), or an alloy material or a compound material including the above-described element as its main component.

For example, in a case of forming the conductive films 1917a and 1917b functioning as the antennas by a screen printing method, the conductive films can be formed by being selectively printed with conductive paste in which conductive particles each including a grain size of several nm to several tens of μm are dissolved or dispersed in an organic resin. As the conductive particle, a fine particle or a dispersive nanoparticle of one or more metals of silver (Ag), gold (Au), copper (Cu), nickel (Ni), platinum (Pt), palladium (Pd), tantalum (Ta), molybdenum (Mo), and titanium (Ti) or silver halide can be used. In addition, as the organic resin included in the conductive paste, one or a plurality of organic resins each functioning as a binder, a solvent, a dispersant, or a coating of the metal particle can be used. Typically, an organic resin such as an epoxy resin or a silicon resin can be used. When forming a conductive film, baking is preferably performed after the conductive paste is applied. For example, in a case of using fine particles (of which grain size is 1 to 100 nm) containing silver as its main component as a material of the conductive paste, the conductive paste is hardened by being baked at a temperature of 150 to 300° C., and thus a conductive film can be obtained. Alternatively, fine particles containing solder or lead-free solder as its main component may be used; in this case, it is preferable to use a fine particle including a grain size of 20 μm or less. Solder and lead-free solder have an advantage such as low cost.

In a subsequent step, the conductive films 1915a and 1915b can function as wirings electrically connected to a battery included in the semiconductor device of this embodiment mode. When the conductive films 1917a and 1917b functioning as the antennas are formed, another conductive film may be formed so as to be electrically connected to the conductive films 1915a and 1915b, and may be used a wiring connected to the battery. Note that the conductive films 1917a and 1917b in FIG. 20B correspond to the first antenna circuit and the second antenna circuit described in Embodiment Mode 1, respectively.

Next, as shown in FIG. 20C, after an insulating film 1918 is formed so as to cover the conductive films 1917a and 1917b, a layer including the thin film transistors 1900a to 1900f, the conductive films 1917a and 1917b, and the like (hereinafter also referred to as an "element formation layer 1919") is peeled from the substrate 1901. Here, openings are formed by laser light (such as UV light) irradiation in a region except portions in which the thin film transistors 1900a to 1900f are formed, and then, the element formation layer 1919 can be peeled from the substrate 1901 by using physical force. Alternatively, an etchant may be introduced to the openings before the element formation layer 1919 is peeled from the substrate 1901; thereby removing the peeling layer 1903. As the etchant, gas or a liquid containing halogen fluoride or an interhalogen compound is used. For example, chlorine trifluoride ($ClF_3$) is used as gas containing halogen fluoride. Accordingly, the element formation layer 1919 is peeled from the substrate 1901. Note that the peeling layer 1903 may be partially left instead of being removed entirely. Thus, consumption of the etchant can be reduced and process time for removing the peeling layer can be shortened. In addition, the element formation layer 1919 can be retained over the substrate 1901 even after the peeling layer 1903 is removed. In addition, it is preferable to reuse the substrate 1901 after the element formation layer 1919 is peeled off, in order to reduce the cost.

The insulating film 1918 can be formed by a CVD method, a sputtering method, or the like to have a single layer structure or a stacked layer structure of an insulating film containing oxygen or nitrogen, such as a silicon oxide ($SiO_x$) film, a silicon nitride ($SiN_x$) film, a silicon oxynitride ($SiO_xN_y$, x>y) film, or a silicon nitride oxide ($SiN_xO_y$, x>y) film; a film containing carbon such as DLC (Diamond Like Carbon); or a film made of an organic material such as epoxy, polyimide, polyamide, polyvinylphenol, benzocyclobutene, or acrylic; and a siloxane material such as a siloxane resin.

Figure 21A:
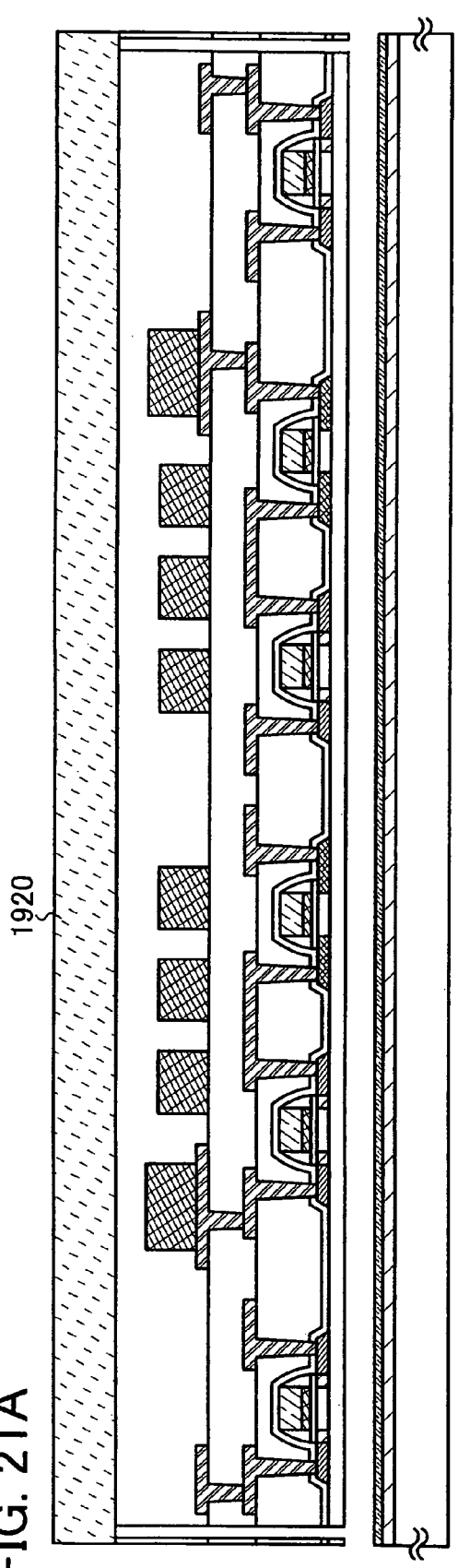
FIGS. 21A and 21B are views each showing a structure example of a manufacturing method of a semiconductor device of the present invention.

In this embodiment mode, as shown in FIG. 21A, after an opening is formed in the element formation layer 1919 by irradiation with a laser beam, a first sheet material 1920 is attached to one surface of the element formation layer 1919 (a surface of the insulating film 1918 that is exposed). Then, the element formation layer 1919 is peeled from the substrate 1901.

Figure 21B:
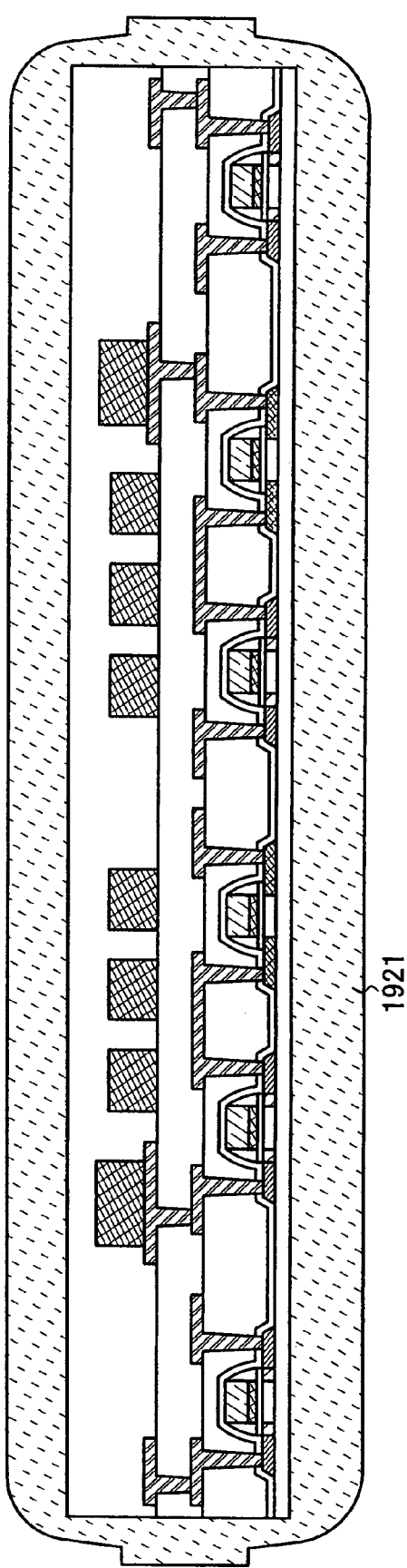

Next, as shown in FIG. 21B, a second sheet material 1921 is attached to the other surface of the element formation layer 1919 (a surface exposed by peeling) by one or both of heat treatment and pressure treatment. As the first sheet material 1920 and the second sheet material 1921, a hot-melt film or the like can be used.

As the first sheet material 1920 and the second sheet material 1921, a film on which an antistatic treatment for preventing static electricity or the like is performed (hereinafter referred to as an antistatic film) may be used. As the antistatic film, a film with an antistatic material dispersed in a resin, a film with an antistatic material attached thereon, and the like can be given as examples. The film provided with an antistatic material may be a film with an antistatic material provided over one of its surfaces, or a film with an antistatic material provided over each of its surfaces. As for the film with an antistatic material provided over one of its surfaces, the film may be attached to the layer so that the antistatic material is placed on the inner side of the film or the outer side of the film. Note that the antistatic material may be provided over the entire surface of the film, or over a part of the film. As the antistatic material here, a metal, indium tin oxide (ITO), or a surfactant such as an amphoteric surfactant, a cationic surfactant, or a nonionic surfactant can be used. Alternatively, as the antistatic material, a resin material containing crosslinkable copolymer including a carboxyl group and a quaternary ammonium base on its side chain, or the like can be used. By attaching, mixing, or applying such a material to a film, an antistatic film can be formed. The sealing is performed using the antistatic film, and thus a semiconductor element can be prevented from being adversely affected due to static electricity from outside when dealt with as a commercial product.

The battery is formed so as to be connected to the conductive films 1915a and 1915b. The battery may be connected to the conductive films 1915a and 1915b before or after the element formation layer 1919 is peeled from the substrate 1901 (a step in FIG. 20B or 20C, or a step in FIG. 21A), or after the element formation layer 1919 is sealed with the first sheet material and the second sheet material (a step in FIG. 21B). Hereinafter, description is made of an example in which the element formation layer 1919 and the battery are connected to each other with reference to FIGS. 22A to 23B.

In FIG. 22A, conductive films 1931a and 1931b electrically connected to the conductive films 1915a and 1915b respectively are formed at the same time as the conductive films 1917a and 1917b functioning as the antennas. After the insulating layer 1918 is formed so as to cover the conductive films 1917a, 1917b, 1931a and 1931b, openings 1932a and 1932b are formed so that surfaces of the conductive films 1931a and 1931b are exposed. Subsequently, as shown in FIG. 22A, after an opening is formed in the element formation layer 1919 by irradiation with a laser beam, a first sheet material 1920 is attached to one surface of the element formation layer 1919 (the surface of the insulating film 1918 that is exposed). Then, the element formation layer 1919 is peeled from the substrate 1901.

Next, as shown in FIG. 22B, the second sheet material 1921 is attached to the other surface of the element formation layer 1919 (the surface exposed by peeling), and then, the element formation layer 1919 is peeled from the first sheet material 1920. Therefore, the first sheet material 1920 that has low adhesion is used here. Subsequently, conductive films 1934a and 1934b which are electrically connected to the conductive films 1931a and 1931b are selectively formed through the openings 1932a and 1932b.

The conductive films 1934a and 1934b functioning as antennas are formed using a conductive material by a CVD method, a sputtering method, a printing method such as screen printing or gravure printing, a droplet discharge method, a dispenser method, a plating method, or the like. The conductive material is formed as a single layer or stacked layers using an element selected from aluminum (Al), titanium (Ti), silver (Ag), copper (Cu), gold (Au), platinum (Pt), nickel (Ni), palladium (Pd), tantalum (Ta), and molybdenum (Mo), or an alloy material or a compound material including the above-described element as its main component.

Note that an example is described here, in which after the element formation layer 1919 is peeled from the substrate 1901, the conductive films 1934a and 1934b are formed. Alternatively, the element formation layer 1919 may be peeled from the substrate 1901 after formation of the conductive films 1934a and 1934b.

Subsequently, as shown in FIG. 23A, when a plurality of elements are formed over the substrate, each element of the element formation layer 1919 is cut. A laser irradiation apparatus, a dicing apparatus, a scribing apparatus, or the like can be used for cutting. Here, each of the plurality of elements formed over one substrate is cut by irradiation with a laser beam.

Next, as shown in FIG. 23B, the cut element is electrically connected to a connecting terminal of the battery. Here, the conductive films 1934a and 1934b which are provided over the element formation layer 1919 are connected to conductive films 1936a and 1936b to be connecting terminals, which are provided over a substrate 1935, respectively. Here, a case is shown, in which the conductive films 1934a and 1936a or the conductive films 1934b and 1936b are electrically connected to each other by being pressure-bonded with an adhesive material such as an anisotropic conductive film (ACF) or anisotropic conductive paste (ACP). In this case, an example in which the connection is made using a conductive particle 1938 included in an adhesive resin 1937 is shown. Alternatively, a conductive adhesive such as a silver paste, a copper paste, or a carbon paste; solder joint; or the like may be used for the connection.

In a case where a battery is larger than an element, as shown in FIGS. 22A to 23B, a plurality of elements are formed over one substrate, and the elements which have been cut are connected to the battery. Accordingly, the number of elements which can be formed over one substrate can be increased, which enables to manufacture a semiconductor device at lower cost.

Subsequently, as described in the aforementioned embodiment mode, the elements may be connected to a booster antenna.

Through the above steps, a semiconductor device can be manufactured. Note that in this embodiment mode, a process in which after being formed over a substrate, an element such as a thin film transistor is peeled is shown. Alternatively, an element formed over a substrate may be used as a product without being peeled from the substrate. Further, after an element such as a thin film transistor is formed over a glass substrate, the glass substrate is polished from an opposite side of a surface on which the element is formed, or after a MOS transistor is formed using a semiconductor substrate such as Si, the semiconductor substrate is polished, whereby reduction in film thickness and size of a semiconductor device can be achieved.

Note that this embodiment mode can be implemented in combination with any of the other embodiment modes in this specification.

Embodiment Mode 4

In this embodiment mode, description is made of an example of a semiconductor device different from that of the aforementioned embodiment mode and a manufacturing method thereof with reference to drawings.

First, as shown in FIG. 24A, a peeling layer 2403 is formed over one surface of the substrate 2401 with an insulating film 2402 interposed therebetween. Subsequently, an insulating film 2404 and an insulating film 2405 that function as base films are stacked. Note that the insulating film 2402, the peeling layer 2403, the insulating film 2404, and the semiconductor film 2405 can be sequentially formed.

The conductive film 2405 is formed as a single layer or a stacked layer of a film formed of an element selected from tungsten (W), molybdenum (Mo), titanium (Ti), tantalum (Ta), niobium (Nb), nickel (Ni), cobalt (Co), zirconium (Zr), zinc (Zn), ruthenium (Ru), rhodium (Rh), palladium (Pd), osmium (Os), and iridium (Ir), or an alloy material or a compound material containing the above-described element as its main component. The film can be formed by a sputtering method, various CVD methods such as a plasma CVD method or the like.

Further, the substrate 2401, the insulating film 2402, the peeling layer 2403, and the insulating film 2404 can be formed by using materials of the substrate 1901, the insulating film 1902, the peeling layer 1903, and the insulating film 1904 described in the aforementioned embodiment mode, respectively.

Next, as shown in FIG. 24B, the conductive film 2405 is selectively etched to form conductive films 2405a to 2405e, and then insulating films 2406 and 2407 are stacked so as to cover the conductive films 2405a to 2405e.

The insulating films 2406 and 2407 are each formed of an insulating material such as silicon oxide, silicon nitride, silicon oxynitride ($SiO_xN_y$, x>y>0), or silicon nitride oxide ($SiN_xO_y$, x>y>0), by a CVD method, a sputtering method, or the like. For example, the insulating film 2406 can be formed using silicon nitride oxide, and the insulating film 2407 can be used using silicon oxynitride. Here, an example is shown, in which the insulating films are formed to have a two-layer structure. Alternatively, only one of the insulating films 2406 and 2407 may be provided, or three or more insulating films may be stacked.

Next, as shown in FIG. 24C, semiconductor films 2408a to 2408d are selectively formed over the conductive films 2405a to 2405d. Here, an amorphous semiconductor film (such as an amorphous silicon film) is formed with a thickness of 25 to 200 nm (preferably 30 to 150 nm) by a sputtering method, an LPCVD method, a plasma CVD method or the like. The amorphous semiconductor film is crystallized, and then selectively etched to form the semiconductor films 2408a to 2408d. As a material and a crystallizing method and the like of the semiconductor films, those described in the aforementioned embodiment mode can be used. The insulating films 2406 and 2407, and the amorphous semiconductor film can be sequentially formed.

Note that in a case where the insulating film 2407 has concavity and convexity on a surface thereof due to the conductive films 2405a to 2405d, the surface is preferably subjected to a planarization process to be planarized. For the planarization process, polishing such as a CMP method can be used. By polishing such as a CMP method, as shown in FIG. 24A, a semiconductor film can be formed over the insulating film 2407 including a planarized surface; therefore, when an element is formed using the semiconductor films 2408a to 2408d, characteristics of the element can be prevented to be affected.

Next, as shown in FIG. 24D, an insulating film 2409 is formed so as to cover the semiconductor films 2408a to 2408d; and a gate electrode 2410 is selectively formed above the semiconductor films 2408a to 2408c, and after that, an impurity element is added to the semiconductor films 2408a to 2408d so that impurity regions 2411 are formed. An impurity element imparting n-type conductivity or p-type conductivity is added as the impurity element. As an n-type impurity element, phosphorus (P), arsenic (As), or the like can be used. As a p-type impurity element, boron (B), aluminum (Al), gallium (Ga), or the like can be used. Here, phosphorus (P) is used for the impurity element imparting n-type conductivity, and is selectively introduced into the semiconductor films 2408a to 2408d at a concentration of $1 \times 10^{19}$ to $1 \times 10^{20}$/cm$^3$, so that an n-type impurity region 2411 is formed. Note that a structure of the semiconductor device is not limited to this. An impurity element imparting p-type conductivity may be added to form a p-type impurity region, or impurity elements imparting n-type conductivity and p-type conductivity may be selectively introduced into the semiconductor films 2408a to 2408d.

Through above steps, as shown in FIG. 24D, n-channel transistors 2400a to 2400c and an element 2400d functioning as a capacitor are formed.

In the n-channel thin film transistor 2400a, a channel formation region is formed in a region of the semiconductor film 2408a which overlaps with the gate electrode 2410, and an impurity region 2411 which forms a source region or a drain region is formed so as to be adjacent to the channel formation region, in a region which does not overlap with the gate electrode 2410. Similarly, in the n-channel thin film transistor 2400b an 2400c, a channel formation region and the impurity region 2411 which forms a source region or a drain region are formed.

In the element 2400d, a capacitor is formed with a stacked structure of a conductive film 2405d, insulating films 2406 and 2407, and the impurity region 2411 to which an impurity element is introduced.

Here, an example in which n-channel thin film transistors 2400a to 2400c are provided is described. Alternatively, a p-channel thin film transistor may be provided, or as described in the aforementioned embodiment mode, an insulating film may be provided so as to be adjacent to a side face of the gate electrode 2410 and a lightly doped drain region (LDD region) may be provided for semiconductor films of the n-channel thin film transistors 2400a to 2400c.

Further, as shown in FIG. 27A and FIG. 27B, an example is shown here, in which the conductive films 2405a to 2405c are formed larger than semiconductor films 2408a to 2408c (the conductive films 2405a to 2405c are formed so as to overlap with channel formation regions and the impurity regions 2411 of the thin film transistors 2400a to 2400c), a structure of the semiconductor device is not limited to this. For example, as shown in FIG. 27A and FIG. 27B, the conductive films 2405a to 2405c may be provided so as to overlap with a part of the impurity region 2411a and an entire surface of the channel forming region of the thin film transistors 2400a to 2400c. Alternatively, the conductive films 2405a to 2405c may be provided so as to overlap with a part of the impurity region 2411 and a part of the channel forming region, or may be provided so as to overlap with only a part of the channel forming region. In that case, the insulating film 2407 is preferably planarized by polishing treatment such as, in particular, CMP.

Note that provision of the conductive films 2405a to 2405c enables to prevent damage of the thin film transistor; ESD (Electrostatic Discharge); and a short channel effect, to control a threshold, and the like. Further, the wiring 2405e is provided as a wiring to be formed in an upper layer, whereby reducing steps, or the like can be achieved.

That is to say, if a semiconductor device including the thin film transistors 2400a to 2400c is bent, channel formation regions or impurity regions of the thin film transistors 2400a to 2400c can be prevented from being bent by a conductive film formed so as to overlap with the channel formation regions or the impurity regions; therefore, the thin film transistors 2400a to 2400c can also be prevented from being damaged. In particular, as shown in FIG. 27B, a structure where the conductive films 2405a to 2405c, which are provided opposite to the gate electrode with the semiconductor film interposed therebetween, are formed larger than the semiconductor film can be employed, so that physical strength of the semiconductor film in the transistor is increased. Therefore, damage of the transistor due to physical force applied to the transistor can be prevented.

Further, in manufacturing a semiconductor device, the conductive films 2405a to 2405c are escape routes or diffusion regions of charges which can reduce local accumulation of charges and electric field concentration; therefore, ESD can be prevented.

Further, in the thin film transistors 2400a to 2400c, sources are blocked from being affected from drains by the conductive films 2405a to 2405c respectively. Therefore, even when a channel length is short, a short channel effect can be prevented. In other words, a short channel effect (a phenomenon in which the threshold voltage Vth of a transistor shifts rapidly, and a drain current of a subthreshold region rises only slowly), which is caused by reduction in channel length due to miniaturization of the thin film transistors 2400a to 2400c, can be prevented.

Further, by a potential inputted to the conductive films 2405a to 2405c, a threshold voltage of the thin film transistors 2400a to 2400c can be controlled.

Figure 34A:
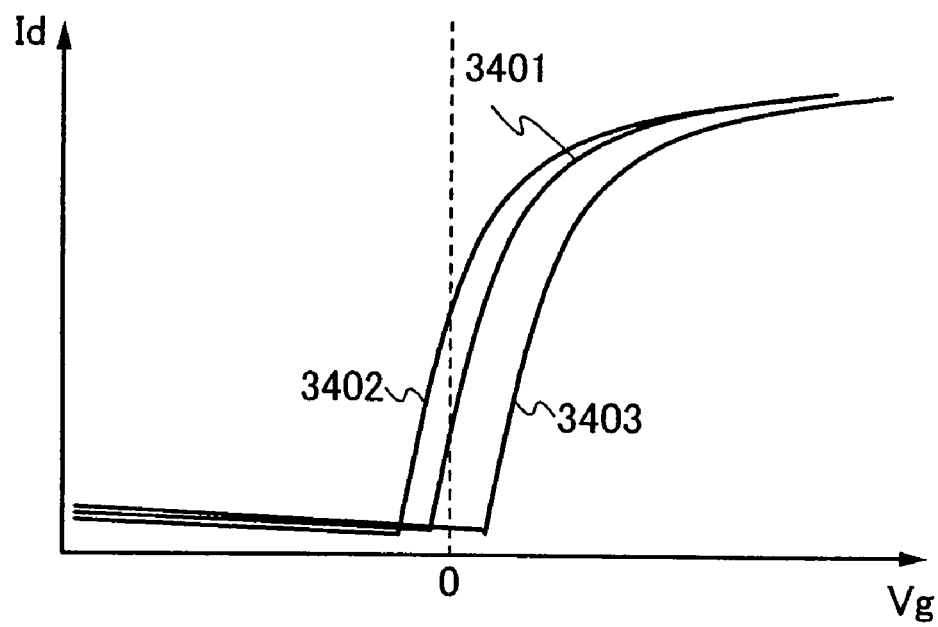
FIGS. 34A and 34B are diagrams each showing characteristics of a semiconductor device of the present invention.
Figure 34B:
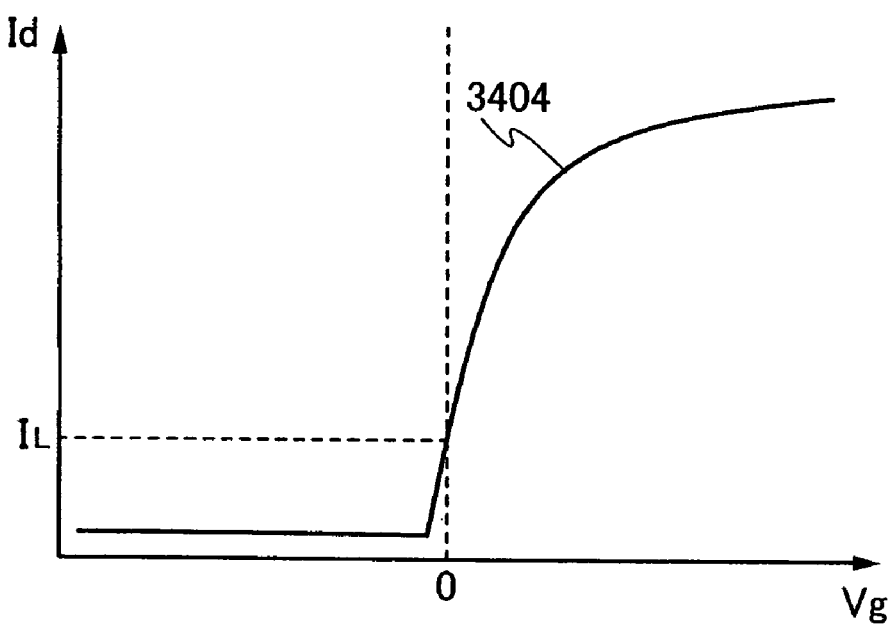

FIG. 34B is a graph showing a relation between a drain current and a gate voltage of an n-channel MOS transistor. Ideally, it is preferable that a drain current Id be sufficiently large in a region where a gate voltage Vg is positive, and the drain current be 0 in a region where the gate voltage Vg is 0 or lower. However, as shown by a curve 3404, only a leak current of IL of the drain current Id actually flows even when a gate voltage Vg is 0. Since a semiconductor device is provided with many transistors, a total leak current is not small in some cases. Such a leak current may increase standby power consumption of the semiconductor device. In other words, such a leak current may increase consumption of power stored in a battery.

A slight amount of impurities are added to a channel region of the transistor so that a curve shown in FIG. 34B is shifted to the right, and thus the leak current can be reduced. However, in that case, there has been a problem in that the current is reduced also in the case where Vg is positive and thereby deteriorating frequency characteristics of a circuit.

In order to solve the problem described above, gate electrodes are provided over and under the semiconductor film forming the transistor. That is, the semiconductor film is provided between a first gate electrode and a second gate electrode. Then, a logic signal is applied to the first gate electrode, a threshold control signal is applied to the second gate electrode, and the threshold of the transistor forming the semiconductor device is made variable by a potential of the second gate electrode. In this embodiment mode, the conductive films 2405a to 2405c can be used for the second gate electrodes of the thin film transistors 2400a to 2400c, respectively.

FIG. 34A shows the Id-Vg characteristic of the transistor including the first gate electrode and the second gate electrode. In FIG. 34A, curves 3401 to 3403 are shown, and the curve 3402 is a curve in a case of applying a positive voltage to the second gate electrode. In this case, the curve is shifted to the left, and a larger amount of current flows. Further, the curve 3401 is a curve in a case of applying a voltage of 0 V to the second gate electrode. This case is the same as that in the conventional example. The curve 3403 is a curve in a case of applying a negative voltage to the second gate electrode. In this case, the curve is shifted to the right, a current does not flows easily, and a leak current is reduced. Thus, the semiconductor device of this embodiment mode is provided with a threshold control function and the curve of the Id-Vg characteristic of the transistor is shifted, which enables to reduce a leak current.

Note that an antenna circuit formed later may be formed at the same time as the conductive films 2405a to 2405e in this embodiment mode. It is preferable to form the conductive films and the antenna circuit at the same time since the number of steps and the number of masks can be reduced. It is also preferable since the conductive films 2405a and 2405b can also function as wirings between the semiconductor films. Specifically, the wiring 2405e may be formed as a conductive film functioning as an antenna, here.

Figure 25A:
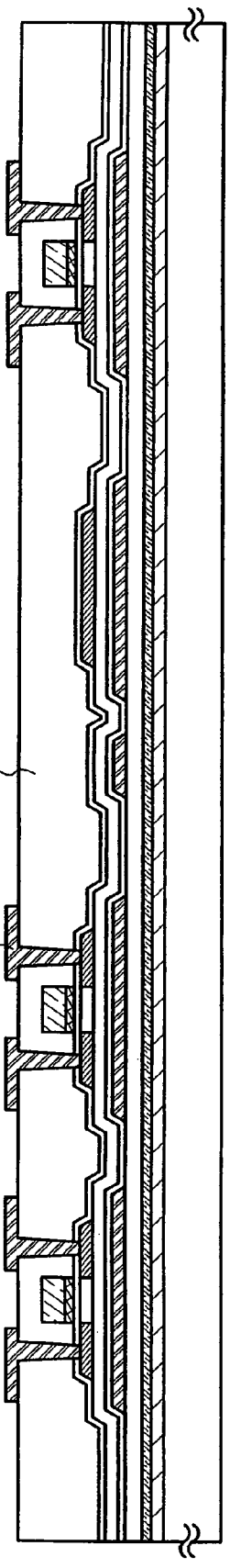
FIGS. 25A and 25B are views each showing a structure example of a manufacturing method of a semiconductor device of the present invention.

Next, as shown in FIG. 25A, an insulating film 2412 is formed so as to cover the thin film transistors 2400a to 2400c and the element 2400d, and the conductive film 2413, which is electrically connected to the impurity region 2411 forming a source region or a drain region of the thin film transistors 2400a to 2400c, is formed over the insulating film 2412.

The insulating film 2412 is formed as a single layer or stacked layers using an inorganic material such as an oxide of silicon or a nitride of silicon, an organic material such as polyimide, polyamide, benzocyclobutene, acrylic, or epoxy, a siloxane material, or the like, by a CVD method, a sputtering method, an SOG method, a droplet discharge method, a screen printing method, or the like.

The conductive film 2413 can be formed using any of the materials of the conductive film 1913 described in the aforementioned embodiment mode.

Figure 25B:
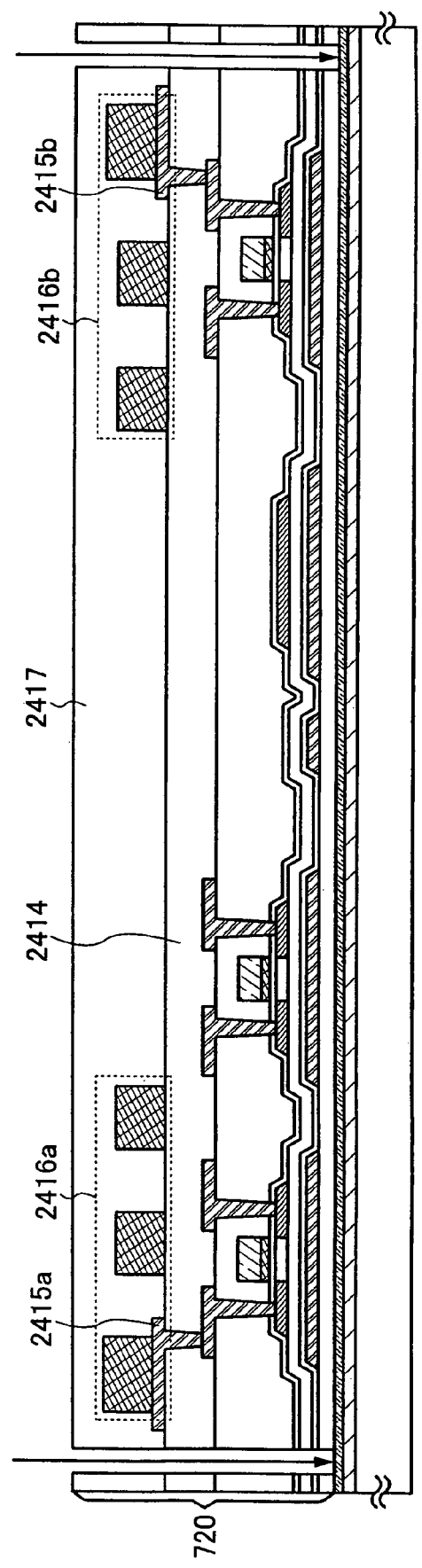

Next, as shown in FIG. 25B, an insulating film 2414 is formed so as to cover the conductive film 2413, and the conductive films 2415a and 2415b, which are electrically connected to the conductive film 2413 forming a source region or a drain region of the thin film transistors 2400a to 2400c, is formed over the insulating film 2414. After that, the conductive films 2416a and 2416b functioning as antennas are formed so as to be electrically connected to the conductive films 2415a and 2415b. Note that the conductive films 2416a and 2416b in FIG. 25B correspond to the first antenna circuit and the second antenna circuit described in Embodiment Mode 1, respectively.

Subsequently, after an insulating film 2417 is formed so as to cover the conductive films 2416a and 2416b, a layer including the thin film transistors 2400a to 2400c, the element 2400d, the conductive films 2416a and 2416b, and the like (hereinafter referred to as an element formation layer 720) is peeled from the substrate 2401. For peeling, any of the methods described in the aforementioned embodiment mode can be used.

Here, as shown in FIG. 25B, after an opening is formed in the element formation layer 720 by irradiation with a laser beam, one surface of the element formation layer 720 (the surface of the insulating film 2417 that is exposed) is attached to a first sheet material 2418. Then, the element formation layer 720 is peeled from the substrate 2401.

Figure 26A:
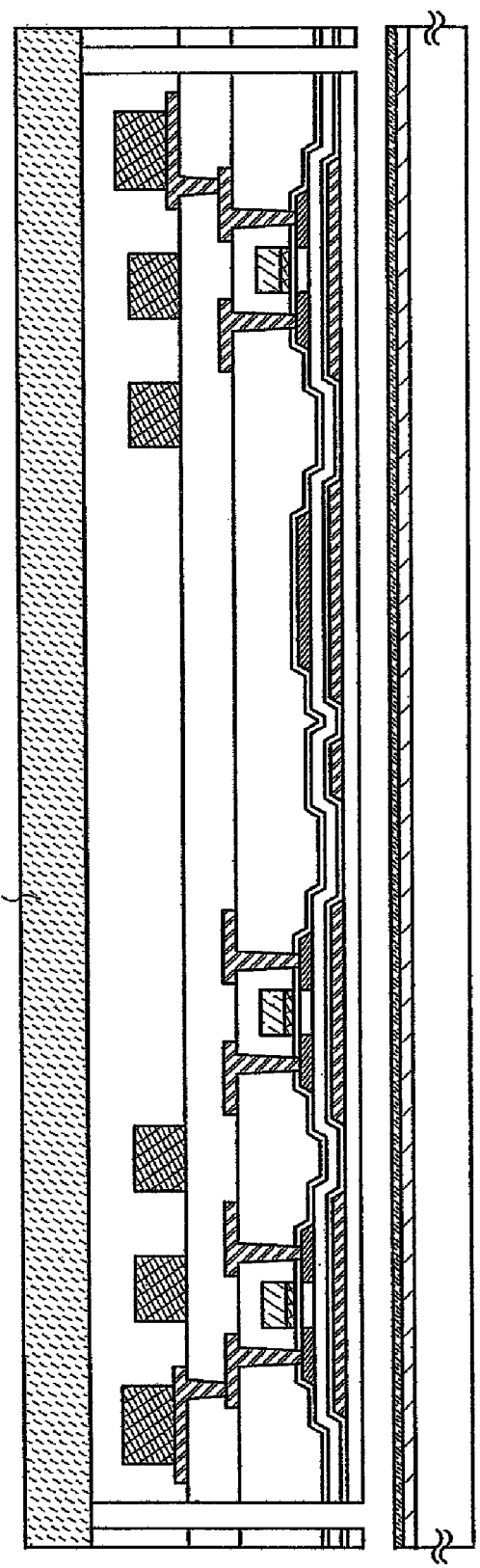
FIG. 26 is a view showing a structure example of a manufacturing method of a semiconductor device of the present invention.
Figure 26B:
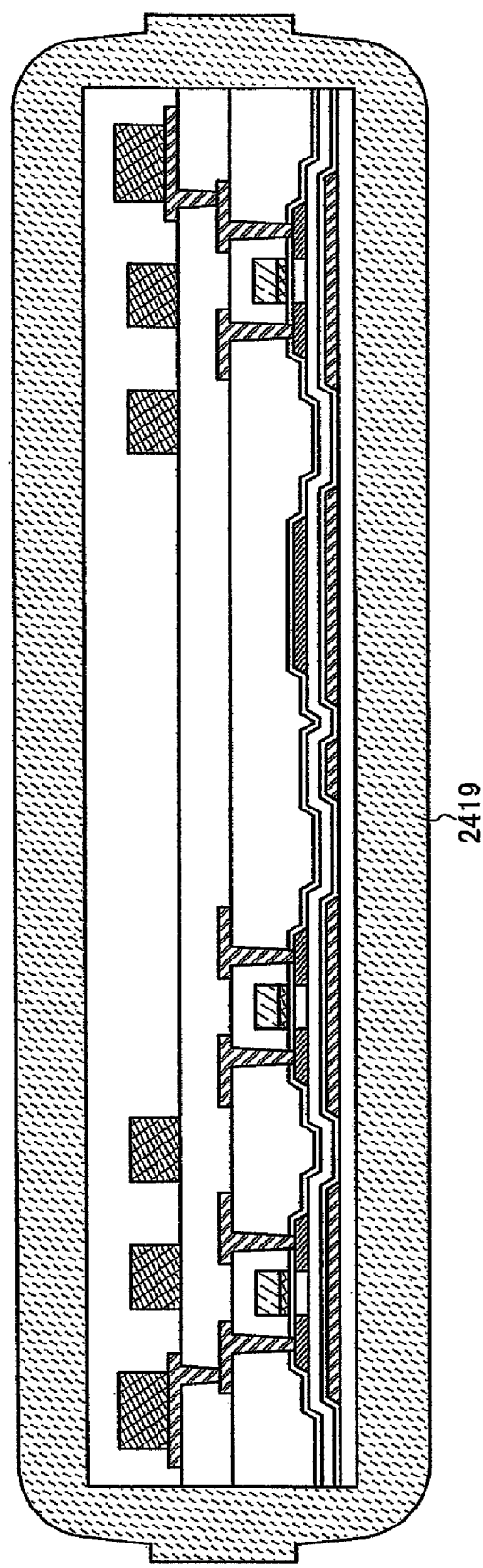

Next, as shown in FIG. 26B, a second sheet material 2419 is attached to the other surface of the element formation layer 720 (the surface exposed by peeling) by one or both of heat treatment and a pressure treatment. As the first sheet material 2418 and the second sheet material 2419, a hot-melt film or the like can be used.

Through above steps, a semiconductor device can be manufactured. Note that in this embodiment mode, an element 2400d forming a capacitor can be used as a battery. Further, another battery may be provided in addition to the element 2400d. In this case, a battery can be provided by using the method described in the aforementioned embodiment mode.

Note that a semiconductor device described in this embodiment mode is not limited to this. For example, a conductive film functioning as a battery or an antenna may be provided below the thin film transistors 2400a to 2400c.

FIGS. 28A and 28B show an example in which a battery is provided below the thin film transistors 2400a to 2400c. Here, the conductive film 2431a is provided to be electrically connected to the conductive film 2413 functioning as a source electrode or a drain electrode of the thin film transistor 2400b, and the conductive film 2431a is connected to a conductive film 2433a forming a connecting wiring of the battery below the element formation layer 720 (on a surface exposed by peeling of the element formation layer 720 from the substrate 2401). Here, an example is shown, in which a thin film transistor is provided instead of the element 2400d forming a capacitor; the conductive film 2432a is provided to be electrically connected to the conductive film 2413 functioning as a source electrode or a drain electrode of the thin film transistor; and the conductive film 2431a is connected to a conductive film 2433a forming a connecting wiring of the battery below the element formation layer 720 (on a surface exposed by peeling of the element formation layer 720 from the substrate 2401).

In that case, in FIG. 25A, in order to expose the impurity region 2411 of the thin film transistors 2400a to 2400c, a first opening is formed in the gate insulating films 2409 and 2412, and at the same time, a second opening is formed in the gate insulating films 2406, 2407, 2409, and 2412. Then, the conductive film 2413 is provided so as to fill the first opening, and the conductive films 2431a and 2431b are provided so as to fill the second opening. The first opening and the second opening can be formed simultaneously. When the first opening is formed, the semiconductor films 2408a to 2408c function as stoppers, and when the second opening is formed, the peeling layer 2403 functions as a stopper. After that, conductive films 2416a and 2416b functioning as antennas are formed as shown in FIG. 28A, the element formation layer 720 is peeled from the substrate 2401.

Next, as shown in FIG. 28B, the conductive films 2431a and 2431b formed on a surface of the element formation layer 720 peeled from the substrate 2401, which is exposed, are electrically connected to the conductive films 2433a and 2433b to be connecting wirings of the battery, which are provided over the substrate 2432, respectively. Here, a case is shown, in which the conductive films 2431a and 2433a or the conductive films 2431b and 2433b are electrically connected to each other by being pressure-bonded with an adhesive material such as an anisotropically conductive film (ACF) or anisotropic conductive paste (ACP). In this case, an example in which the connection is made using a conductive particle 2435 included in an adhesive resin 2434 is shown. Alternatively, a conductive adhesive such as a silver paste, a copper paste, or a carbon paste; solder joint; or the like may be used for the connection.

Note that in this embodiment mode, a conductive film functioning not only as a battery but as an antenna may be provided below the thin film transistors 2400a to 2400c. FIGS. 29A and 29B show an example in which the conductive film 2416 functioning as a battery and an antenna is provided below the thin film transistors 2400a to 2400c.

Here, the conductive film 2431c is provided to be electrically connected to the conductive film 2413 functioning as a source electrode or a drain electrode of the thin film transistor 2400c, and the conductive film 2431c is connected to a conductive film 2416b functioning as an antenna below the element formation layer 720 (at a surface exposed by peeling of the element formation layer 720 from the substrate 2401). In addition, a battery is also provided as shown in FIGS. 28A and 28B.

In that case, in FIG. 25A, in order to expose the impurity region 2411 of the thin film transistors 2400a to 2400c, a first opening is formed in the gate insulating film 2409 and the insulating film 2412. At the same time, as shown in FIG. 29A, a second opening is formed in the insulating films 2406, 2407, and 2412, and the gate insulating film 2409; the conductive film 2413 is provided so as to fill the first opening; and the conductive films 2431a to 2431c are provided so as to fill the second opening. The first opening and the second opening can be formed simultaneously. When the first opening is formed, the semiconductor films 2408a to 2408c function as stoppers, and when the second opening is formed, the peeling layer 2403 functions as a stopper. After that, conductive films

2416*a* functioning as an antenna is formed as shown in FIG. 28A, the element formation layer 720 is peeled from the substrate 2401.

Thereafter, as shown in FIG. 29B, the conductive films 2431*a* and 2431*b* formed on a surface of the element formation layer 720 peeled from the substrate 2401, which is exposed, are connected to the conductive films 2433*a* and 2433*b* to be connecting wirings of the battery, which are provided over the substrate 2432, respectively. Further, the conductive film 2431*c* formed on a surface of the element formation layer 720 peeled from the substrate 2401, which is exposed, is connected to the conductive film 2416*b* functioning as an antenna, which is provided over the substrate 2436.

In a case where a battery or an antenna is larger than an element provided with the thin film transistors 2400*a* to 2400*c*, as shown in FIGS. 28A to 29B, an element formation layer and a battery or an antenna are preferably attached to be provided. When using a battery or an antenna larger than an element, a plurality of elements are formed over one substrate, and the elements which have been cut are attached to the battery or the antenna. Accordingly, a semiconductor device can be manufactured at lower cost.

Note that this embodiment mode can be implemented in combination with any of the other embodiment modes in this specification.

Embodiment Mode 5

In this embodiment mode, description is made of a connection structure of a first antenna, a second antenna, a signal processing circuit, a battery, and a booster antenna in the semiconductor device described in the aforementioned embodiment mode, with reference to drawings.

First, in the drawing shown in FIG. 11A, a semiconductor device includes a signal processing circuit 9901, an upper electrode 9902 and a lower electrode 9903 of the signal processing circuit, a battery 9904, a side electrode 9905 of the battery, a substrate 9906, and an antenna circuit 9907. The battery has electrodes at side portions, and the antenna circuit has an electrode at an upper portion. Further, the battery 9904, the signal processing circuit 9901, and the substrate 9906 including the antenna circuit are sequentially stacked.

Note that an upper portion, a lower portion, and a side portion in this embodiment mode are designations for description with reference to drawings. Therefore, in actual connection, position of each portion is specified and connected by comparison of its shape and the drawing.

Note that the antenna circuit 9907 in this embodiment mode corresponds to the first antenna circuit or the second antenna circuit described in the aforementioned embodiment mode. Further, the antenna circuit 9907 and the signal processing circuit 9901 are connected to each other at a terminal portion in the antenna circuit.

Connections of structures described in this embodiment mode are described for each portion. Note that the number of actual connections of structures is not limited to this, and description is made with the assumption that connections are made at a plurality of portions.

As for a connection of the upper electrode and the lower electrode in the signal processing circuit, they may be electrically connected at an upper portion of the transistor shown in FIG. 22B described in the aforementioned embodiment mode, or they may be electrically connected at a lower portion of the transistor shown in FIG. 29B described in the aforementioned embodiment mode. Further, the side electrode connecting the upper electrode and the lower electrode through a side face may be formed by a sputtering method, a plating method, or the like.

Next, FIG. 11B shows a different structure from that in FIG. 11A. In the drawing shown in FIG. 11B, a semiconductor device includes the signal processing circuit 9901, the upper electrode 9902 and a side electrode 9913 of the signal processing circuit, the battery 9904, the side electrode 9905 of the battery, the substrate 9906, and the antenna circuit 9907. The signal processing circuit 9901 in FIG. 11B has the upper electrode connected to a battery side and the side electrode led to a substrate side along a side face of the signal processing circuit from the electrode on the battery side. The battery has electrodes at side portions, and the antenna circuit has an electrode at an upper portion. Further, the battery 9904, the signal processing circuit 9901, and the substrate 9906 including the antenna circuit are sequentially stacked.

Next, FIG. 11C shows a different structure from those in FIGS. 11A and 11B. In the drawing shown in FIG. 11C, a semiconductor device includes the signal processing circuit 9901, the upper electrode 9902 of the signal processing circuit, the battery 9904, the side electrode 9905 of the battery, the substrate 9906, and a booster antenna 9909. The signal processing circuit 9901 in FIG. 11C has the upper electrode connected to a battery side. The battery has electrodes at side portions, and the booster antenna has an electrode at an upper portion. Further, the battery 9904, the signal processing circuit 9901, and the substrate 9906 including the booster antenna are sequentially stacked.

Note that in FIG. 11C, a first antenna circuit and the second antenna circuit described in the aforementioned embodiment mode are provided with the signal processing circuit, which is a different structure from those shown in FIGS. 11A and 11B.

Next, FIG. 11D shows a different structure from those in FIGS. 11A to 11C. In the drawing shown in FIG. 11D, a semiconductor device includes the signal processing circuit 9901, the upper electrode 9902 and the lower electrode 9903 of the signal processing circuit, the battery 9904, a lower electrode 9915 of the battery, the substrate 9906, and the antenna circuit 9907. The signal processing circuit 9901 in FIG. 11D has the upper and lower electrodes. The battery has an electrode at a lower portion, and the antenna circuit has an electrode at an upper portion. Further, the battery 9904, the signal processing circuit 9901, and the substrate 9906 including the antenna circuit are sequentially stacked.

Next, FIG. 11E shows a different structure from those in FIGS. 11A to 11D. In the drawing shown in FIG. 11E, a semiconductor device includes the signal processing circuit 9901, the upper electrode 9902 and the side electrode 9913 of the signal processing circuit, the battery 9904, the lower electrode 9915 of the battery, the substrate 9906, and the antenna circuit 9907. The signal processing circuit 9901 in FIG. 11E has the upper electrode connected to a battery side and the side electrode led to a substrate side along a side face of the signal processing circuit from the electrode on the battery side. The battery has an electrode at a lower portion, and the antenna circuit has an electrode at an upper portion. Further, the battery 9904, the signal processing circuit 9901, and the substrate 9906 including the antenna circuit are sequentially stacked.

Next, FIG. 11F shows a different structure from those in FIGS. 11A to 11E. In the drawing shown in FIG. 11F, a semiconductor device includes the signal processing circuit 9901, the upper electrode 9902 of the signal processing circuit, the battery 9904, the lower electrode 9915 of the battery, a substrate 9908, and the booster antenna 9909. The signal processing circuit 9901 in FIG. 11F has the upper electrode connected to a battery side. The battery has an electrode at a lower portion, and the booster antenna has an electrode at an upper portion. Further, the battery 9904, the signal processing circuit 9901, and the substrate 9908 including the booster antenna are sequentially stacked.

Note that in FIG. 11F, a first antenna circuit and the second antenna circuit described in the aforementioned embodiment mode are provided with the signal processing circuit, which is a different structure from those shown in FIGS. 11A, 11B, 11D, and 11E.

As described above, various modes can be applied to a connection structure of an antenna circuit, a signal processing circuit, a battery, and a booster antenna of this embodiment mode. By applying each structure shown in FIGS. 11A to 11F, the antenna circuit, the signal processing circuit, and the battery can be directly connected; therefore, it is not necessary to connect them by extending wiring to the periphery of the substrate. Further, by adjustment of sizes of the antenna circuit, the signal processing circuit, and the battery, a semiconductor device including an RFID can be downsized, which is preferable.

Note that this embodiment mode can be implemented in combination with any of the other embodiment modes in this specification.

Embodiment Mode 6

In this embodiment mode, description is made of an example of a method for charging a semiconductor device of the present invention.

Figure 41:
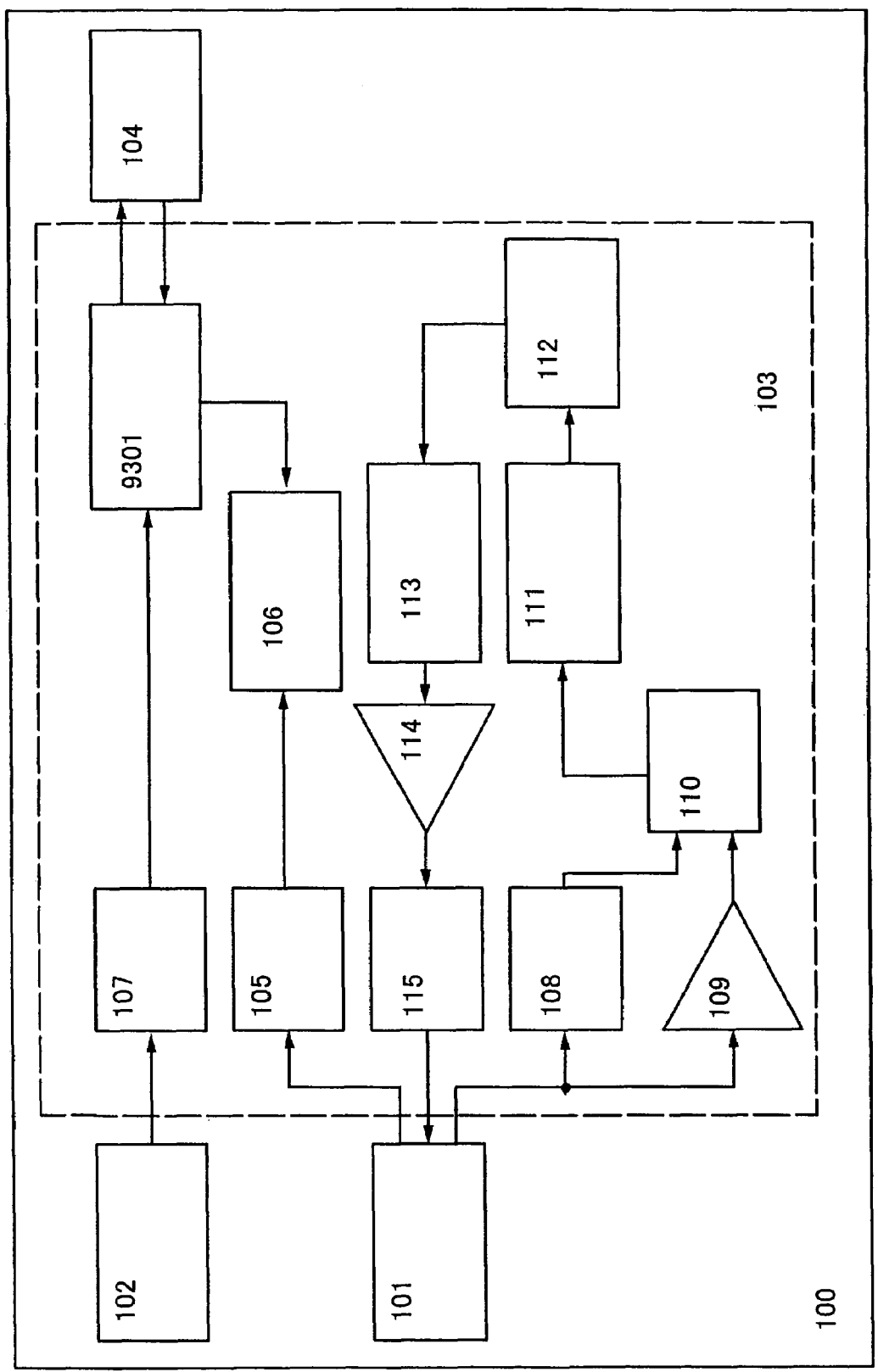
FIG. 41 is a diagram showing a structure example of a semiconductor device of the present invention.

The semiconductor device of this embodiment mode has a structure of the semiconductor device shown in FIG. 1, to which a charge and discharge control circuit 9301 is added (FIG. 41). The charge and discharge control circuit 9301 controls timing for charging and discharging the battery 104.

For example, the battery 104 may be charged and discharged at the same time by the charge and discharge control circuit 9301. In other words, power outputted from the second rectifier circuit 107 can be supplied to the battery 104 for charging regardless of whether a voltage of the battery 104 is used for a power source of the signal processing circuit 103.

Further, the charge and discharge control circuit 9301 may have a function of stopping charging the battery 104 when a voltage of the battery 104 reaches a certain voltage, in order not to overcharge the battery 104.

Figure 37:
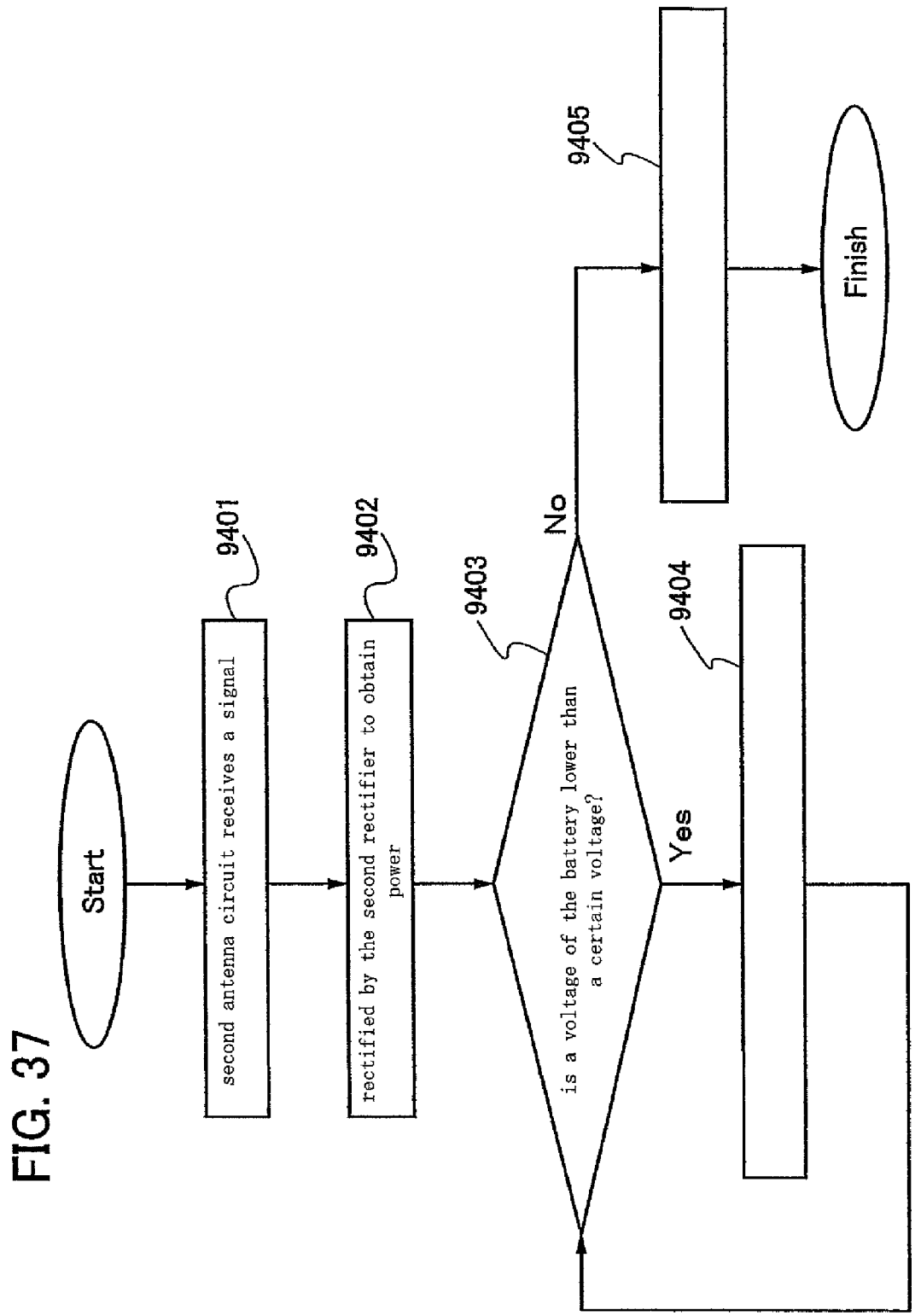
FIG. 37 is a diagram showing an example of an operating method of a semiconductor device of the present invention.

FIG. 37 shows an example of a flowchart in this case. Hereinafter, description is briefly made of the flowchart in FIG. 37.

First, the second antenna circuit 102 receives a signal (STEP 9401). The signal received by the second antenna circuit 102 is rectified by the second rectifier circuit 107 to obtain power (STEP 9402). Power outputted from the second rectifier circuit 107 is supplied to the charge and discharge control circuit 9301. Then, the charge and discharge control circuit 9301 determines whether a voltage of the battery 104 is lower than a certain voltage (STEP 9403). When the voltage is lower than a certain voltage, the charge and discharge control circuit 9301 supplies power outputted from the second rectifier circuit 107 for a certain period of time to charge the battery (STEP 9404). When the voltage is a certain voltage or higher (a case where STEP 9403 and STEP 9404 are repeated, so that the voltage reaches a certain voltage or higher is included), the charge and discharge control circuit 9301 does not supply power outputted from the second rectifier circuit 107 to the battery 104 (STEP 9405). These operations are performed each time a signal is received by the second antenna circuit 102.

Further, the charge and discharge control circuit 9301 may have a function of charging the battery 104 when the voltage of the battery 104 is lower than a certain voltage, and stopping charging the battery 104 when the voltage of the battery 104 reaches a certain voltage.

Figure 38:
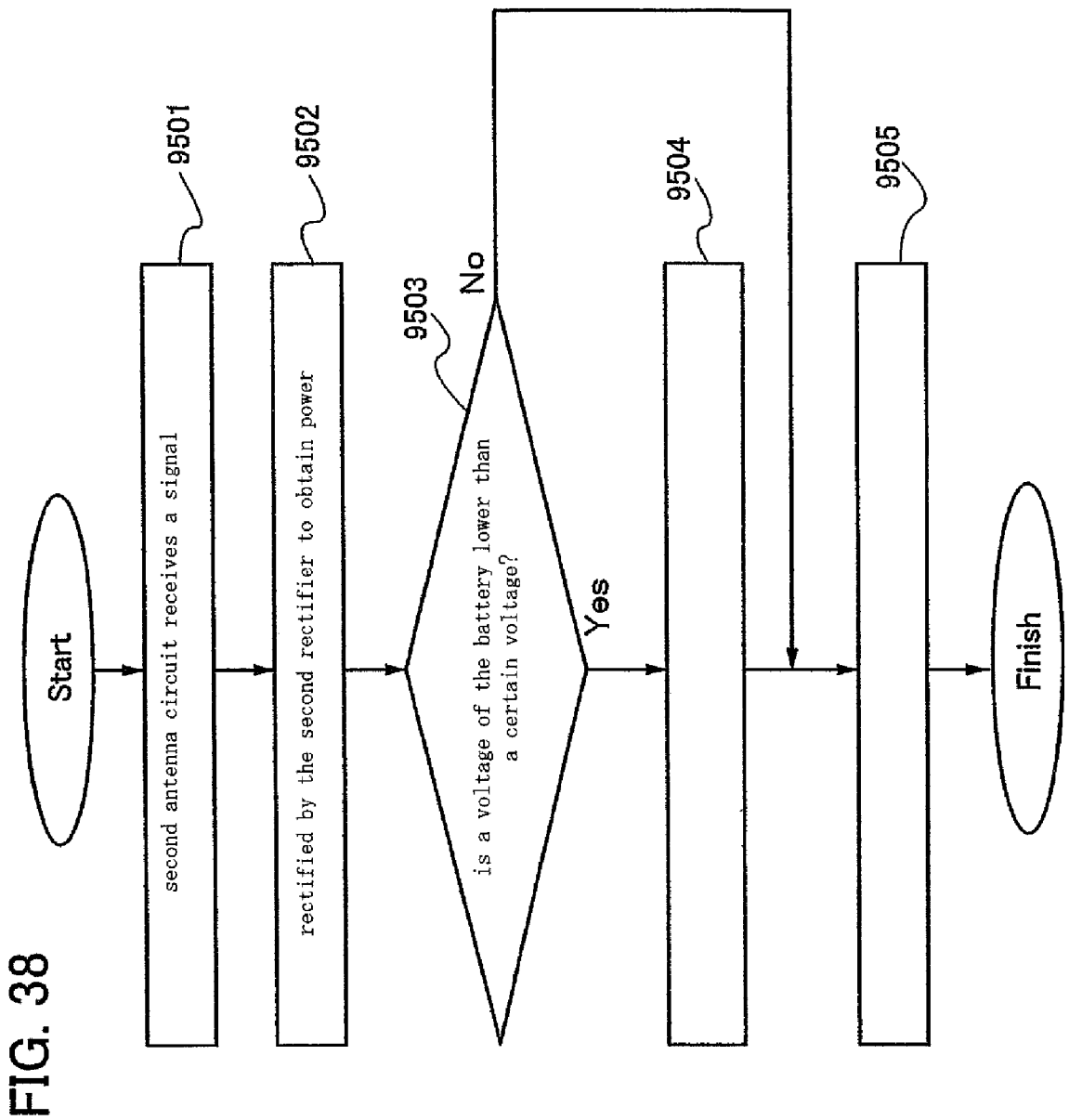
FIG. 38 is a diagram showing an example of an operating method of a semiconductor device of the present invention.

FIG. 38 shows an example of a flowchart in this case. Hereinafter, description is briefly made of the flowchart in FIG. 38.

First, the second antenna circuit 102 receives a signal (STEP 9501). The signal received by the second antenna circuit 102 is rectified by the second rectifier circuit 107 to obtain power (STEP 9502). Power outputted from the second rectifier circuit 107 is supplied to the charge and discharge control circuit 9301. Then, the charge and discharge control circuit 9301 determines whether a voltage of the battery 104 is lower than a certain voltage V1 (STEP 9503). When the voltage is lower than the certain voltage V1, the charge and discharge control circuit 9301 supplies power outputted from the second rectifier circuit 107 to charge the battery so that a voltage of the battery reaches a certain voltage V2 (note that V2>V1) (STEP 9504). When the voltage is the certain voltage V1 or higher (a case where a voltage of the battery 104 reaches the certain voltage V1 or higher STEP 9504 is included), the charge and discharge control circuit 9301 does not supply power outputted from the second rectifier circuit 107 to the battery 104 (STEP 9505). These operations are performed each time a signal is received by the second antenna circuit 102.

Alternatively, power may be charged or discharged to or from the battery 104. That is, when a signal is not received by the first antenna circuit 101, the charge and discharge control circuit 9301 enables the battery 104 to be charged, and when a signal is received by the first antenna circuit 101, the charge and discharge control circuit 9301 stops charging to the battery 104 and enables power to be discharged from the battery 104.

Figure 39:
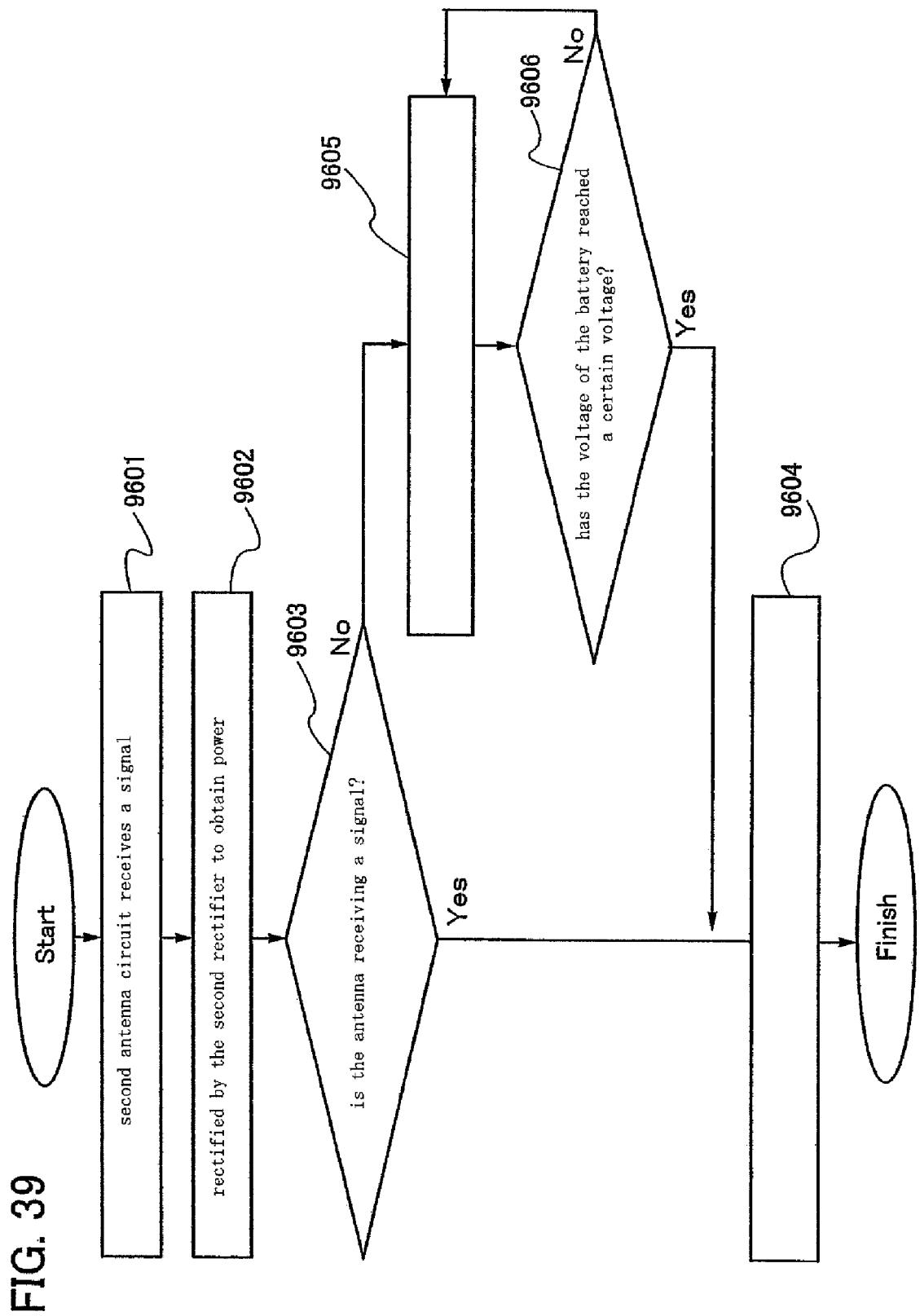
FIG. 39 is a diagram showing an example of an operating method of a semiconductor device of the present invention.

FIG. 39 shows an example of a flowchart in this case. Hereinafter, description is briefly made of the flowchart in FIG. 39.

First, the second antenna circuit 102 receives a signal (STEP 9601). The signal received by the second antenna circuit 102 is rectified by the second rectifier circuit 107 to obtain power (STEP 9602). Power outputted from the second rectifier circuit 107 is supplied to the charge and discharge control circuit 9301. When the first antenna circuit 101 is receiving a signal, for example, a signal for transmitting the information from the logic circuit 110 to the charge and discharge control circuit 9301 (STEP 9603). Then, the charge and discharge control circuit 9301 stops power supply from the second rectifier circuit 107 to the batter 104 (STEP 9404). When the first antenna circuit 101 is not receiving a signal, the charge and discharge control circuit 9301 supplies power outputted from the second rectifier circuit 107 to charge the battery so that a voltage of the battery reaches a certain voltage (STEP 9605 and STEP 9606). When the voltage of the battery reaches a certain voltage, the charge and discharge control circuit 9301 does not supply power outputted from the second rectifier circuit 107 to the battery 104 (STEP 9604). These operations are performed each time a signal is received by the second antenna circuit 102.

Further, the charge and discharge control circuit 9301 may have a function of charging power corresponding to consumed power to the battery 104 after a signal is received by the first antenna circuit 101 to be processed by the signal processing circuit 103, and then the signal is transmitted from the first antenna circuit 101.

Figure 40:
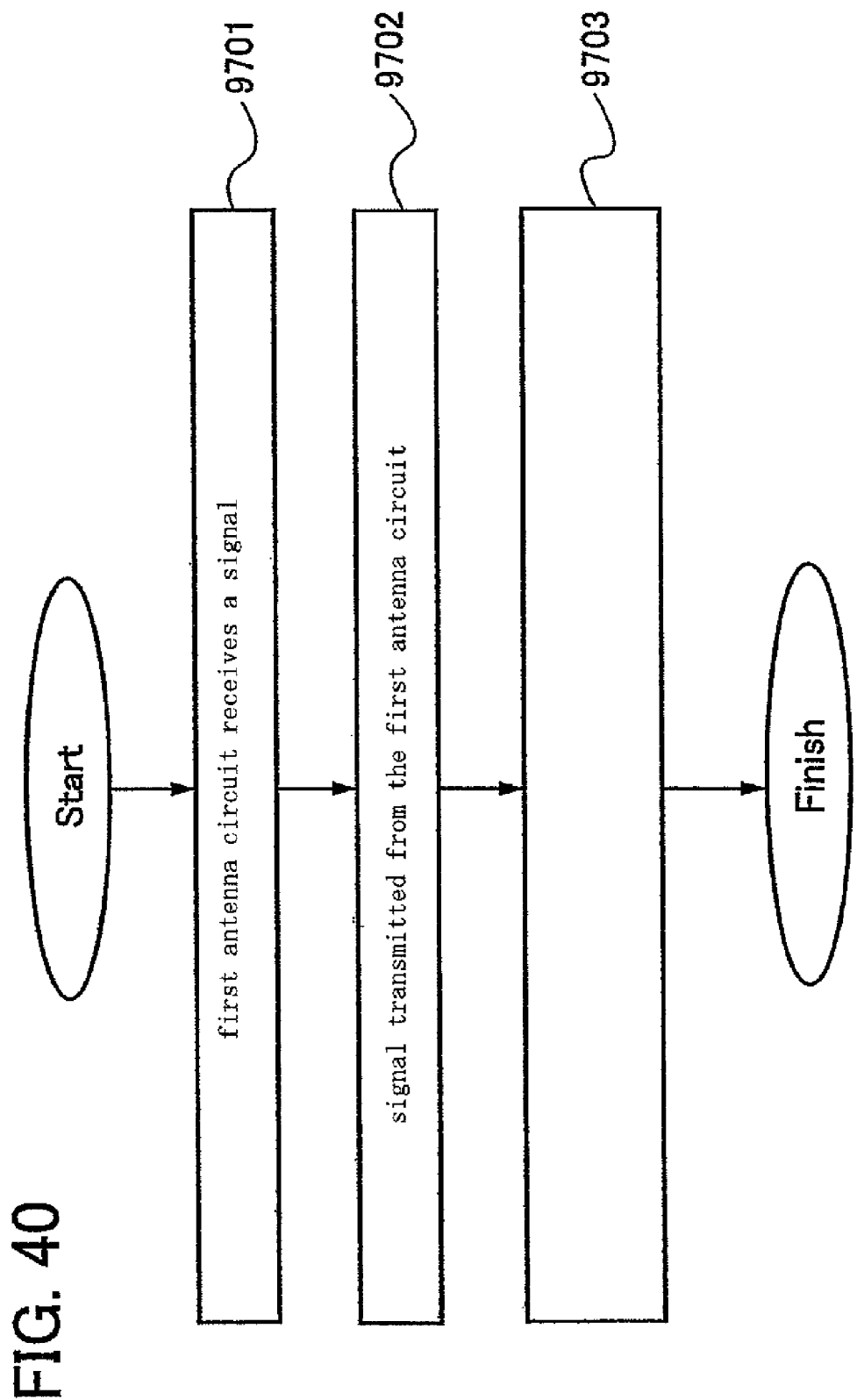
FIG. 40 is a diagram showing an example of an operating method of a semiconductor device of the present invention.

FIG. 40 shows an example of a flowchart in this case. Hereinafter, description is briefly made of the flowchart in FIG. 40.

First, the first antenna circuit 101 receives a signal (STEP 9701). The signal received by the first antenna circuit 101 is processed by the signal processing circuit 103, and then the signal is transmitted from the first antenna circuit 101 (STEP 9702). After that, the charge and discharge control circuit 9301 supplies power obtained from a signal received by the second antenna circuit 102 to charge the battery 104 so that a voltage of the battery becomes a certain voltage (STEP 9703). Specifically, the battery 104 is charged to a certain voltage each time a signal is transmitted by the first antenna circuit 101, whereby power corresponding to consumed power can be charged.

Further, the charge and discharge control circuit 9301 may have a function of preventing not only overcharging the battery 104 but discharging from the battery 104.

Further, the charge and discharge control circuit 9301 may have a function of preventing deterioration of the battery 104 due to rapid charging or rapid discharging.

Note that this embodiment mode can be implemented in combination with any of the other embodiment modes in this specification.

Embodiment Mode 7

In this embodiment mode, description is made of a semiconductor device of this embodiment mode, in which a voltage outputted from the battery is boosted by being synchronized with a signal received by the antenna circuit in order to generate a power source voltage.

Figure 35:
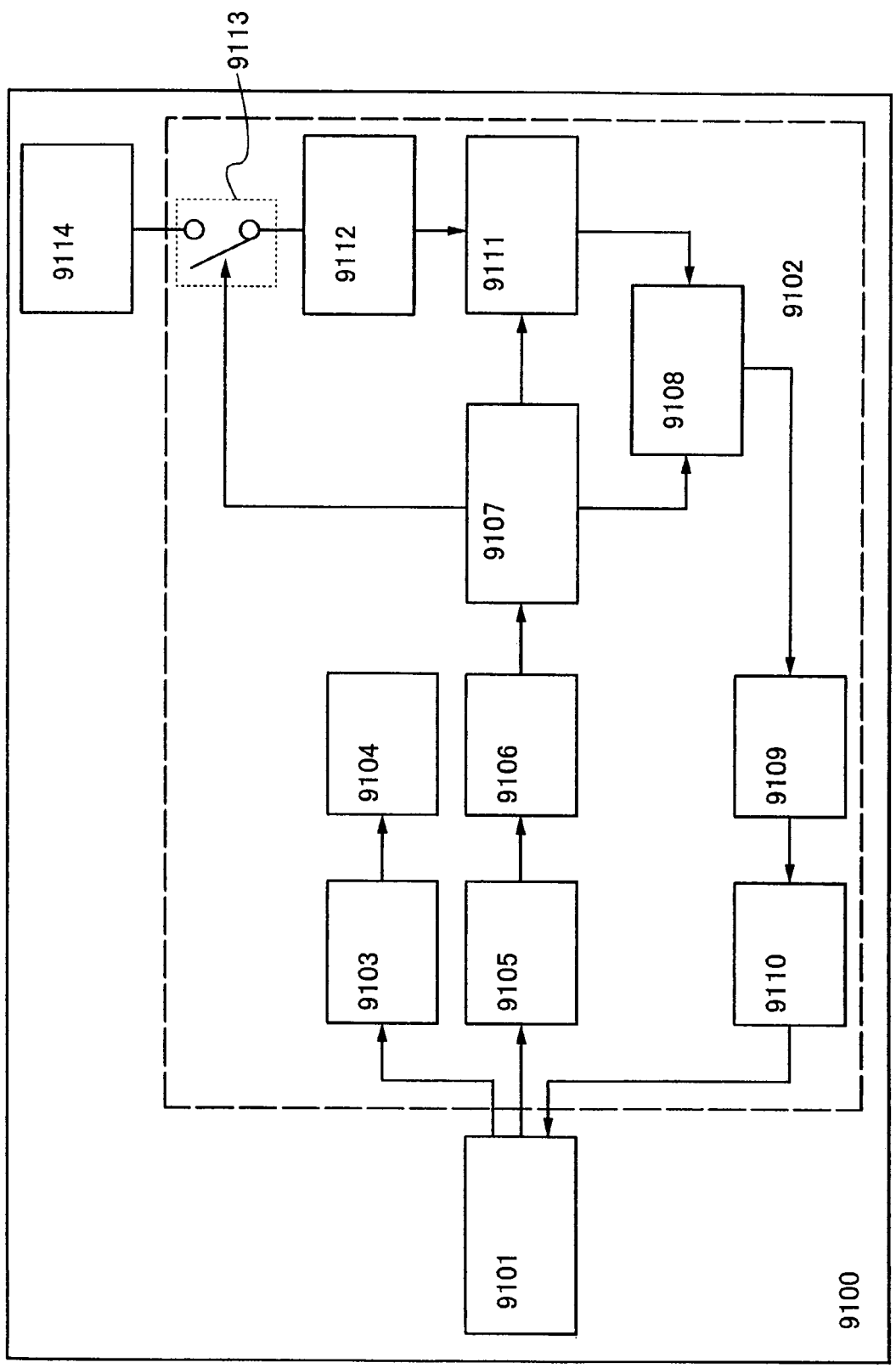
FIG. 35 is a diagram showing a structure example of a semiconductor device of the present invention.

FIG. 35 shows a structure example of the semiconductor device of this embodiment mode.

The semiconductor device shown in FIG. 35 boosts a voltage outputted from the battery by synchronizing the voltage with a received signal. Then, the boosted voltage is used for a power source of a level shifter circuit for increasing amplitude of data to be written to a nonvolatile memory.

A semiconductor device 9100 of this embodiment mode includes an antenna circuit 9101, a signal processing circuit 9102, and a battery 9114.

Various modes can be applied to a shape of the antenna 9101. For example, a shape of a dipole antenna, a loop antenna, a Yagi antenna, a patch antenna, or a micro antenna can be used. In a case of forming an antenna over a substrate over which a transistor is formed included in the signal processing circuit, a micro loop antenna, a micro dipole antenna, or the like is preferably used.

Further, the antenna circuit 9101 may include a unit for changing frequency of a received signal. For example, when a loop antenna is used for the antenna circuit 9101, a resonant circuit may be formed by an antenna coil forming an antenna and a capacitor.

As the battery 9114, following secondary batteries can be used: a lithium ion battery, a lithium secondary battery, a nickel hydride battery, a nickel cadmium battery, an organic radical battery, a lead-acid battery, an air secondary battery, a nickel zinc battery, a silver zinc battery, and the like. The battery is not limited to them, and a high-capacity capacitor may be used. In particular, a lithium ion battery and a lithium secondary battery have high charge and discharge capacity. Therefore, it is used as a battery provided for a semiconductor device of this embodiment mode, and thus miniaturization of the semiconductor device can be achieved. Note that an active material or an electrolyte of a lithium ion battery is formed by a sputtering method; therefore, the battery 9114 may be formed over a substrate over which the signal processing circuit 9102 is formed or a substrate over which the antenna circuit 9101 is formed. The battery 9114 is formed over the substrate over which the signal processing circuit 9102 or the antenna circuit 9101 is formed, and thus yield is improved. In a metal lithium battery, a transition metal oxide including lithium ions, a metal oxide, a metal sulfide, an iron compound, a conductive polymer, an organic sulfur compound, or the like is used for a cathode active material; lithium (alloy) is used for an anode active material; and an organic electrolyte solution, a polymer electrolyte, or the like is used for an electrolyte. Therefore, the battery 9114 can have a higher charge and discharge capacity.

The signal processing circuit 9102 includes a rectifier circuit 9103, a power source circuit 9104, a demodulation circuit 9105, a logic circuit 9106, a memory control circuit 9107, a memory circuit 9108, a logic circuit 9109, a modulation circuit 9110, a level shifter circuit 9111, a booster circuit 9112, and a switch 9113. A nonvolatile memory can be used for the memory circuit 9108.

The rectifier circuit 9103 rectifies and smoothes an AC signal received by the antenna circuit 9101. A voltage outputted from the rectifier circuit 9103 is supplied to the power source circuit 9104. In the power source circuit 9104, a desired voltage is generated. Then, a voltage to be power sources of various circuits of the signal processing circuit 9102 is supplied from the power source circuit 9104.

The semiconductor device of this embodiment mode processes a signal as described below. A communication signal received by the antenna circuit 9101 is inputted to the demodulation circuit 9105. The communication signal is usually transmitted through a process such as ASK modulation or PSK modulation of a carrier of 13.56 MHz, 915 MHz, or the like.

FIG. 35 is an example of the case where a communication signal of 13.56 MHz is used. The communication signal subjected to ASK modulation or PSK modulation is demodulated in the demodulation circuit 9105. The modulated signal is transmitted to the logic circuit 9106 to be analyzed. The signal analyzed in the logic circuit 9106 is transmitted to a memory control circuit 9107 by which a memory circuit 9108 is controlled.

In a case where the signal transmitted to the memory control circuit 9107 includes a read instruction of data from the memory circuit 9108, the memory control circuit 9107 retrieves data stored in the memory circuit 9108, and then the data is transmitted to a logic circuit 9109. The data transmitted to a logic circuit 9109 is encoded in the logic circuit 9109. After that, the modulation circuit 9110 modulates a carrier by the signal.

Next, in a case where the signal transmitted to the memory control circuit 9107 includes a write instruction of data to the memory circuit 9108, the memory control circuit 9107 turns the switch 9113 on. Then, a voltage is supplied from the battery 9114 to the booster circuit 9112, and the supplied voltage is boosted by the booster circuit 9112. Further, the level shifter circuit 9111 level-shifts data to be written to the memory circuit 9108, which is inputted from the memory control circuit 9107, with the voltage boosted by the booster circuit 9112. The data which has been level-shifted and thereby has a large amplitude is written to the memory circuit 9108.

Thus, the semiconductor device of this embodiment mode operates.

Although description is made of a communication signal of 13.56 MHz here, this invention is not limited to this. Also, with a communication signal of 125 KHz, UHF band frequency, 2.45 GHz, or the like, the present invention can be realized. Further, as for a block structure, a structure other than that shown in FIG. 35 can be used.

Note that this embodiment mode can be implemented in combination with any of the other embodiment modes in this specification.

Embodiment Mode 8

In this embodiment mode, description is made of a structure of a semiconductor device of this embodiment mode, in which a voltage outputted from the battery is synchronized with a signal received by the antenna circuit in order to perform transmission to a distance.

Figure 36:
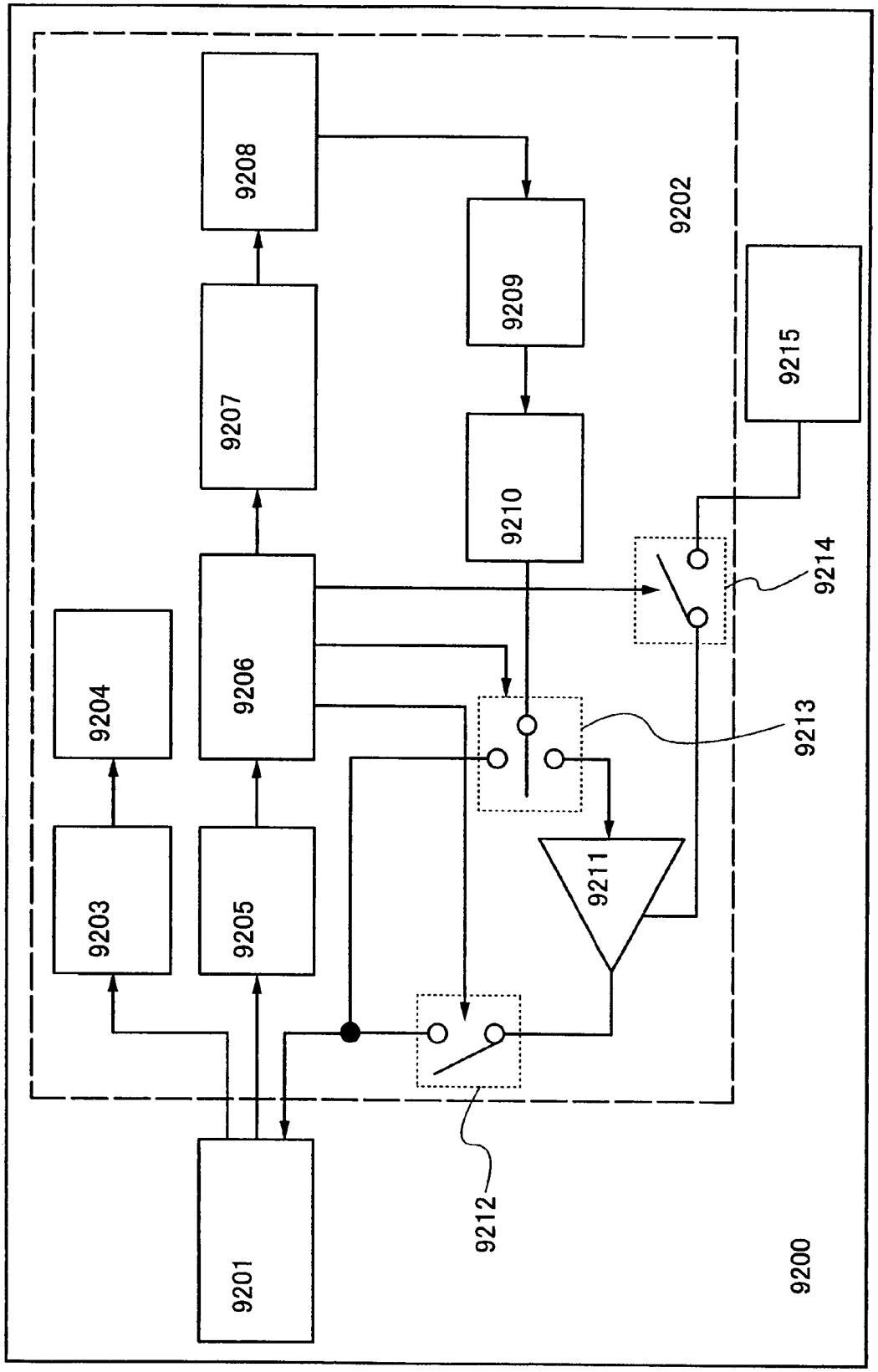
FIG. 36 is a diagram showing a structure example of a semiconductor device of the present invention.

FIG. 36 is a block diagram showing a structure example of the semiconductor device of this embodiment mode.

The semiconductor device shown in FIG. 36 determines a transmission distance depending on the received signal. When a transmission distance is short, a signal modulated by a modulation circuit is supplied to an antenna circuit, whereas when a transmission distance is long, a signal modulated by a modulation circuit is amplified by an amplifier, and then supplied to the antenna circuit. Further, a voltage of a battery is used for a power source of the amplifier.

A semiconductor device 9200 of this embodiment mode of the present invention includes an antenna circuit 9201, a signal processing circuit 9202, and a battery 9215.

Various modes can be applied to a shape of the antenna 9201. For example, a shape of a dipole antenna, a loop antenna, a Yagi antenna, a patch antenna, or a micro antenna can be used. In a case of forming an antenna over a substrate over which a transistor included in the signal processing circuit is formed, a micro loop antenna, a micro dipole antenna, or the like is preferably used.

Further, the antenna circuit 9201 may include a unit for changing frequency of a received signal. For example, when a loop antenna is used for the antenna circuit 9201, a resonant circuit may be formed by an antenna coil forming an antenna and a capacitor.

As the battery 9215, following secondary batteries can be used: a lithium ion battery, a lithium secondary battery, a nickel hydride battery, a nickel cadmium battery, an organic radical battery, a lead-acid battery, an air secondary battery, a nickel zinc battery, a silver zinc battery, and the like. The battery is not limited to them, and a high-capacity capacitor may be used. In particular, a lithium ion battery and a lithium secondary battery have high charge and discharge capacity. Therefore, it is used as a battery provided for a semiconductor device of Embodiment Mode 2, and thus miniaturization of the semiconductor device can be achieved. Note that an active material or an electrolyte of a lithium ion battery is formed by a sputtering method; therefore, the battery 9215 may be formed over a substrate over which the signal processing circuit 9202 is formed or a substrate over which the antenna circuit 9201 is formed. The battery 9215 is formed over the substrate over which the signal processing circuit 9102 or the antenna circuit 9101 is formed, and thus yield is improved. In a metal lithium battery, a transition metal oxide including lithium ions, a metal oxide, a metal sulfide, an iron compound, a conductive polymer, an organic sulfur compound, or the like is used for a cathode active material; lithium (alloy) is used for an anode active material; and an organic electrolyte solution, a polymer electrolyte, or the like is used for an electrolyte. Therefore, the battery 9215 can have a higher charge and discharge capacity.

The signal processing circuit 9202 includes a rectifier circuit 9203, a power source circuit 9204, a demodulation circuit 9205, a logic circuit 9206, a memory control circuit 9207, a memory circuit 9208, a logic circuit 9209, a modulation circuit 9210, an amplifier 9211, a switch 9212, a switch 9213, and a switch 9214. Various memories can be used for the memory circuit 9208. For example, a mask ROM or a nonvolatile memory can be used.

The rectifier circuit 9203 rectifies and smoothes an AC signal received by the antenna circuit 9201. A voltage outputted from the rectifier circuit 9203 is supplied to the power source circuit 9204. In the power source circuit 9204, a desired voltage is generated. Then, a voltage to be power sources of various circuits of the signal processing circuit 9202 is supplied from the power source circuit 9204.

The semiconductor device of Embodiment Mode 2 of the present invention processes a signal as described below. A communication signal received by the antenna circuit 9201 is inputted to the demodulation circuit 9205. The communication signal is usually transmitted through a process such as ASK modulation or PSK modulation of a carrier of 13.56 MHz, 915 MHz, or the like.

FIG. 36 is an example of the case where a communication signal of 13.56 MHz is used. The communication signal subjected to ASK modulation or PSK modulation is received by the antenna circuit 9201 and demodulated in the demodulation circuit 9205. The modulated signal is transmitted to the logic circuit 9206 to be analyzed. The signal analyzed in the logic circuit 9206 is transmitted to a memory control circuit 9207 by which a memory circuit 9208 is controlled. Then, the memory control circuit 9207 transmits data stored in the memory circuit 9208 to a logic circuit 9209. After the data is encoded in the logic circuit 9209, the modulation circuit 9210 modulates the carrier by the signal. When a transmission distance is short, the modulated signal is transmitted to the antenna circuit 9101, whereas when a transmission distance is long, the modulated signal is transmitted to the amplifier 9211 to be amplified, and then transmitted to the antenna circuit 9101.

In other words, whether a transmission distance is long or short is determined depending on a signal transmitted to the logic circuit 9206, and the logic circuit 9206 controls the switches 9212 to 9214. When a transmission distance is determined to be short, the switch 9213 connects the modulation circuit 9210 and the antenna circuit 9201, and the switches 9212 and 9214 are off. When a transmission distance is determined to be long, the switch 9213 connects the modulation circuit 9210 and the amplifier 9211, and the switches 9212 and 9214 are on. That is to say, when a transmission distance is determined to be long, the amplifier 9211 amplifies the signal outputted from the modulation circuit 9210 by using as a power source a voltage outputted from the battery 9215, and then transmits the signal to the antenna circuit 9201.

Note that as for a method for determining a transmission distance, a control signal for determining a transmission distance may be transmitted to the logic circuit 9206 in advance, or a transmission distance may be determined depending on intensity of a signal demodulated in the demodulation circuit 9205.

Note that this embodiment mode can be implemented in combination with any of the other embodiment modes in this specification.

Embodiment 1

In this embodiment, description is made of uses of a semiconductor device which communicates data by wireless communication (hereinafter referred to as an RFID) in the present invention. A semiconductor device of the present invention can be used as a so-called ID label, ID tag, and ID card provided in, for example, bills, coins, securities, bearer bonds, documents (such as driver's licenses or resident's cards), packaging containers (such as wrapping paper or bottles), storage media (such as DVD software or video tapes), vehicles (such as bicycles), personal belongings (such as bags or glasses), foods, plants, animals, human bodies, clothing, everyday articles, tags on goods such as an electronic appliance or on packs. An electronic appliance refers to a liquid crystal display device, an EL display device, a television set (also simply called a TV set, a TV receiver, or a television receiver), a mobile phone, and the like.

In this embodiment, an application of the present invention and an example of a product with the RFID are described with reference to FIGS. 30A to 30D.

Figure 30A:
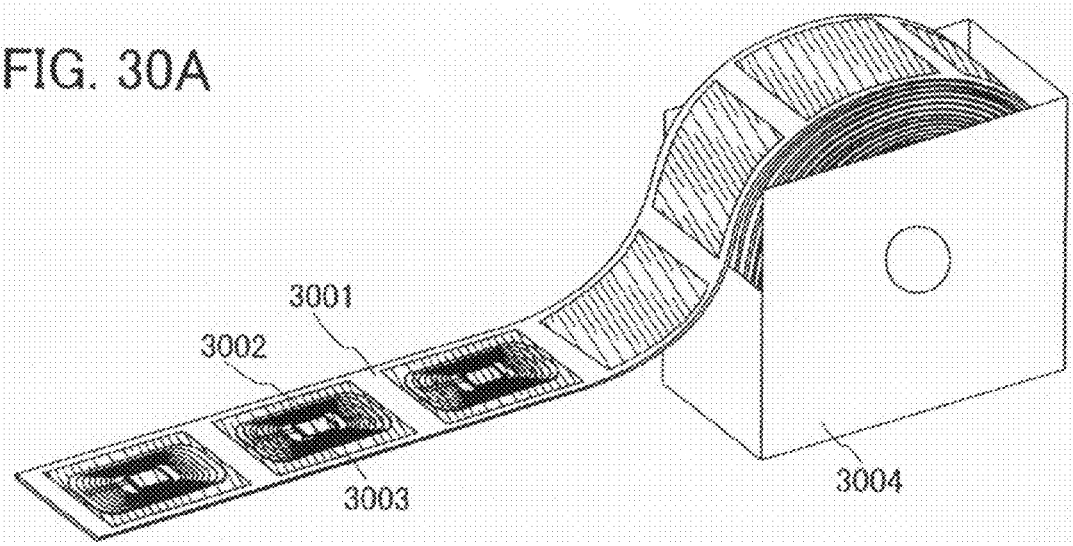
FIGS. 30A to 30E are views each showing an example of an application mode of a semiconductor device of the present invention.

FIG. 30A shows an example of a state of completed products of semiconductor devices including RFIDs of the present invention. On a label board (separate paper) 3001, a plurality of ID labels 3003 each incorporating an RFID 3002 are formed. The ID labels 3003 are held in a box 3004. In addition, on the ID label 3003, information on a product or service (a name of the product, a brand, a trademark, a trademark owner, a seller, a manufacturer, and the like) is written, while an ID number that is unique to the product (or the kind of the product) is assigned to the incorporated RFID to make it possible to easily figure out forgery, infringement of intellectual property rights such as a patent right and a trademark right, and illegality such as unfair competition. In addition, a lot of information that is too much to write clearly on a container of the product or the label, for example, the production area, selling area, quality, raw material, efficacy, use, quantity, shape, price, production method, usage, time of the production, time of the use, expiration date, instructions of the product, information on the intellectual property of the product and the like can be input in the RFID so that a transactor and a consumer can access the information by using a simple reader.

Figure 30B:
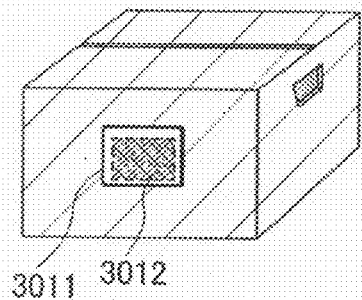

FIG. 30B shows a label-shaped ID tag 3011 incorporating an RFID 3012. By being provided with the ID tag 3011, the products can be managed easily. For example, in the case where the product is stolen, the pathway of the product is traced so that where the product is stolen in the distribution pathway can be figured out quickly. Thus, by being provided with the ID tag, products that are superior in so-called traceability can be distributed.

Figure 30C:
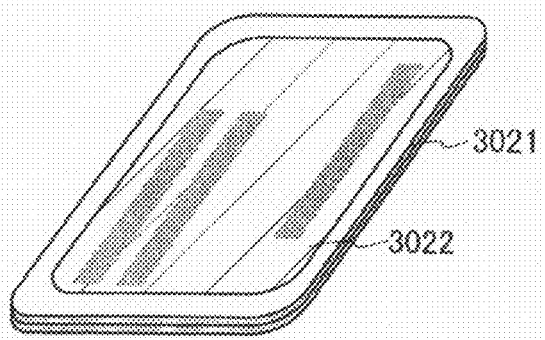

FIG. 30C shows an example of a state of a completed product of an ID card 3021 including an RFID 3022 of the present invention. The ID card 3021 includes all kinds of cards such as a cash card, a credit card, a prepaid card, an electronic ticket, electronic money, a telephone card, and a membership card.

Figure 30D:

FIG. 30D shows an example of a state of a completed product of a bearer bond 3031. An RFID 3032 is embedded in the bearer bond 3031 and is protected by a resin formed in the periphery thereof. Here, the resin is filled with a filler. The bearer bond 3031 can be formed in the same manner as an ID label, an ID tag, and an ID card of the present invention. Note that the aforementioned bearer bond includes stamps, tickets, admission tickets, merchandise coupons, book coupons, stationery coupons, beer coupons, rice coupons, various gift coupons, various service coupons, and the like. Needless to say, it is not limited thereto. In addition, when the RFID 3032 of the present invention is provided in bills, coins, securities, bearer bonds, documents, or the like, an authentication function can be provided; therefore, forgery can be prevented by use of the authentication function.

Figure 30E:
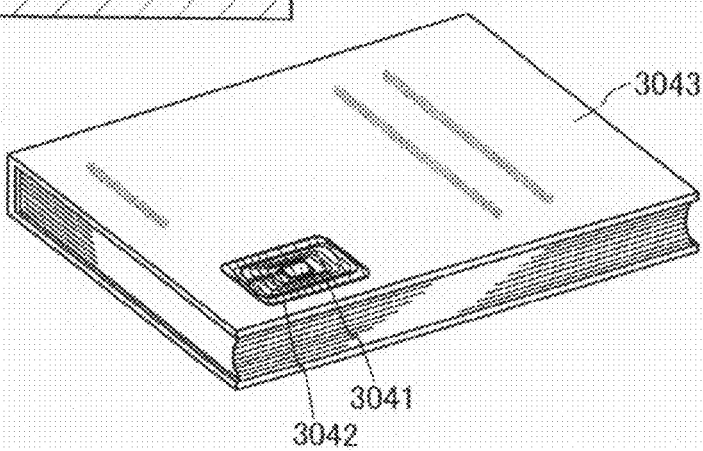
Figure 31:
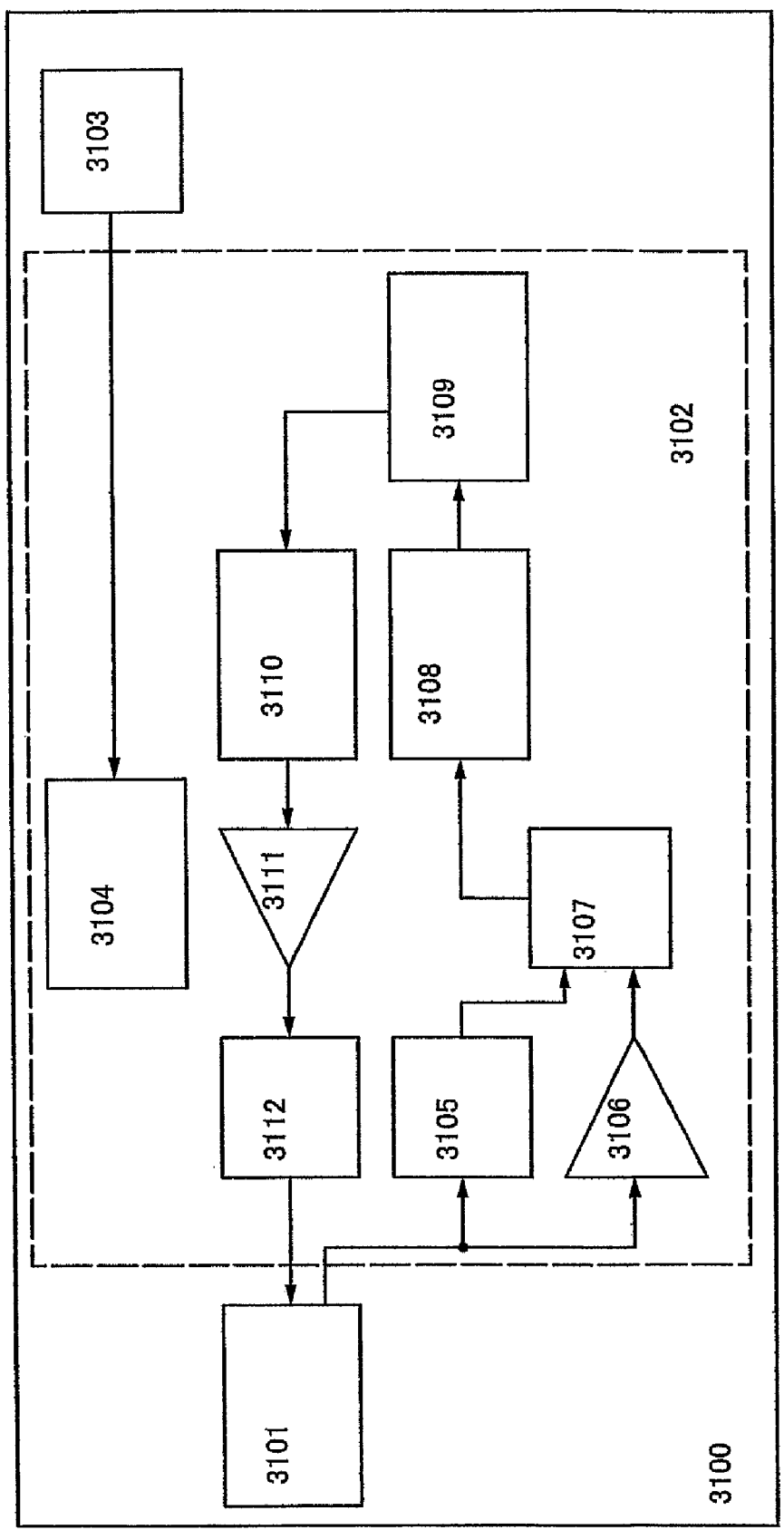
FIG. 31 is a diagram showing a conventional structure.
Figure 32:
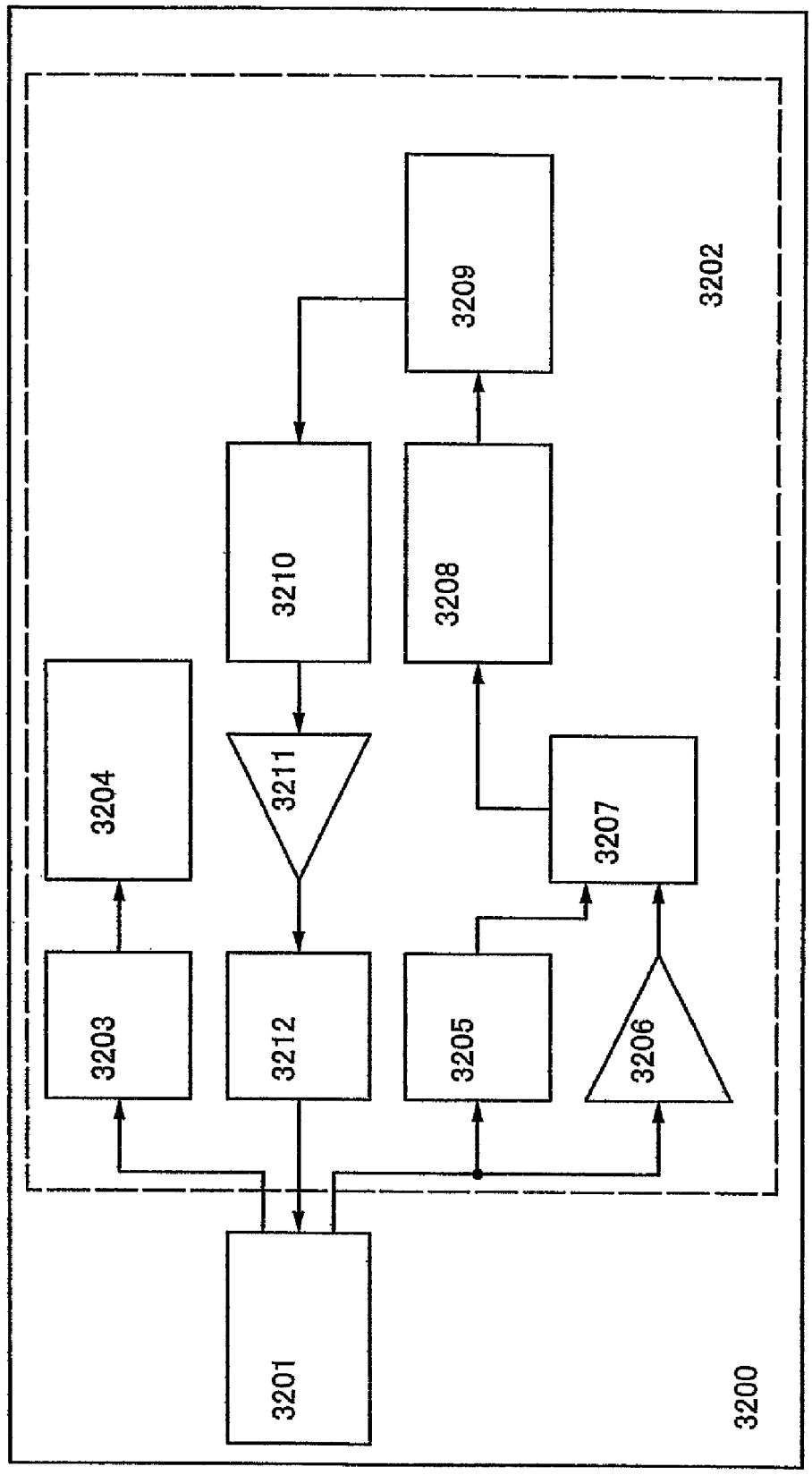
FIG. 32 is a diagram showing a conventional structure.

FIG. 30E shows a book 3043 to which an ID label 3041 including an RFID 3042 of the present invention is attached. The RFID 3042 of the present invention is fixed on goods by, for example, being attached to a surface or embedded therein. As shown in FIG. 30E, the RFID 3042 can be embedded in paper of a book, or embedded in an organic resin of a package. Since the RFID 3042 of the present invention can realize a small size, a thin shape, and lightweight, it can be fixed on goods without spoiling the design thereof.

In addition, although not shown here, the efficiency of a system such as an inspection system can be improved by provision of the RFID of the present invention in, for example, packaging containers, storage media, personal belongings, foods, clothing, everyday articles, electronic appliances, or the like. Further, counterfeits and theft can be prevented by provision of the RFID on vehicles. Individual creatures such as animals can be easily identified by being implanted with the RFID. For example, year of birth, sex, breed, and the like can be easily identified by implantation of the RFID in creatures such as domestic animals.

Figure 33A:
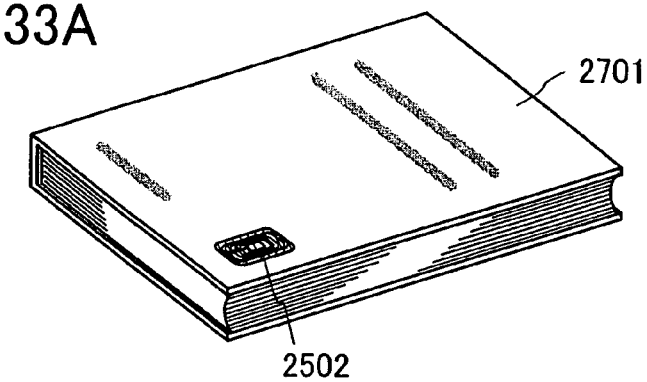
FIGS. 33A to 33D are views each showing an example of an application mode of a semiconductor device of the present invention.
Figure 33B:
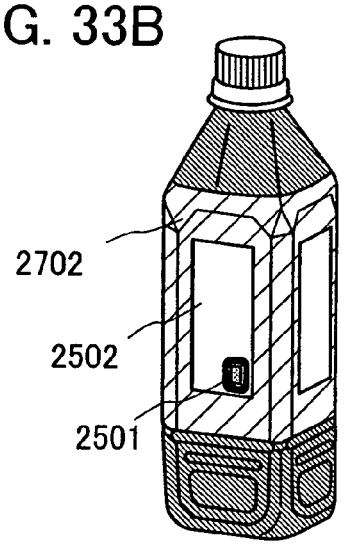

FIGS. 33A and 33B respectively show a book 2701 and a plastic bottle 2702 to which an ID label 2502 of the present invention is attached. The IC label that is used in the present invention is quite thin; therefore, when the ID label is mounted on goods such as the book, the function or design is not spoiled. Furthermore, in the case of a non-contact type thin film integrated circuit device, an antenna and a chip can be integrally formed to make it easier to transfer the non-contact type thin film integrated circuit device directly to a product with a curved surface.

Figure 33C:
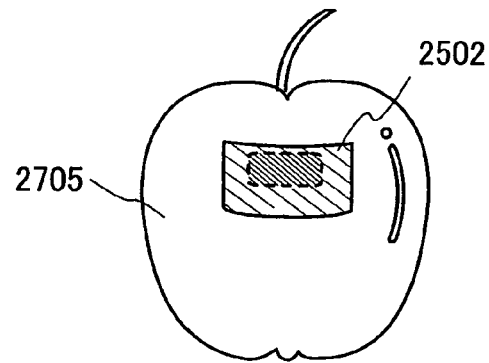
Figure 33D:
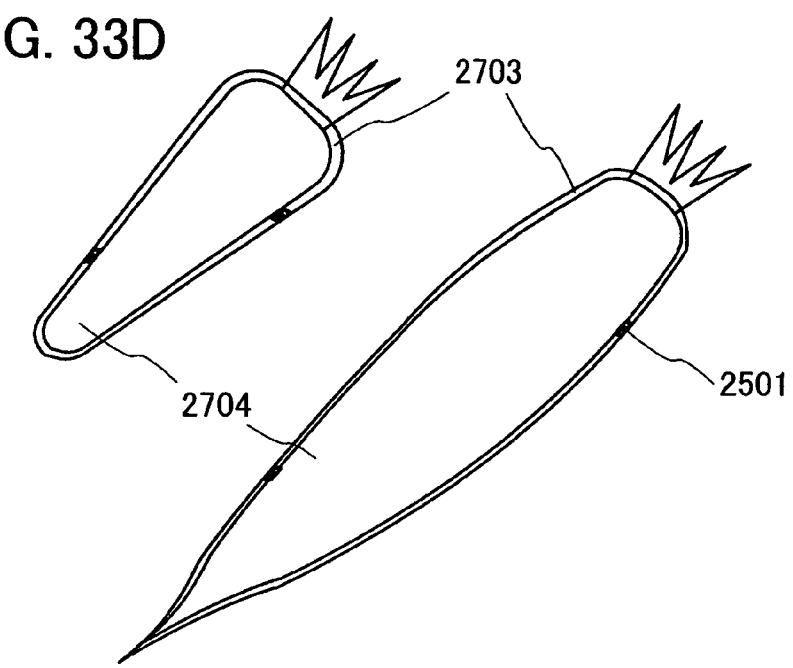

FIG. 33C shows a state in which the ID label 2502 is directly attached to a fresh food such as a fruit 2705. In addition, FIG. 33D shows an example in which fresh foods such as vegetables 2704 are each wrapped in a wrapping film 2703. When an IC chip 2501 is attached to a product, there is a possibility that the IC chip is peeled off. However, when the product is wrapped in the wrapping film 2703, it is difficult to peel off the wrapping film 2703, which brings some merit for security. Note that the chip of the present invention can be used for various products in addition to the aforementioned products.

This application is based on Japanese Patent Application serial No. 2006-070387 filed in Japan Patent Office on Mar. 15, 2006, the entire contents of which are hereby incorporated by reference.

The invention claimed is:

1. A semiconductor device comprising:
   a signal processing circuit;
   a first antenna circuit operationally connected to the signal processing circuit;
   a second antenna circuit operationally connected to the signal processing circuit; and
   a battery operationally connected to the signal processing circuit; and
   a booster antenna;
   wherein the first antenna circuit receives a first signal, and transmits a second signal for transmitting data stored in the signal processing circuit,
   the second antenna circuit receives a third signal for charging the battery,
   the first signal and the third signal have different wavelengths from each other, and
   the booster is provided between the first antenna and the second antenna.

2. The semiconductor device according to claim 1, wherein the battery supplies power to a power source circuit included in the signal processing circuit.

3. The semiconductor device according to claim 1, wherein at least one of the first signal and the third signal is received by an electromagnetic induction method.

4. The semiconductor device according to claim 1, wherein the second antenna circuit includes a plurality of antenna circuits that receive different wavelengths.

5. The semiconductor device according to claim 1, wherein the battery is a lithium ion battery, a nickel hydride battery, a nickel cadmium battery, an organic radical battery, or a capacitor.

6. An ID label, an ID tag, or an ID card comprising the semiconductor device according to claim 1.

7. A semiconductor device comprising:
a signal processing circuit;
a first antenna circuit operationally connected to the signal processing circuit;
a second antenna circuit operationally connected to the signal processing circuit; and
a battery operationally connected to the signal processing circuit; and
a booster antenna;
wherein the first antenna circuit receives a first signal from a reader/writer, and transmit a second signal to the reader/writer for transmitting data stored in the signal processing circuit,
the second antenna circuit receives an external radio signal for charging the battery from,
the first signal and the external radio signal have different wavelengths from each other, and
the booster is provided between the first antenna and the second antenna.

8. The semiconductor device according to claim 7, wherein the battery supplies power to a power source circuit included in the signal processing circuit.

9. The semiconductor device according to claim 7, wherein at least one of the first signal and the external radio signal is received by an electromagnetic induction method.

10. The semiconductor device according to claim 7, wherein the second antenna circuit includes a plurality of antenna circuits that receive different wavelengths.

11. The semiconductor device according to claim 7, wherein the battery is a lithium ion battery, a nickel hydride battery, a nickel cadmium battery, an organic radical battery, or a capacitor.

12. An ID label, an ID tag, or an ID card comprising the semiconductor device according to claim 7.

13. A semiconductor device comprising:
a signal processing circuit;
a first antenna circuit operationally connected to the signal processing circuit;
a second antenna circuit operationally connected to the signal processing circuit;
a battery operationally connected to the signal processing circuit; and
a first booster antenna and a second booster antenna,
wherein the first antenna circuit receives a first signal from a reader/writer through the first booster antenna, and transmits a second signal through the first booster antenna for transmitting data stored in the signal processing circuit;
the second antenna circuit receives a third signal for charging the battery through the second booster antenna; and
the first signal and the third signal have different wavelengths from each other.

14. The semiconductor device according to claim 13, wherein the battery supplies power to a power source circuit included in the signal processing circuit.

15. The semiconductor device according to claim 13, wherein one of the first antenna circuit and the second antenna circuit receives a signal by an electromagnetic induction method.

16. The semiconductor device according to claim 13, wherein the second antenna circuit includes a plurality of antenna circuits that receive different wavelengths.

17. The semiconductor device according to claim 13, wherein the battery is a lithium ion battery, a nickel hydride battery, a nickel cadmium battery, an organic radical battery, or a capacitor.

18. An ID label, an ID tag, or an ID card comprising the semiconductor device according to claim 13.

19. A semiconductor device comprising:
a signal processing circuit;
a first antenna circuit which is operationally connected to the signal processing circuit;
a plurality of second antenna circuits;
a battery which is operationally connected to the signal processing circuit; and
a first booster antenna and a second booster antenna,
wherein the first antenna circuit is a circuit that transmits/receives to/from a reader/writer a signal through the first booster antenna for transmitting data stored in the signal processing circuit,
the second antenna circuit is a circuit that receives a signal for charging the battery from an external radio signal through the second booster antenna,
a signal received by the first antenna circuit and a signal received by the second antenna circuit have different wavelengths.

20. The semiconductor device according to claim 19, wherein the battery supplies power to a power source circuit included in the signal processing circuit.

21. The semiconductor device according to claim 19, wherein one of the first antenna circuit and the second antenna circuit receives a signal by an electromagnetic induction method.

22. The semiconductor device according to claim 19, wherein the second antenna circuit includes a plurality of antenna circuits that receive different wavelengths.

23. The semiconductor device according to claim 19, wherein the battery is a lithium ion battery, a nickel hydride battery, a nickel cadmium battery, an organic radical battery, or a capacitor.

24. An ID label, an ID tag, or an ID card comprising the semiconductor device according to claim 19.

* * * * *